(12) United States Patent
Doughty et al.

(10) Patent No.: US 6,396,024 B1
(45) Date of Patent: May 28, 2002

(54) PERMANENT MAGNET ECR PLASMA SOURCE WITH INTEGRATED MULTIPOLAR MAGNETIC CONFINEMENT

(75) Inventors: Frank Christian Doughty, North Andover, MA (US); Joel Brad Bailey, Dallas, TX (US)

(73) Assignee: Nexx Systems Packaging, LLC, Wilmington, MA (US)

( * ) Notice: Subject to any disclaimer, the term of this patent is extended or adjusted under 35 U.S.C. 154(b) by 0 days.

(21) Appl. No.: 09/469,382

(22) Filed: Dec. 22, 1999

Related U.S. Application Data
(60) Provisional application No. 60/113,780, filed on Dec. 23, 1998.

(51) Int. Cl.[7] .............................................. B23K 10/00
(52) U.S. Cl. .............................. 219/121.43; 219/121.4; 156/345; 204/298.37
(58) Field of Search ........................... 219/121.4, 121.43, 219/121.41, 121.48; 156/345, 643.1, 646.1; 204/298.37, 298.38; 118/723 I, 723 MW, 723 R; 315/111.31

(56) References Cited

U.S. PATENT DOCUMENTS

| | | | | |
|---|---|---|---|---|
| 4,960,073 A | * | 10/1990 | Suzuki et al. ............... | 118/723 |
| 5,032,202 A | * | 7/1991 | Tsai et al. ................... | 156/345 |
| 5,133,825 A | * | 7/1992 | Hakamata et al. ........... | 156/345 |
| 5,196,670 A | | 3/1993 | Mantei .................... | 219/121.43 |
| 5,203,959 A | | 4/1993 | Hirose et al. ............... | 156/643 |
| 5,216,329 A | * | 6/1993 | Pelleteir ................. | 315/111.41 |
| 5,304,277 A | | 4/1994 | Ohara et al. ................. | 156/345 |
| 5,370,765 A | * | 12/1994 | Dandl ...................... | 156/643.1 |
| 5,762,814 A | | 6/1998 | Ohara et al. .................. | 216/70 |
| 5,869,802 A | | 2/1999 | Spencer et al. ........ | 219/121.48 |

* cited by examiner

Primary Examiner—Mark Paschall
(74) Attorney, Agent, or Firm—Testa, Hurwitz & Thibeault, LLP

(57) ABSTRACT

A method and apparatus for integrating multipolar confinement with permanent magnetic electron cyclotron resonance plasma sources to produce highly uniform plasma processing for use in semiconductor fabrication and related fields. In a preferred embodiment, the plasma processing apparatus includes a vacuum chamber, a workpiece stage within the chamber, a permanent magnet electron cyclotron resonance plasma source directed at said chamber, and a system of permanent magnets for plasma confinement about the periphery of said chamber. The permanent magnets for plasma confinement are arranged in a multiplicity of rings with the plane of the rings perpendicular to the vacuum chamber axis and to the direction of propagation of the microwave into the vacuum chamber. The number of rings is chosen with respect to the vacuum chamber dimensions to produce a large, low magnetic field region in the region of the vacuum chamber adjacent to the workpiece stage.

15 Claims, 51 Drawing Sheets

| FIGURE NUMBER | MODEL NAME | PLOT TYPE | TOP BAND | DELTA AT CHUCK | FIELD AT CHUCK | NUMBER OF BANDS |
|---|---|---|---|---|---|---|
| 6 | conf_w_main1a | CONTOUR | ANTI-ALIGNED | X | ALIGNED | 5 |
| 7 | conf_w_main1a | ARROW | ANTI-ALIGNED | X | ALIGNED | 5 |
| 8 | conf_w_main1a_b | CONTOUR | ANTI-ALIGNED | 2X | ALIGNED | 5 |
| 9 | conf_w_main1a_b | ARROW | ANTI-ALIGNED | 2X | ALIGNED | 5 |
| 10 | conf_w_main1b | CONTOUR | ALIGNED | X | ALIGNED | 5 |
| 11 | conf_w_main1b | ARROW | ALIGNED | X | ALIGNED | 5 |
| 12 | conf_w_main1b_1b | CONTOUR | ALIGNED | 2X | ALIGNED | 5 |
| 13 | conf_w_main1b_1b | ARROW | ALIGNED | 2X | ALIGNED | 5 |
| 14 | conf_w_main2a | CONTOUR | ANTI-ALIGNED | X | ALIGNED | 6 |
| 15 | conf_w_main2a | ARROW | ANTI-ALIGNED | X | ALIGNED | 6 |
| 16 | conf_w_main2b | CONTOUR | ALIGNED | X | ALIGNED | 6 |
| 17 | conf_w_main2b | ARROW | ALIGNED | X | ALIGNED | 6 |
| 18 | conf_w_main3a | CONTOUR | ANTI-ALIGNED | X | ANTI-ALIGNED | 6 |
| 19 | conf_w_main3a | ARROW | ANTI-ALIGNED | X | ANTI-ALIGNED | 6 |
| 20 | conf_w_main3b | CONTOUR | ALIGNED | X | ANTI-ALIGNED | 6 |
| 21 | conf_w_main3b | ARROW | ALIGNED | X | ANTI-ALIGNED | 6 |
| 22 | conf_w_main4a | CONTOUR | ANTI-ALIGNED | X | ANTI-ALIGNED | 5 |
| 23 | conf_w_main4a | ARROW | ANTI-ALIGNED | X | ANTI-ALIGNED | 5 |
| 24 | conf_w_main4b | CONTOUR | ALIGNED | X | ANTI-ALIGNED | 5 |
| 25 | conf_w_main4b | ARROW | ALIGNED | X | ANTI-ALIGNED | 5 |
| 26 | conf_w_main5 | CONTOUR | ALIGNED | VARIABLE SPACING | ANTI-ALIGNED | 6 |
| 27 | conf_w_main5 | ARROW | ALIGNED | VARIABLE SPACING | ANTI-ALIGNED | 6 |
| 28 | conf_w_main6 | CONTOUR | ALIGNED | VARIABLE SPACING | ANTI-ALIGNED | 6 |
| 29 | conf_w_main6 | ARROW | ALIGNED | VARIABLE SPACING | ANTI-ALIGNED | 6 |

| FIGURE NUMBER | PRESSURE (mTorr) | POWER (W) | TOP BAND | DELTA AT CHUCK | FIELD AT CHUCK | NUMBER OF BANDS | Ni MAX x $10^{-11}$ | Ni MAX x $10^{-11}$ |
|---|---|---|---|---|---|---|---|---|
| 31 | 1 | 1000 | ANTI-ALIGNED | x | ALIGNED | 5 | 1.60 | 1.00 |
| 32 | 1 | 2000 | ANTI-ALIGNED | x | ALIGNED | 5 | 2.80 | 1.70 |
| 33 | 5 | 1000 | ANTI-ALIGNED | x | ALIGNED | 5 | 1.80 | 1.00 |
| 34 | 5 | 2000 | ANTI-ALIGNED | x | ALIGNED | 5 | 4.50 | 3.00 |
| 35 | 1 | 1000 | ANTI-ALIGNED | 2x | ALIGNED | 5 | 1.60 | 1.30 |
| 36 | 1 | 2000 | ANTI-ALIGNED | 2x | ALIGNED | 5 | 2.50 | 2.00 |
| 37 | 5 | 1000 | ANTI-ALIGNED | 2x | ALIGNED | 5 | 2.00 | 1.50 |
| 38 | 5 | 2000 | ANTI-ALIGNED | 2x | ALIGNED | 5 | 4.60 | 3.30 |
| 39 | 1 | 1000 | ANTI-ALIGNED | 2x | ALIGNED | 6 | 1.50 | 1.10 |
| 40 | 1 | 2000 | ANTI-ALIGNED | 2x | ALIGNED | 6 | 2.30 | 1.80 |
| 41 | 5 | 1000 | ANTI-ALIGNED | 2x | ALIGNED | 6 | 1.80 | 1.40 |
| 42 | 5 | 2000 | ANTI-ALIGNED | 2x | ALIGNED | 6 | 4.10 | 3.10 |
| 43 | 1 | 1000 | ANTI-ALIGNED | x | ALIGNED | 6 | 2.00 | 1.40 |
| 44 | 1 | 2000 | ANTI-ALIGNED | x | ALIGNED | 6 | 2.40 | 1.70 |
| 45 | 5 | 1000 | ANTI-ALIGNED | x | ALIGNED | 6 | 2.30 | 1.60 |
| 46 | 5 | 2000 | ANTI-ALIGNED | x | ALIGNED | 6 | 5.50 | 3.80 |
| 47 | 1 | 1000 | ANTI-ALIGNED | x | ANTI-ALIGNED | 6 | 1.70 | 1.40 |
| 48 | 1 | 2000 | ANTI-ALIGNED | x | ANTI-ALIGNED | 6 | 3.20 | 2.50 |
| 49 | 5 | 1000 | ANTI-ALIGNED | x | ANTI-ALIGNED | 6 | 2.80 | 2.30 |
| 50 | 5 | 2000 | ANTI-ALIGNED | x | ANTI-ALIGNED | 6 | 6.50 | 5.80 |
| 51 | 1 | 1000 | ALIGNED | x | ALIGNED | 6 | 1.80 | 1.60 |
| 52 | 1 | 2000 | ALIGNED | x | ALIGNED | 6 | 3.00 | 2.30 |
| 53 | 5 | 1000 | ALIGNED | x | ALIGNED | 6 | 3.00 | 2.20 |
| 54 | 5 | 2000 | ALIGNED | x | ALIGNED | 6 | 6.80 | 5.90 |
| 55 | 1 | 1000 | ALIGNED | x | ALIGNED | 5 | 1.30 | 1.00 |
| 56 | 1 | 2000 | ALIGNED | x | ALIGNED | 5 | 1.80 | 1.10 |
| 57 | 5 | 1000 | ALIGNED | x | ALIGNED | 5 | 3.20 | 2.20 |
| 58 | 5 | 2000 | ALIGNED | x | ALIGNED | 5 | 7.00 | 5.80 |
| 59 | 1 | 1000 | ALIGNED | x | ANTI-ALIGNED | 5 | 2.30 | 1.80 |
| 60 | 1 | 2000 | ALIGNED | x | ANTI-ALIGNED | 5 | 3.80 | 3.40 |
| 61 | 5 | 1000 | ALIGNED | x | ANTI-ALIGNED | 5 | 3.20 | 2.50 |
| 62 | 5 | 2000 | ALIGNED | x | ANTI-ALIGNED | 5 | 6.90 | 6.40 |
| 63 | 1 | 1000 | ALIGNED | x | ANTI-ALIGNED | 6 | 2.40 | 1.60 |
| 64 | 1 | 2000 | ALIGNED | x | ANTI-ALIGNED | 6 | 3.90 | 3.50 |
| 65 | 5 | 1000 | ALIGNED | x | ANTI-ALIGNED | 6 | 3.30 | 2.70 |
| 66 | 5 | 2000 | ALIGNED | x | ANTI-ALIGNED | 6 | 7.00 | 6.50 |
| 67 | 1 | 1000 | ALIGNED | x | ANTI-ALIGNED | 5 | 1.10 | 0.50 |
| 68 | 1 | 2000 | ALIGNED | x | ANTI-ALIGNED | 5 | 1.50 | 0.70 |
| 69 | 5 | 1000 | ALIGNED | x | ANTI-ALIGNED | 5 | 0.70 | 0.20 |
| 70 | 5 | 2000 | ALIGNED | x | ANTI-ALIGNED | 5 | 1.80 | 0.70 |

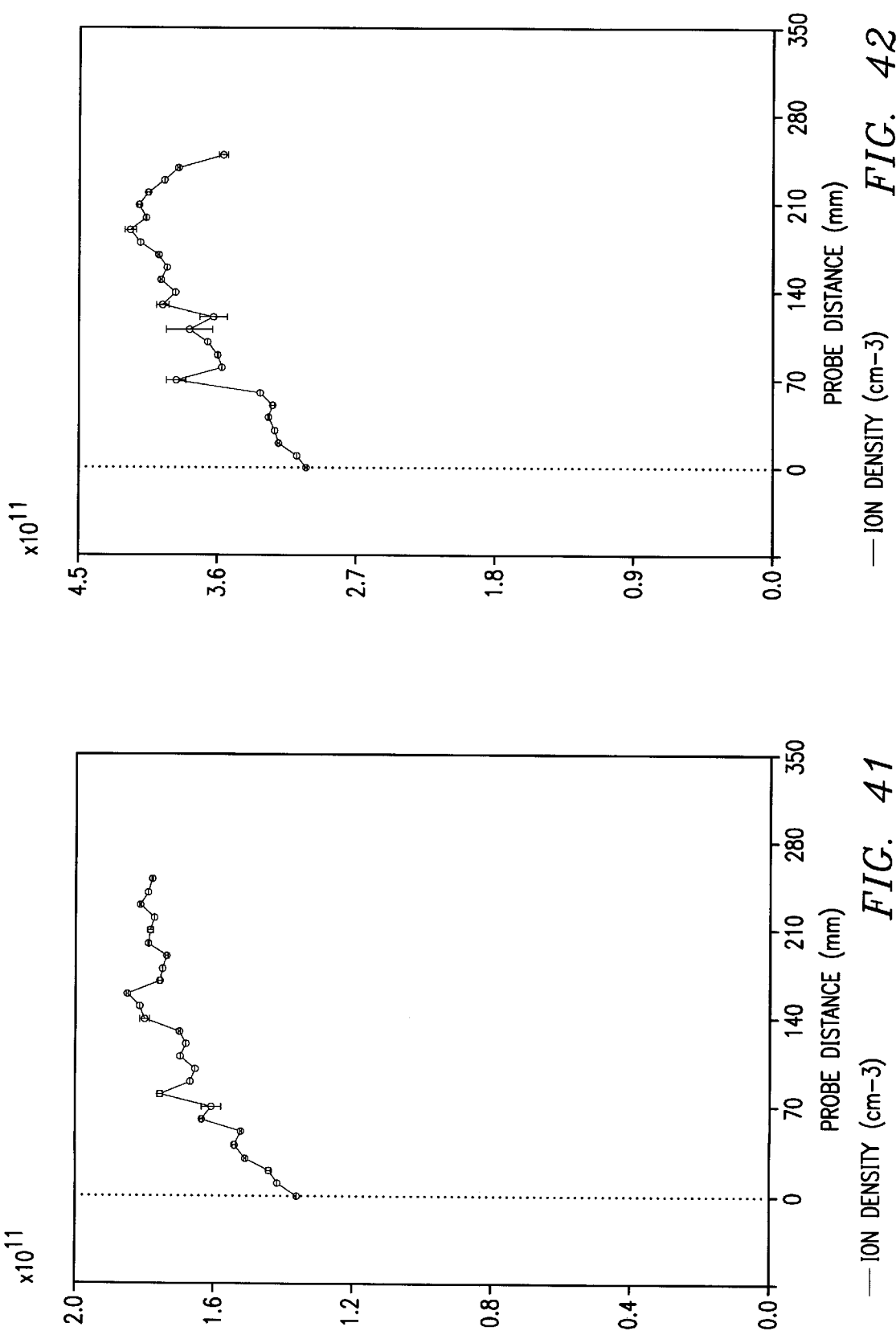

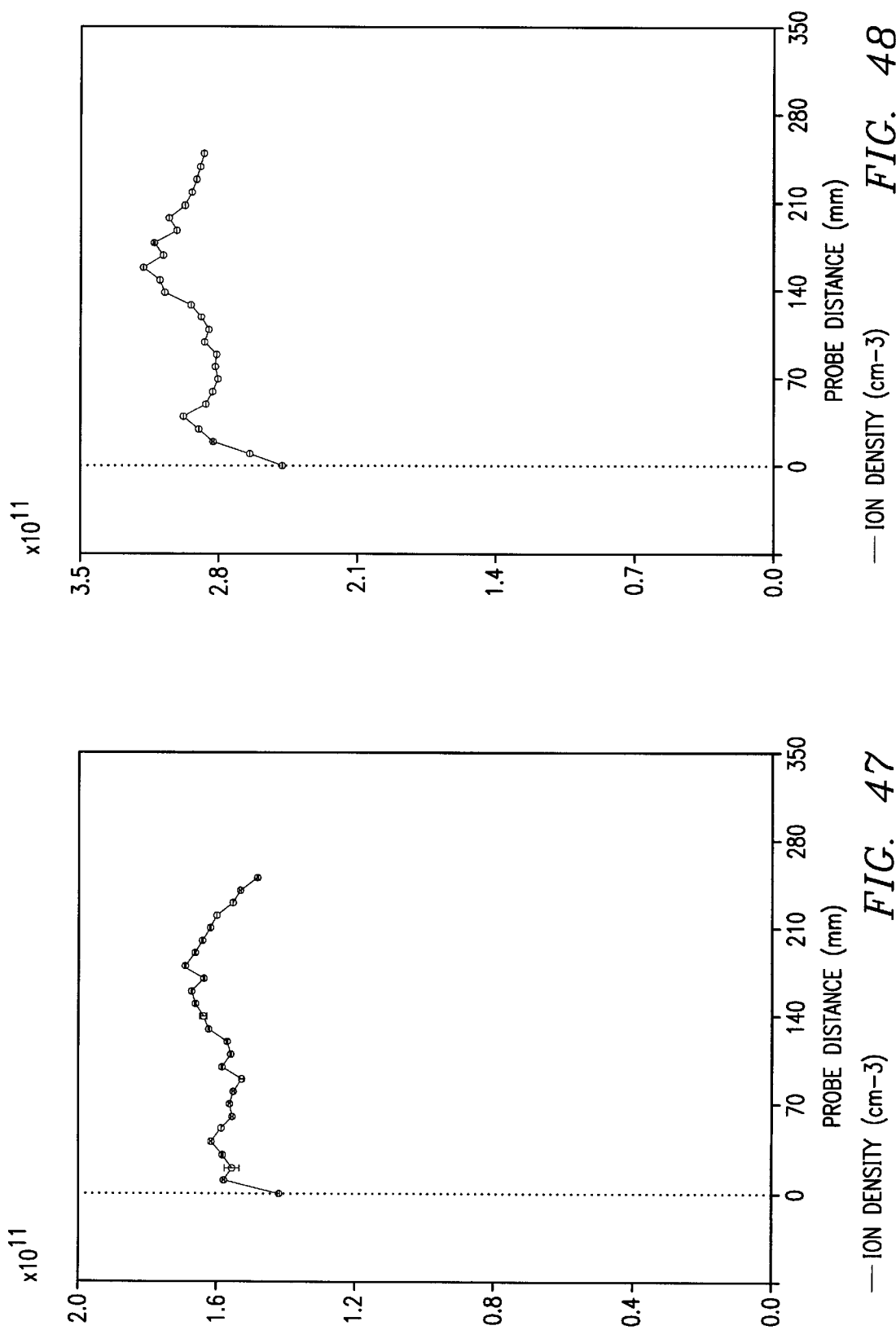

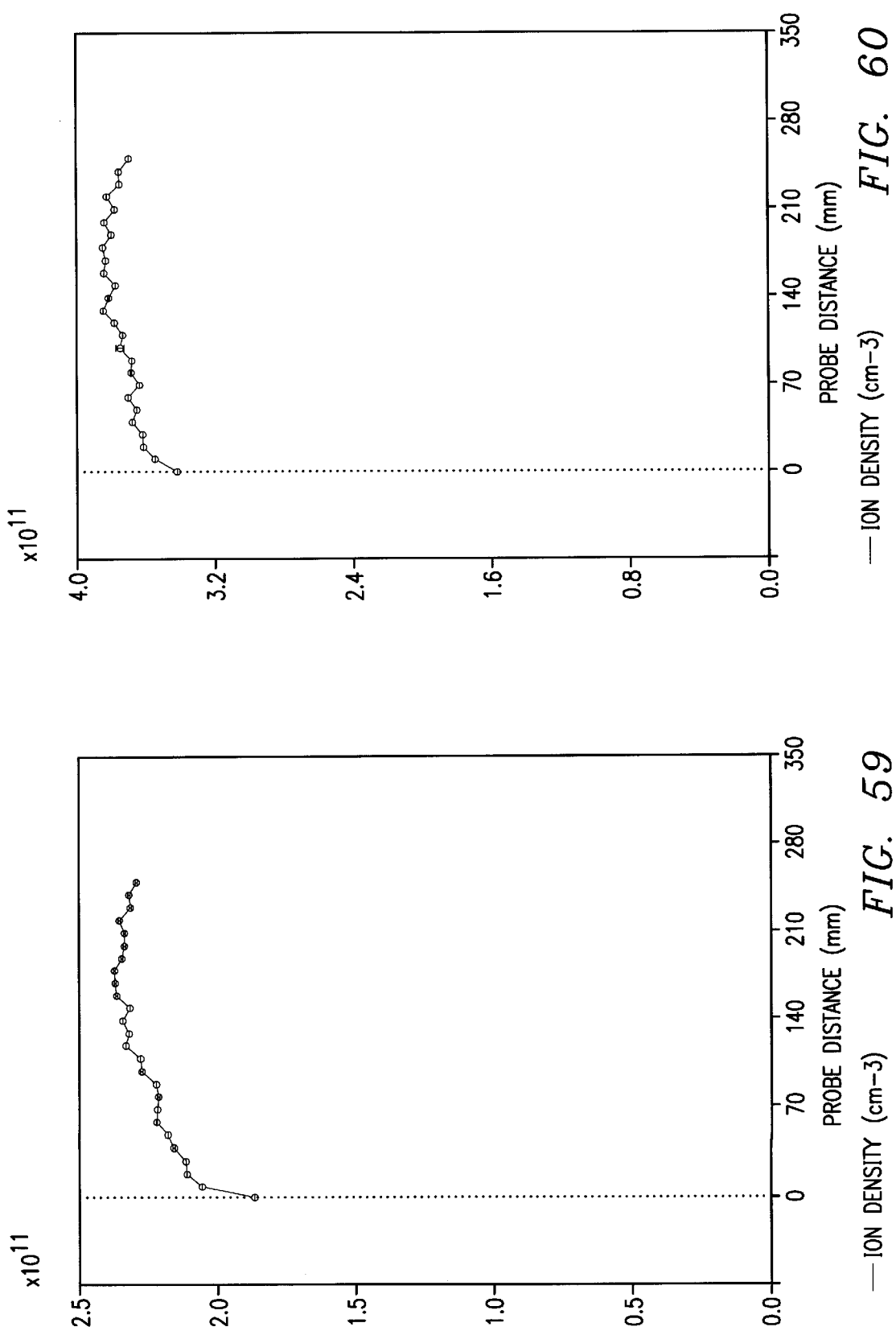

PERMANENT MAGNET ECR PLASMA SOURCE WITH INTEGRATED MULTIPOLAR MAGNETIC CONFINEMENT

This application claims benefit to U.S. provisional application Ser. No. 60/113,780, filed Dec. 23,1998.

CROSS REFERENCE TO RELATED APPLICATION

The present application is related to copending U.S. patent application Ser. No. 09/019,573 entitled "Permanent Magnet ECR Plasma Source with MagneticField Optimization" filed on Feb. 6, 1998. The above mentioned patent applications are assigned to the assignee of the present invention. The content of the cross referenced copending application is hereby incorporated herein by reference for all purposes.

BACKGROUND OF THE INVENTION

1. Technical Field

The present invention relates to a method and apparatus for integrating multipolar magnetic confinement with permanent magnet electron cyclotron resonance (ECR) plasma sources to produce highly uniform plasma processing for use in semiconductor fabrication and related fields.

2. Description of Related Art

Plasma producing devices are commonly employed in microelectronic device fabrication and similar industries requiring formation of extremely small geometrics. Plasma producing devices may be utilized in plasma-assisted processing to etch geometries into substrate or to deposit a layer or layers of material on the substrate.

One class of such plasma producing devices employs a magnetic field in conjunction with microwave energy. In these devices, plasma is produced from a working gas as a result of the interaction of a magnetic field with an electric field. A microwave waveguide may be employed to inject microwaves, which have an associated electric field, into an evacuable chamber containing the working gas. The microwaves propagate into the chamber in a direction substantially perpendicular to the surface of the workpiece. The electric field associated with the microwaves is perpendicular to the direction of the propagation, radially outward from a line 1. following the direction of the propagation of the microwaves. Plasma ions from the working gas are accelerated by the electric field along such radial lines.

A magnetic field is provided in a direction generally aligned with the direction of microwave propagation, causing plasma electrons within the working gas to rotate around the direction of microwave propagation at right angles with the magnetic field. At the plane of resonance, the point at which the electric field associated with the microwave energy and the rotation of plasma electrons are in phase, the microwave electric field constantly accelerates the rotating plasmas electrons. The energy of this acceleration dissociates molecules of the working gas into atoms and removes electrons from the atoms, creating ions and additional electrons. The ions then diffuse and impinge upon the exposed surface of the workpiece.

The requisite magnetic field may be provided by a single permanent magnet situated above the outlet of the microwave waveguide into the chamber. An adjusting element may be provided to vary the spatial relationship between the magnet and the waveguide opening, thus altering the location of the plane of resonance or "resonance zone" within the chamber.

While use of a permanent magnet situated over the waveguide opening to the chamber has advantages over other plasma producing methods, a permanent magnet of the size required to provide the requisite magnetic field may be very expensive. Additionally, plasma uniformity across the surface of the workpiece is generally necessary to achieve etched goemetrics or deposited layers having relatively uniform dimensions from the center to the periphery of the workpiece surface. Prior art attempts to obtain plasma uniformity have focused on achieving a uniform magnetic field, which requires very large and bulky magnets. Another drawback of the use of permanent magnets in plasma producing devices relates to the necessity of positioning the microwave waveguide between the permanent magnet and the workpiece. This constrains placement of the permanent magnet with respect to the chamber, and as the magnet face is moved further from the chamber, larger, more expensive magnets are required to produce the requisite magnetic field.

One solution to these difficulties is described in U.S. patent application Ser. No. 08/770,316, which teaches the use of a reduced height waiveguide with a rectangular-to-circular transmission mode converter, allowing the face of the permanent magnet to be moved closer to the resonance zone. Since field strength is inversely related to the square of the distance ($\sim 1/d^2$) for a dipole, this placement of the magnet closer to the resonance zone allows a smaller, less powerful magnet to realize the same magnetic field in the resonance zone. Although permanent magnets and electromagnets do not provide magnetic fields which are precisely those of a magnetic dipole, both provide fields having predominantly dipole characteristics. Closer to a permanent magnet, more substantial deviations from a dipole may be found.

The above-identified patent application also discloses the benefits of employing a return piece (also called a "pole piece") adjacent to the pole of the permanent magnet which is opposite the waveguide and evacuable chamber. The return piece, which may be composed of soft iron, short circuits the magnetic field emanating from the surface of the permanent magnet adjacent to the return piece, increasing the "effective height" or perceived magnetic strength of the permanent magnet. The return piece compensates for magnetic flux which would be generated by a larger magnet, allowing a smaller permanent magnet to produce a magnetic field having the strength equal to that produced by a similar magnet (without the return piece) of a larger height. Since the magnetic materials are typically very expensive, the ability to utilize a smaller permanent magnet to produce the requisite magnetic field at the resonance zone improves the commercial viability of the plasma producing device. Employing a return piece also reduces stray magnetic fields beyond the return piece.

The return piece described, particularly with optional sidewalls extending from the return piece and forming a "sheath" around the permanent magnet, provides some ability to shape and direct the magnetic field produced by the permanent magnet, and to minimize stray magnetic fields around the magnet. Control over both the direction of the magnetic field lines produced by the permanent magnet in the resonance zone and stray magnetic fields may thus be achieved. Additionally, the magnetic field near the workpiece may be minimized, resulting in a inherent increase in plasma uniformity.

Permanent magnet ECR systems and methods improve upon plasma-processing methods and hardware. The ECR systems and methods have been demonstrated to facilitate decreasing the amount of permanent magnet material required. Further, they have successfully demonstrated the creation of more uniform magnetic fields in the resonance zone and the ability to reduce stray fields in the process chamber. Additional information regarding the PlasmaQuest ECR Method can be found in U.S. patent application Ser. No. 09/019,573 titled "Permanent Magnet ECR Plasma Source with Magnetic Field Optimization" filed on Feb. 6, 1998, which is incorporated herein for all purposes.

Multipolar magnetic confinement involves the use of multiple magnets arranged about the periphery of the evacuable chamber. Multipolar magnetic confinement has been used by PlasmaQuest as a means of reducing wall losses in low pressure plasmas and has been implemented on a variety of low pressure plasma systems. In plasma systems which do not require magnetic field for operation, magnetic confinement typically consists of an array of small permanent magnets with opposing polarities arranged around the periphery of the chamber. In systems which require magnetic fields for operation, such as ECRs and helicon wave plasma systems, the confinement magnets are in addition to the magnets required for ECR or helicon wave excitation. The confinement magnet fields are typically small relative to the ECR or helicon magnetic field.

Charged particles are confined to travel along the magnetic field lines by the v×B force; thus magnetic fields have a significant impact on plasma diffusion. This impact is the fundamental basis of magnetic confinement. When used in the semiconductor fabrication industry, plasma reactors require not only high plasma density in the generation region, but at the wafer surface as well.

The optimal integration of permanent magnet ECR sources with an integrated multipolar magnetic confinement has yet to be achieved in the prior art. Therefore, a need exists to combine, in an optimum arrangement and condition for a given application, multipolar magnetic confinement along with permanent magnet ECR plasma sources. This combination should optimize plasma extraction from the source, optimize plasma uniformity, maximize the area of uniform plasma density, and allow for tuning between a centrally peaked and centrally hollow plasma profile.

SUMMARY OF THE INVENTION

The present invention provides a method and apparatus for integrating multipolar magnetic confinement with permanent magnetic electron cyclotron resonance (ECR) plasma sources to produce highly uniform plasma processing is disclosed. This invention is used in semiconductor fabrication and related fields when uniform plasma processing is desirable.

In a preferred embodiment, the plasma processing apparatus includes a vacuum chamber, a workpiece stage within the chamber, a permanent magnet electron cyclotron resonance plasma source directed at said chamber, and a system of permanent magnets for plasma confinement about the periphery of said chamber. The permanent magnets for plasma confinement are arranged in a multiplicity of rings with the plane of the rings perpendicular to the vacuum chamber axis and to the direction of propagation of the microwave into the vacuum chamber. The number of rings is chosen with respect to the vacuum chamber dimensions to produce a large, low magnetic field region in the region of the vacuum chamber adjacent to the workpiece stage.

Multiple magnet configurations are disclosed to provide an optimal confinement magnet design in combination with field effect of the ERC magnet. This invention provides for superior uniformity in plasma processing over the prior art.

The invention also optimizes plasma extraction from the source, maximizes the area of uniform plasma density, and provides for tuning between centrally peaked and centrally hollow plasma profiles.

The above as well as additional features and advantages of the present invention will become apparent in the following written detailed description.

BRIEF DESCRIPTION OF THE DRAWINGS

The novel features believed characteristic of the invention are set forth in the appended claims and claims to be appended in the non-provisional filing of this application. The invention itself, however, as well as a preferred mode of use, further objectives and advantages thereof, will be best understood by reference to the following detailed description of illustrative embodiments when read in conjunction with the accompanying drawings, wherein:

FIG. 5 depicts a table summarizing the results of confinement magnet configuration modeling.

FIGS. 30 depicts a table summarizing results from numerous confinement magnet experiments along with ion density results.

FIGS. 31–70 depict graphs illustrating ion density as a function of probe distance for various microwave powers and chamber pressures.

DETAILED DESCRIPTION

In order to provide control over shaping of the magnetic field to achieve benefits in plasma processing and to adjust field strength and shape through positioning and/or shaping of a pole piece in a permanent magnet assembly for a plasma-producing device, PlasmaQuest of Dallas, Tex. has developed a permanent magnet electron cyclotron resonance (ECR) plasma source with magnetic field optimization (hereinafter the "PlasmaQuest ECR Method").

Figure 1:
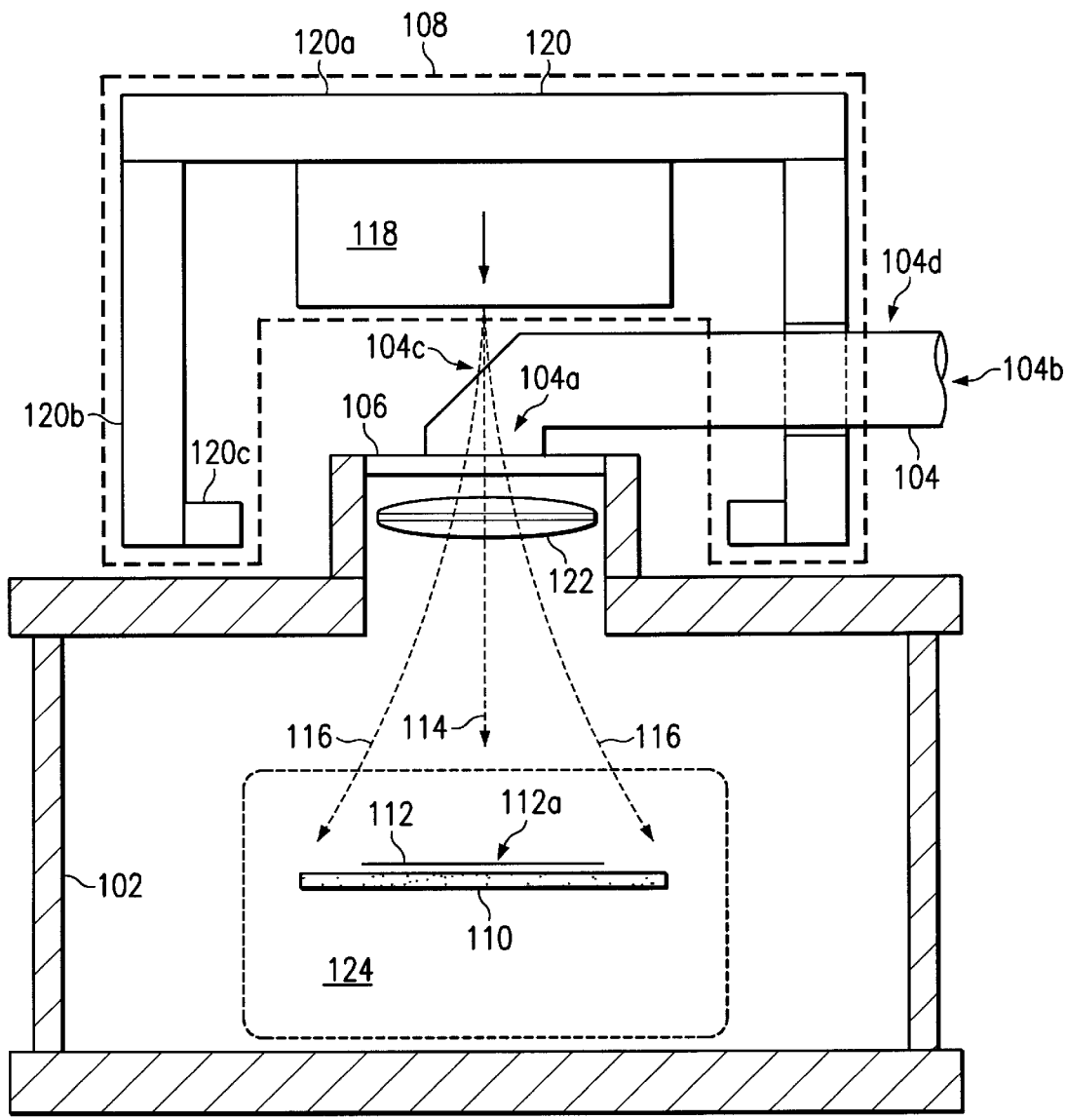
FIG. 1 depicts a cross-sectional view of a portion of a plasma-producing device illustrating the PlasmaQuest ECR Method.

With reference now to FIG. 1, a cross-sectional view of a portion of a plasma producing device in accordance with a preferred embodiment of the PlasmaQuest ECR Method is depicted. For clarity, the components depicted in FIG. 1, are not drawn to scale and some elements of the total construction of a plasma-producing device are not depicted. Only so much of the structure as is necessary to understand the PlasmaQuest ECR Method and the present invention are in these figures.

The plasma-producing device in FIG. 1 includes an evacuable chamber 102 with a waveguide situated adjacent a chamber 102 having an outlet 104a proximate to a window 106 constructed of material transparent to microwave radiation, such as quartz or aluminum oxide, and located in an opening in the chamber 102. Waveguide 104 is connected at an inlet 104b to a microwave power generation source and matching network (not shown) and conveys microwave energy produced by the generating source along its length to an outlet 104a proximately situated to the window 106. The waveguide 104 is preferably a rectangular waveguide, may be constructed from brass or aluminum, and is preferably a half-height or reduced height waveguide in the region where the waveguide 104 intervenes between the evacuable chamber 102 and magnetic field source 108.

Waveguides such as waveguide 104 are generally dimensioned according to the frequency of the microwave energy to be transmitted. Microwave energy having a frequency of about 2.45 GHz has been found generally suitable for plasma-producing devices. For 2.45 GHz microwave energy, a WR284 waveguide, with internal dimensions of 2.84 by 1.34 inches and a frequency range including 2.45 GHz, or a WR340 waveguide, which has internal dimensions of 3.40 by 1.70 inches and a frequency range of 2.1 to 3.00 GHz, may be utilized. However,.for efficient transport of microwave energy in a rectangular waveguide, the most important dimension of the waveguide is the horizontal (width) dimension, while the vertical(height) dimension may be reduced with a slight increase in loss but no change in transmission mode. Thus, the waveguide 104 preferably tapers from a standard sized waveguide at the generating source to a reduced height waveguide having a smaller vertical dimension at a region 104d where the waveguide 104 begins to intervene between the evacuable chamber 102 and a magnet field source 108 to be placed closer to outlet 104a while maintaining acceptable power levels and suitable transmission distances.

Waveguide 104 may also include a rectangular-to-circular transmission mode converter at the elbow 104c leading to the outlet 104a, and may be filled with a material such as Teflon®, which has a higher dielectric constant than air and thus permits a smaller waveguide to be employed. When the waveguide 104 is dielectrically loaded, the dimensions are scaled from the inverse of the square root of the dielectric constant.

A support 110 located in the interior of the evacuable chamber 102 holds a workpiece 112 during processing, and may be electrically biased to create an electric field attracting plasma ions form the resonance zone. Microwave energy exiting the waveguide 104 at the outlet 104a passes through the window 106 and propagates, preferably in a circular transmission mode, within the chamber 102 in a direction 114 substantially perpendicular to the exposed processing surface 112a of the workpiece 112. Close to the resonance zone, magnetic field lines 116 of the magnetic field generated by magnetic field source 108 are substantially aligned with the direction 114 of microwave energy propagation. That is, a line connecting the poles of the magnetic field is substantially aligned with, and along the same line as, the direction of propagation of the microwave energy. Microwave energy thus propagates from the outlet 104a of the waveguide 104 in a direction aligned with a predominant axial magnetic field component produced by the magnetic field source 108, which extends through the waveguide 104 and window 106 into the chamber 102. A resonance zone is thus formed where the electric field associated with the microwave energy is in phase with the electron cyclotron motion of the plasma electrons.

The magnetic field source 118 in the depicted example is proximate to the waveguide 104 on the opposite side from the outlet 104a and evacuable chamber 102. The magnetic field source 108 in the embodiment illustrated is a permanent magnet 118 and a pole piece 120. The pole piece 120 includes a base 120a adjacent the pole of the permanent magnet 118 furthest from the workpiece 112, sidewalls 120 extending from the periphery of the base 120a substantially parallel to the magnet 118, and a recurve sections 120c extending from the ends of sidewalls 120b furthest from base 120a toward the center of the magnetic field source 108. The magnetic field source 108 (and thus the magnetic field lines 116), outlet 104a (and thus the direction 114 of microwave energy propagation), and workpiece support 110 may all be axially aligned as depicted.

The magnetic field source 108 comprised of a permanent magnet 118 and shaped pole piece 120 constructed as described in further detail in U.S. patent application Ser. No. 09/019,573, are employed to generate a uniform plasma at the surface of the workpiece 112. Electron cyclotron resonance (ECR) plasma resonance requires a magnetic field determined by the resonance condition $\omega=eB/m$, where $\omega$ is the angular frequency of the microwave energy ($2\pi f$ where f is the frequency in Hertz), e is the well-known constant electronic charge (approximately $1.6 \times 10^{19}$C), B is the magnetic field strength in Gauss, and m is electron mass. For microwave energy at 2.45 GHz, a field strength of 875 G is required to create this resonance condition for electrons. Additionally, to achieve high ion density in the source and hence high ion currents at the workpiece, it is preferable to have a plasma density greater than the critical plasma density $n_c$ (an "overdense" plasma), where $n_c$ is defined by:

$$\omega = \frac{4\pi n_c e^2}{m}$$

where $\omega$ is desired angular frequency for microwave energy to be coupled to the plasma (here, $2_\pi \times 2.45$ GHz). For microwave energy with a frequency of 2.45 GHz, the resonance zone critical density is approximately $7 \times 10^{10} cm^3$, above which high ion fluxes to workpiece 112 may be achieved.

Unfortunately, electromagnetic (EM) waves, including microwaves, generally will not propagate through regions of plasma density greater than the critical density. Instead, microwaves are reflected by regions exceeding the critical density and thus will not reach the resonance zone. The consequence is that, once the plasma density reaches the critical density, additional power cannot be added to the plasma and the density cannot be increased above the critical density. One exception to this general result is right hand circularly polarized waves, which may propagate through plasma regions exceeding the critical density provided the magnetic field strength is greater than that required for resonance. This is described in many works on plasma physics. In the case of microwave energy at 2.45 GHz as described earlier, this requires a magnetic field strength greater than 875 G. By achieving the launch condition of magnetic field strength in excess of that required for resonance with microwave energy of a given frequency, referred to as high field injection, a resonance zone with a plasma density greater than the critical density may be formed within the evacuable chamber 102. High field injection is therefore a critical aspect of plasma source and launcher design.

Plasma uniformity is desirable in most plasma processing systems. There are two general sources of plasma nonuniformity: 1) nonuniformity in the absorption or plasma generating region; and 2) nonuniformity in the transport or movement of the plasma between the generation zone and the workpiece. Uniformity of plasma generation requires that a uniform absorption be achieved, including a uniform microwave field pattern and a uniform magnetic field (resonance zone). Since the absorption and field patterns are interrelated, the ability to manipulate and control the magnetic field configurations (position of the resonance zone and local curvature of the resonance zone shape) on a local scale is critical to achieving a highly uniform absorption. "Local scale" refers to lengths smaller than the characteristics size of the permanent magnet. The magnetic field varies relatively slowly across lengths smaller than the characteristics size. For example, a permanent magnet in the form of a cube which is 6 inches on each side, or in the form of a cylinder with a 12 inch diameter bore, will produce magnetic fields which do not change rapidly over dimensions of about 3 inches, with the possible exception of regions adjacent the magnet.

In practice, it may be extremely difficult to generate a perfectly uniform plasma. Thus, some degree of homogenization of the plasma between the source and the workpiece would be desirable. This would allow local nonuniformities in the source to diffuse out, thus "smearing out" any non-uniformities present in the source region. In a magnetized plasma, however, diffusion of charged particles may be influenced substantially by the magnetic field. In particular, diffusion perpendicular to the magnetic field lines is slowed proportionally to the inverse square of the magnetic field strength. Due to this, it is desirable to achieve as low a magnetic field as possible in the region between the plasma generation (resonance) zone and the workpiece.

One source of plasma uniformity is cross-field diffusion. The substantial difference between ion and electron masses means that diffusion parallel to magnetic field lines 116 is led by electrons, which, having higher mobility, tend to leave a region more quickly than ions. However, this results in a positive charge (the ions) remaining in that region, resulting in an electric field which retards diffusion of the electrons. On the other hand, because electrons are confined to gyrate about magnetic field lines 116, plasma diffusion perpendicular to magnetic field lines 116 is limited, led by the lower mobility ions. Thus, the varying mobility of ions and electrons leads to variations in potential, and ultimately difficulties in achieving plasma uniformity. Plasma variations in one part of the system may be mapped to other areas down the magnetic field lines due to the slow diffusion across field lines.

Plasma variations at the workpiece may also arise from spatial variations in the divergence of the magnetic field. In a collisionless plasma.(no cross-field diffusion), plasma will travel down the magnetic field lines to the workpiece and the plasma density at any point will be proportional to the field strength at that point. Assuming the plasma is generated uniformly at the resonance zone (875 G), the plasma density at a point where the field strength is 875 Gauss would be $\frac{1}{10}^{th}$ that of the resonance zone. If the field strength across the workpiece varies, the plasma density will vary commensurately. At lower magnetic fields, cross-field diffusion will be enhanced and the effects of magnetic field strength variation will be minimized. Thus lower magnetic fields between the plasma generation zone and the workpiece, together with a controlled divergence of the field lines, is desirable.

An additional source of plasma variations arises from changes in the magnetic field magnitude (grad B parallel to B, where B is the magnetic field strength and direction at a given location and grad B is the rate of change of the magnetic field strength at a given location in a given direction). Converging field lines may form magnetic mirrors for electrons traveling in the direction of grad B>0, while electrons traveling parallel to grad B>0 may be accelerated. These variations in magnetic field magnitude lead to variations in plasma density and potential, and ultimately to variations in plasma processes at the workpiece 112 (e.g., variations in ion density/current and plasma potential/energy).

There are several approaches to achieving plasma uniformity despite the problems described. One solution is to attempt to achieve uniform transport of the plasma from the resonance zone to the workpiece 112. However, this is a complicated task since diffusion across the fields depends in part on pressure and plasma parameters, and thus on the process window. The required magnetic field is therefore specific to a certain process and set of plasma conditions. Moreover, engineering the magnetic fields typically involves placing a large electromagnetic coil close to the plane of the workpiece 112 and biasing the coil either to focus the magnetic field lines from the ECR absorption region on the workpiece 112 or to form a null field region immediately adjacent to the working surface 112a of the workpiece 112. The electromagnets required for this solution are extremely bulky, expensive, and difficult to handle. Because the electromagnet must be much larger than the diameter of the workpiece 112, the problems associated with this solution become worse as the substrate size (of the workpiece 112) increases. Furthermore, field engineering is generally only viable for a small range of pressures and powers, limiting process development.

A second approach to achieving plasma uniformity is to attempt to achieve a zero field region throughout the evacuable chamber 102 outside the resonance zone. This may involve use of a magnetic bucket to confine the plasma away from the walls of the chamber 102. However, the magnetic field within the evacuable chamber 102 may not be arbitrarily low since the magnetic field magnitude required for resonance must still be achieved. Alternatively, high field injection (operation above the critical plasma density) may be abandoned as in Distributed Electron Cyclotron Reactor (DECR) and Microwave Plasma Disk Reactor (MPDR) plasma devices. In such devices, small resonance zones are created by bucket magnets around the periphery of the evacuable chamber 102, with the microwave energy being coupled to the resonance zone either via an antenna or via a tuned resonance cavity. These plasma sources are confined to a low density operating regime where expansion of the plasma into a larger volume is impractical. A distributed plasma is created so that uniformity must be obtained by achieving uniform excitation of the plasma, involving practical problems which have not yet been commercially solved. A third approach to achieving plasma processing uniformity involves creation of a dense plasma resonance zone 122 (greater than the critical plasma density) followed by diffusion of plasma ions into a low field processing region 124 adjacent to the workpiece 112. High field injection may be achieved by utilizing a diverging magnetic field 116 with microwave energy 114 propagating into a region with a magnetic field having a magnitude in excess of that required for resonance (greater than 875 G for microwave energy at a frequency of 2.45 GHz). Unfortunately, the condition that the total divergence of the magnetic field be null (div B=0) implies that all field lines must close upon themselves. A magnetic field configuration consisting of an 875 G region which then rapidly falls to zero is physically difficult to achieve. Electromagnets generally have a circular form with a bore diameter larger (12–14 inches or more) than the diameter of the window 106 (about 6–10 inches in diameter). The magnetic fields of such electromagnets fall off as dipole fields in the far field—that is, proportional to $1/z^3$ for separations along the z direction (the axis of the electromagnet) greater than the coil diameter. The magnetic fields of electromagnets fall off much more slowly in the near field (points along the z direction less than the coil diameter) as a function of:

$$\frac{1}{(z^2 + d^2)^{3/2}}$$

Plasma-producing devices usually operate in the near field.

Permanent magnet sources provide some advantage in achieving plasma process uniformity by a dense plasma region followed by a low field region. The lateral dimension of a permanent magnet is somewhat smaller than the lateral dimension of an electromagnet having corresponding strength (typically about 4–6 inches in diameter), so that the cross-over to the dipole field regime in the far field occurs somewhat closer to the magnet. The need to fit a waveguide 104 between the magnetic field source 108 and the resonance zone requires some distance between the permanent magnet and the resonance zone. Coupling of the microwave energy to a region of magnetic field strength of at least that required for resonance therefore may occur in the near field, but not directly at the face. The magnetic field should thus fall from fairly high values, approximately 3000–5000 G, to a much smaller field strength at the working surface 112a of the workpiece 112. For magnetic field strengths of about 50–100 G at the workpiece 112, the gyro radius of a 3 electron-volts (eV) electron is 1 mm and the magnetic field still has a substantial effect on diffusion of the electron. If the magnetic field strength is lowered to 5 G, the gyro radius increases to 1 cm and the magnetic field has less effect. The larger gyro radius results in better diffusion and better plasma uniformity.

Figure 2:
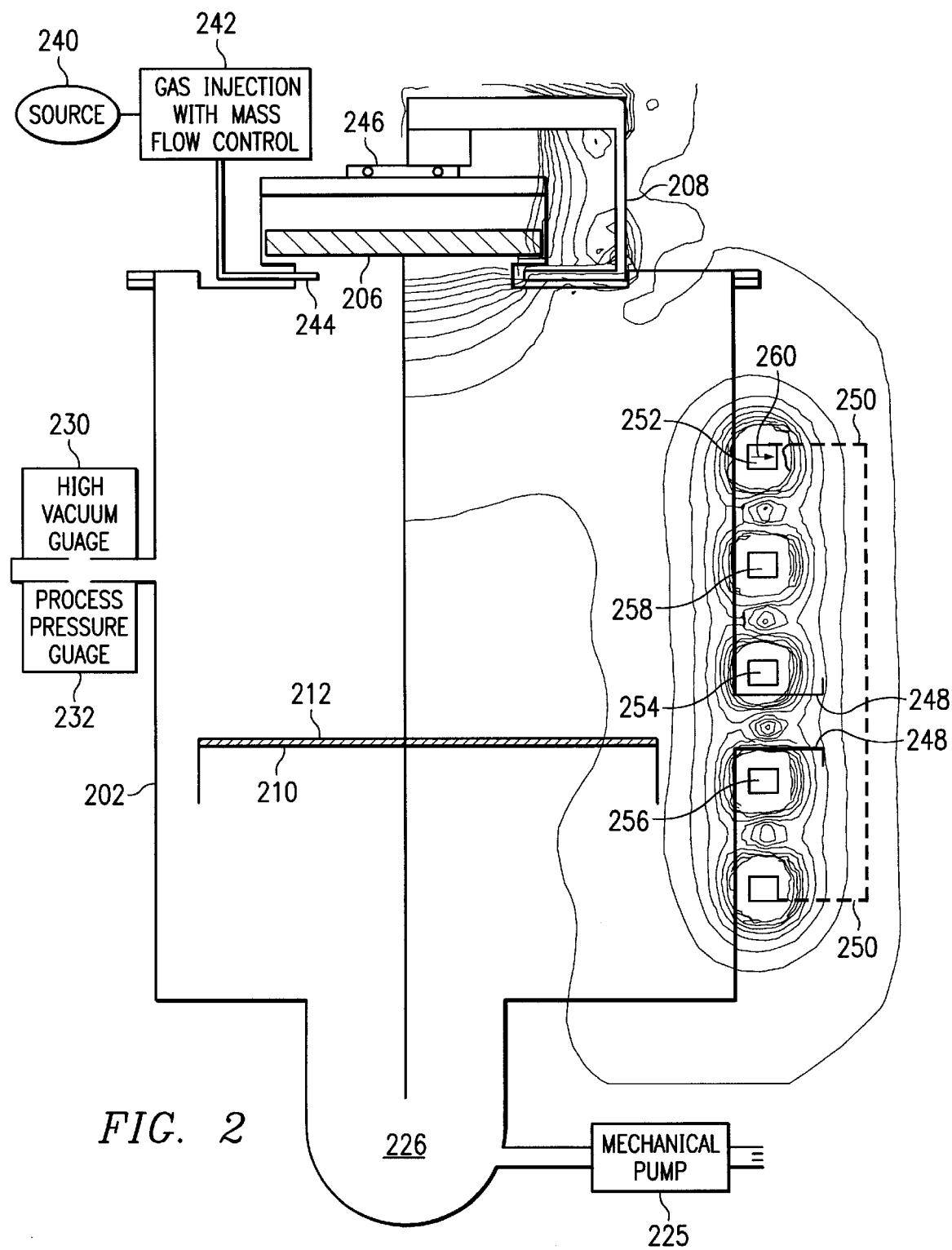
FIG. 2 depicts a cross-sectional view of a portion of a plasma-producing device in accordance with a preferred embodiment of the present invention.

FIG. 2 illustrates the confinement magnet configuration in relationship to the vacuum chamber and other necessary hardware for one embodiment of the invention. For clarity, the components depicted in FIG. 2 are not drawn to scale and some elements of the total construction of a plasma-producing device are not depicted. Only so much of the structure as is necessary to understand the present invention is depicted in this figure.

FIG. 2 shows the vacuum chamber 202, which is evacuated by means of a turbo pump and mechanical pump 228. Pressure in the chamber is monitored by way of a high vacuum gauge 230 and a process pressure gauge 232. A gas source, 240 is directed through a flow control 242 and injected into the vacuum chamber 202 through an injection port 244. A magnetic field source 208 and dielectric window 206 are depicted and correspond with the magnetic source 108 and window 106 shown in FIG. 1. Also shown in FIG. 2 is a microwave waveguide 246.

Near the slit valve 248, FIG. 2 shows an array 250 of small permanent magnets 252–256 arranged around the periphery of the chamber 202. FIG. 2 is a cross-section schematic representation of a portion of an apparatus having axial symmetry. In this example, magnets 252–256 in the array 250 are actually circular rings. Array 250 of magnets 252–256 comprises the multipolar magnet confinement aspect of the invention. Array 250 illustrated in FIG. 2 is a five-bank array. Chuck surface 212 is also shown within the vacuum chamber 202 supported by workpiece stage 210. A magnetic field map has been interposed over the right half of FIG. 2 to illustrate the effect of the particular embodiment shown.

A considerable amount of experimentation has been performed to identify the optimum confinement magnet design in combination with the field effect of the ECR magnet. Models were constructed and tested with various combinations of the following fields: whether the top band magnetic field 260 is aligned or anti-aligned with the ECR magnetic field; whether the band spacing around chuck 212 equals 4 inches or 7.5 inches; whether the band magnetic field above and below slit valve 248 are aligned or anti-aligned; and, whether there are five or six bands arrayed on chamber 202. The terms "aligned" and "anti-aligned" are defined relative to the field direction due to the "source magnet."

Figure 6:
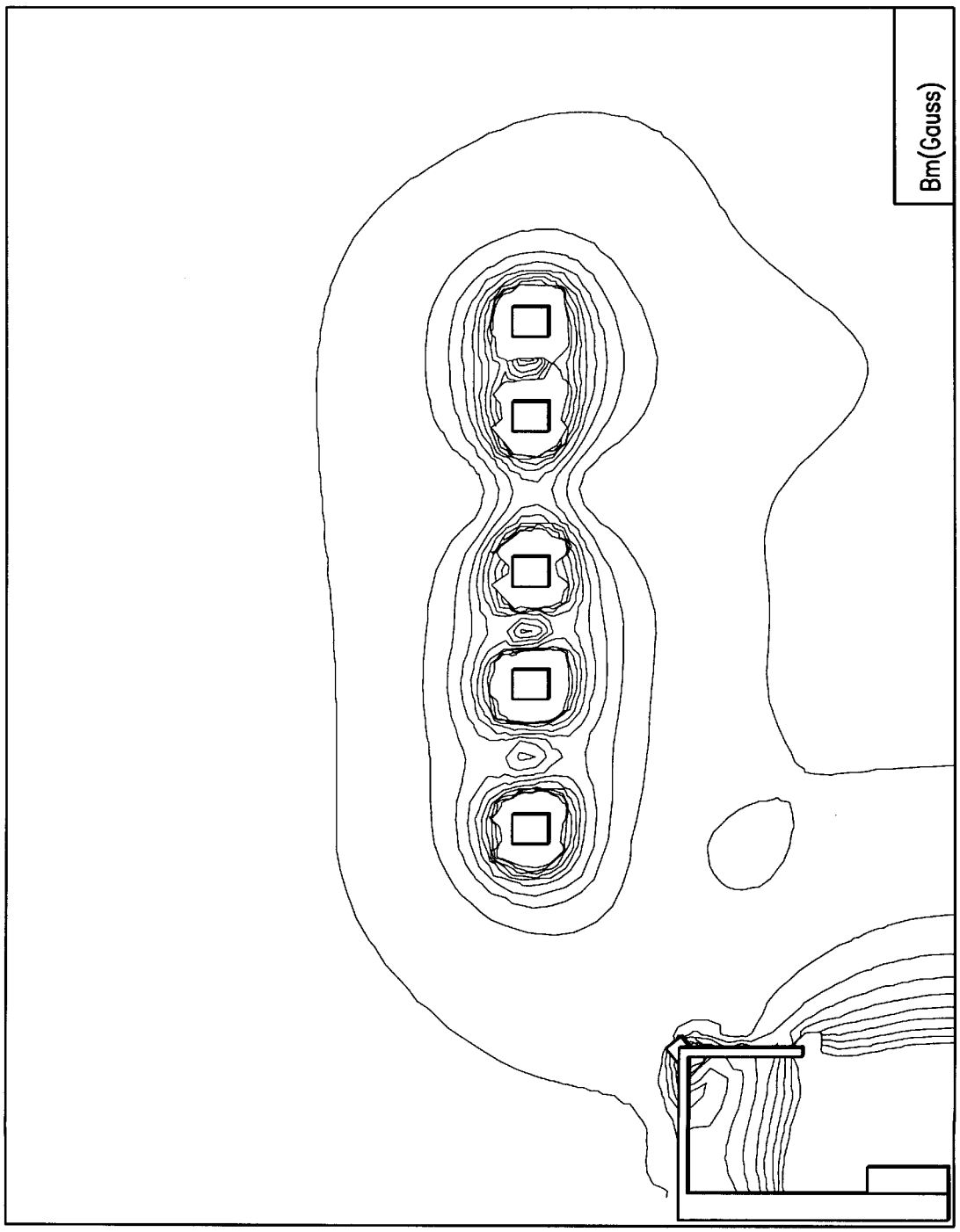
FIGS. 6–29 depict graphs of various confinement magnet configuration models.
Figure 7:
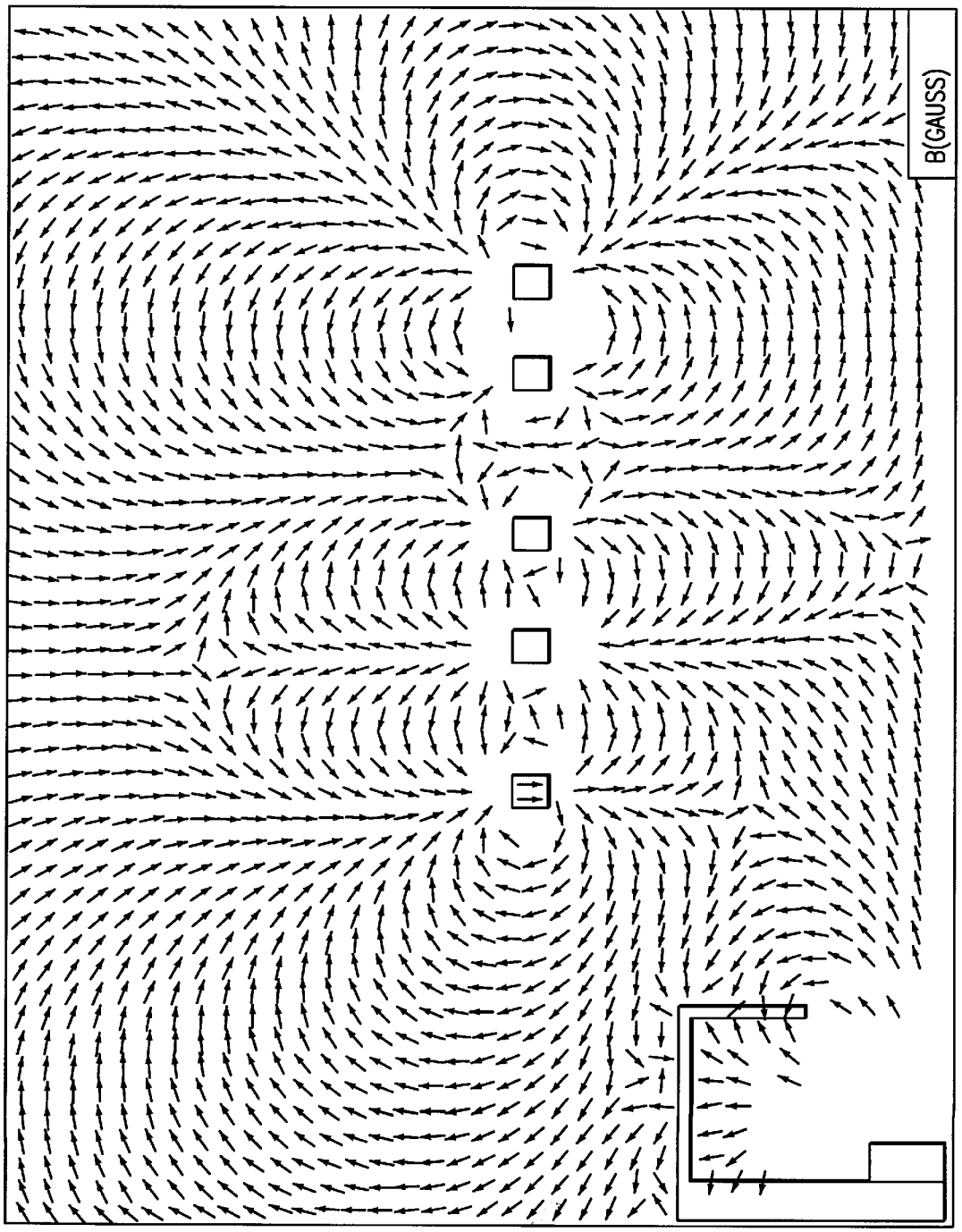
Figure 8:
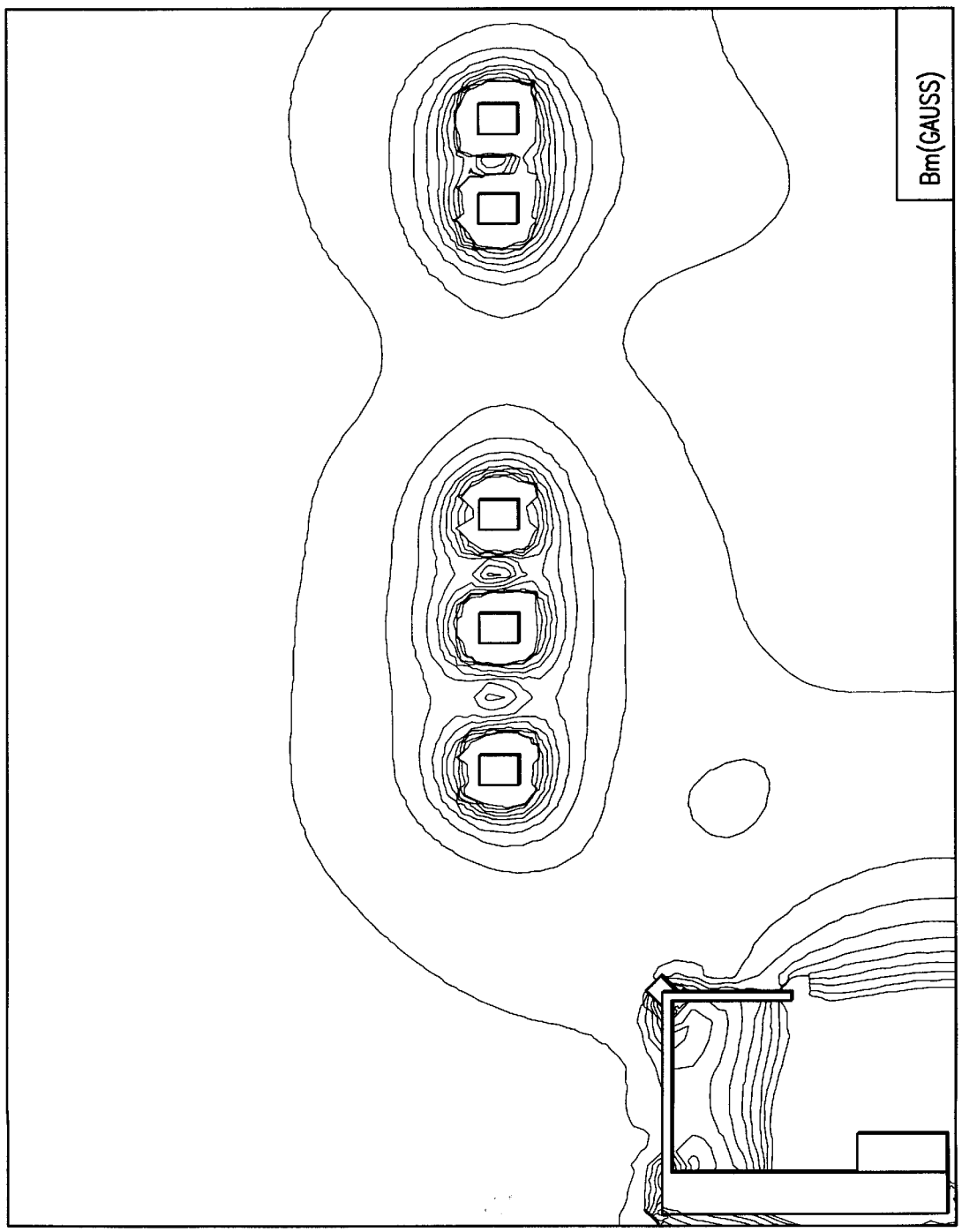
Figure 9:
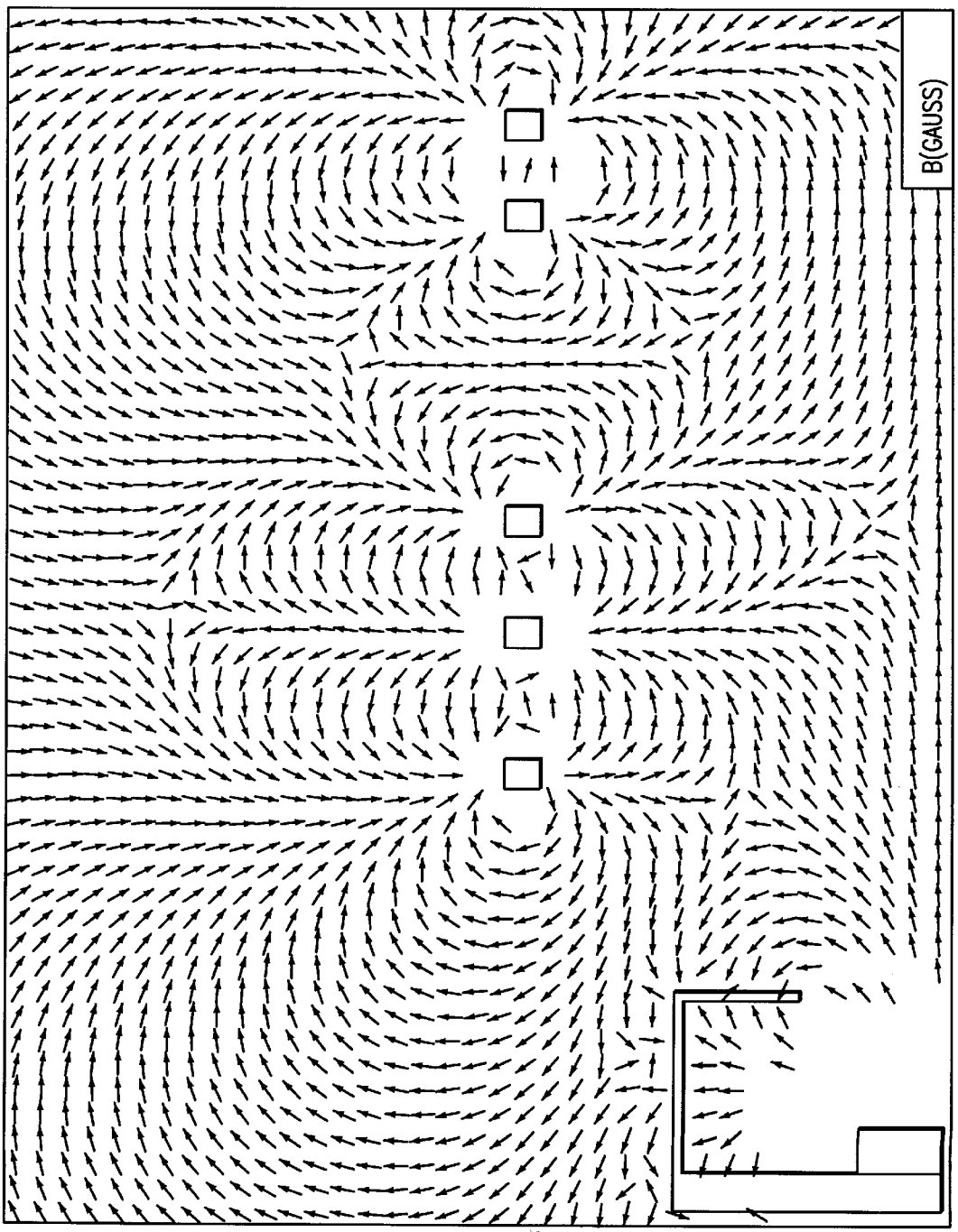
Figure 10:
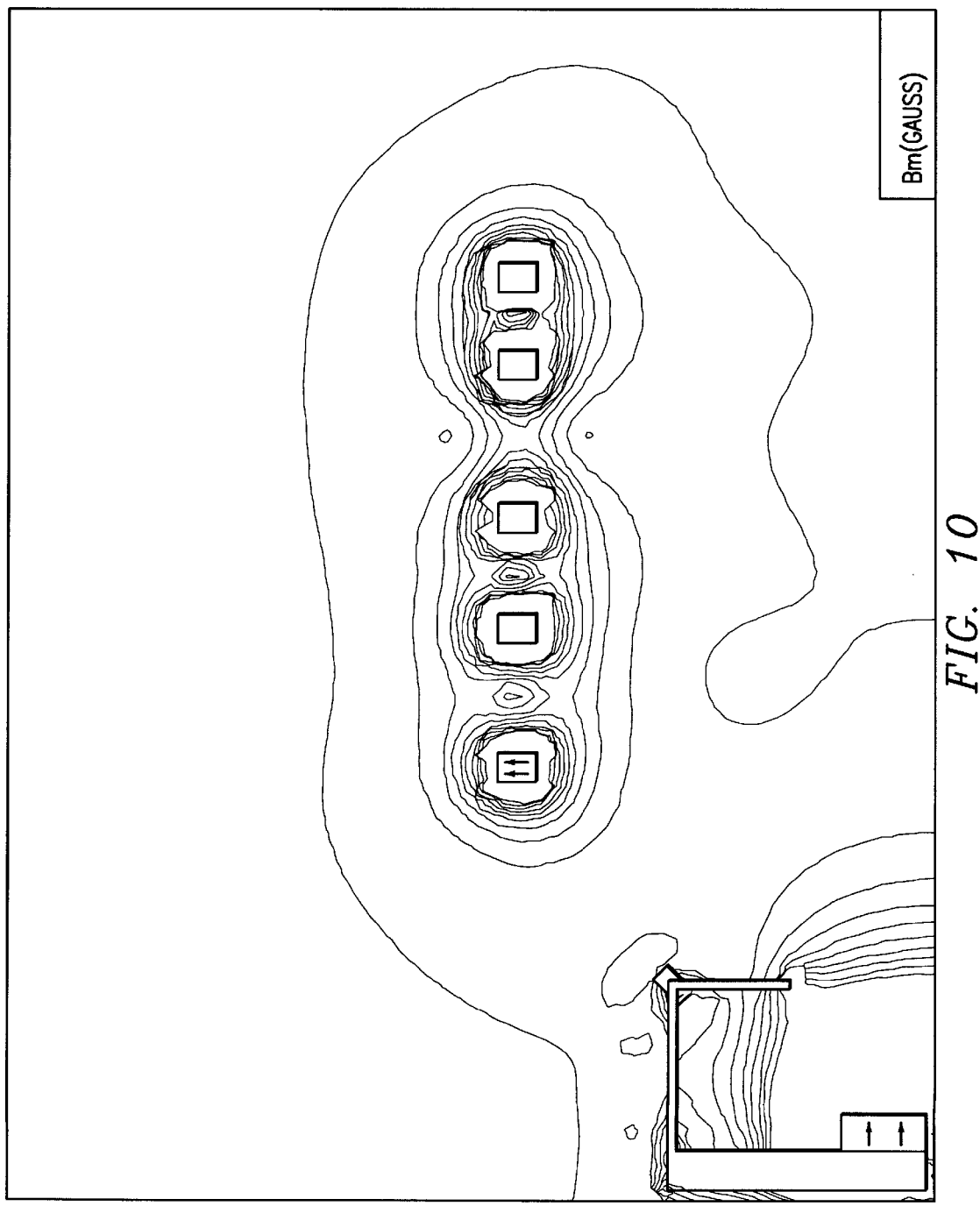
Figure 11:
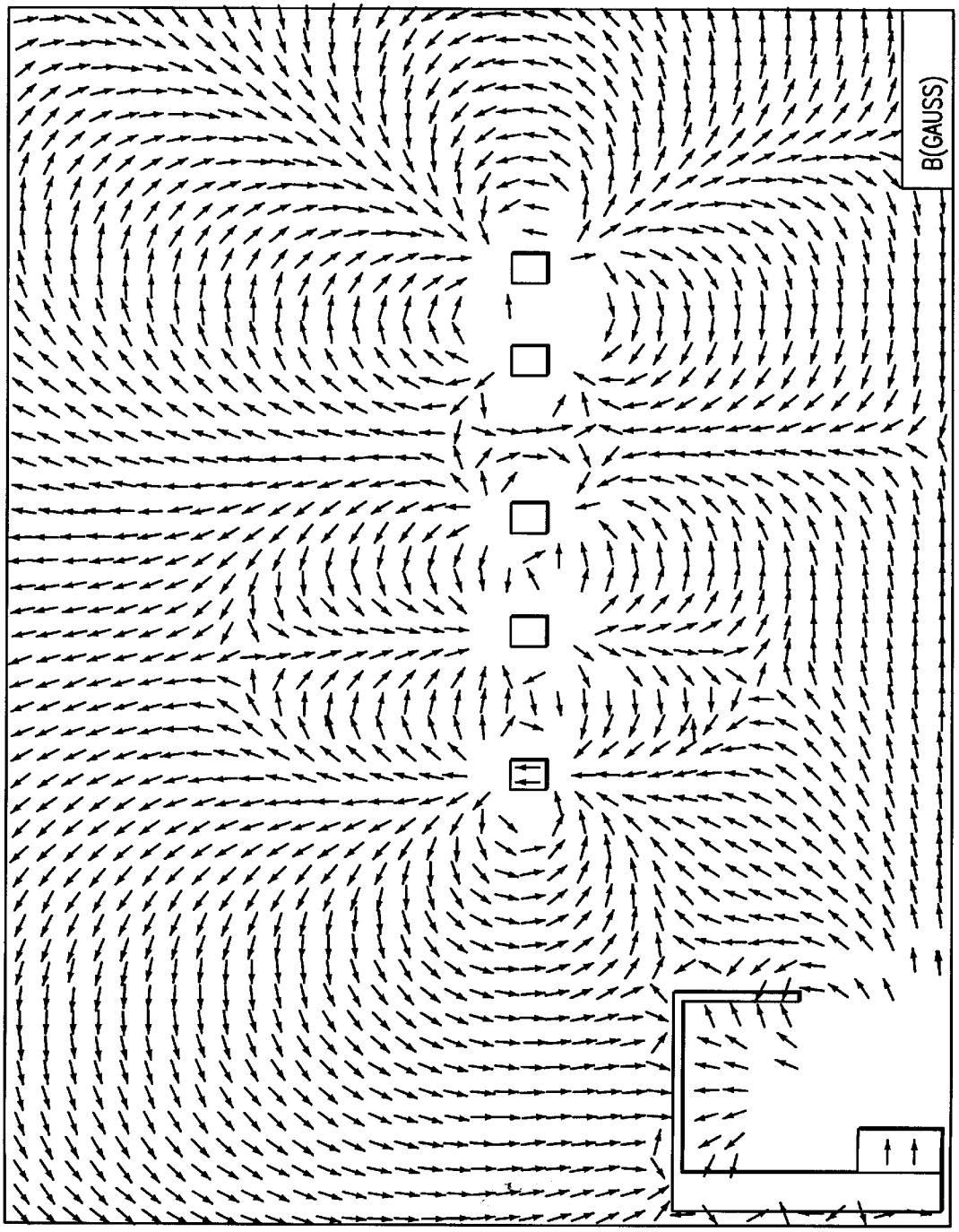
Figure 12:
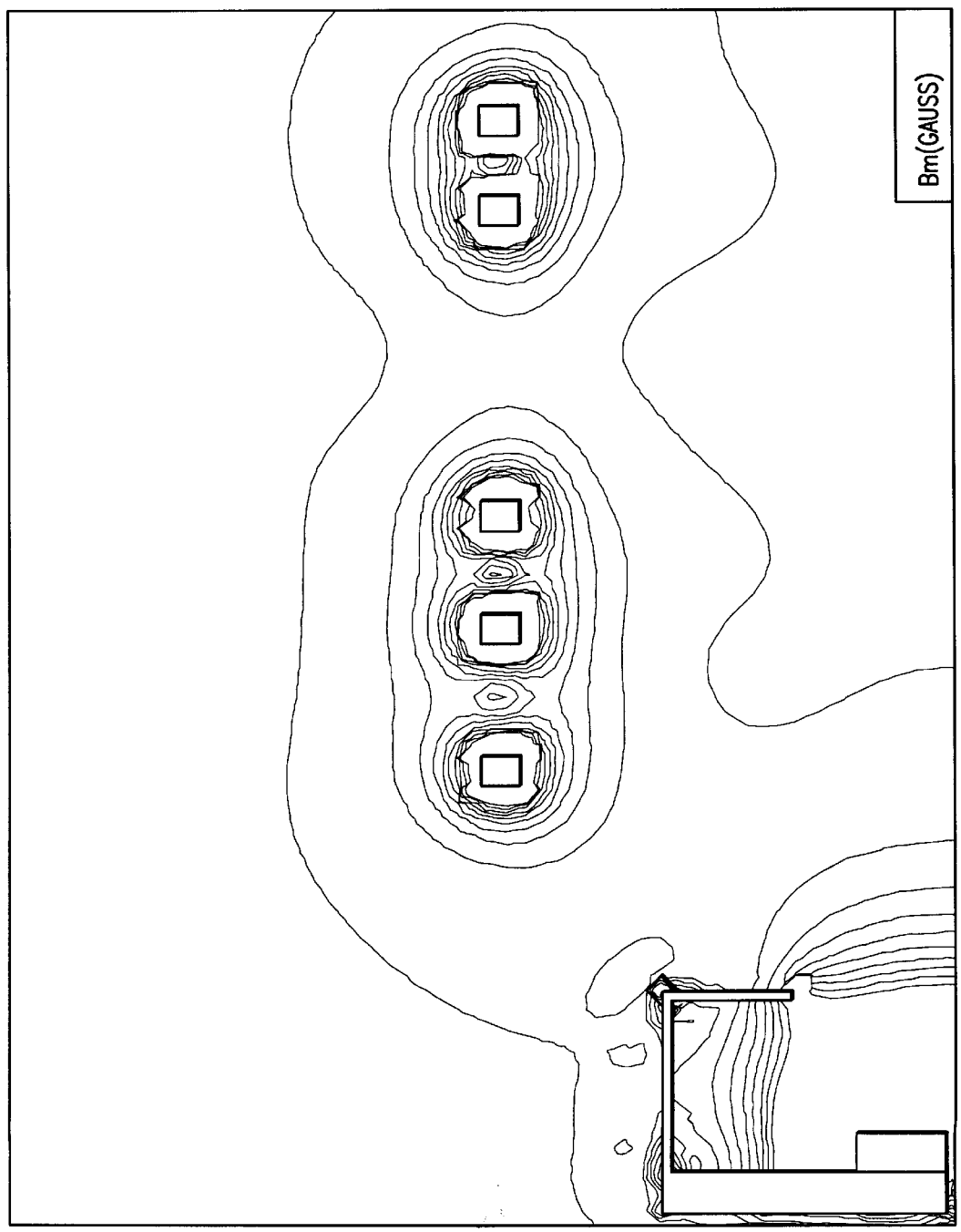
Figure 13:
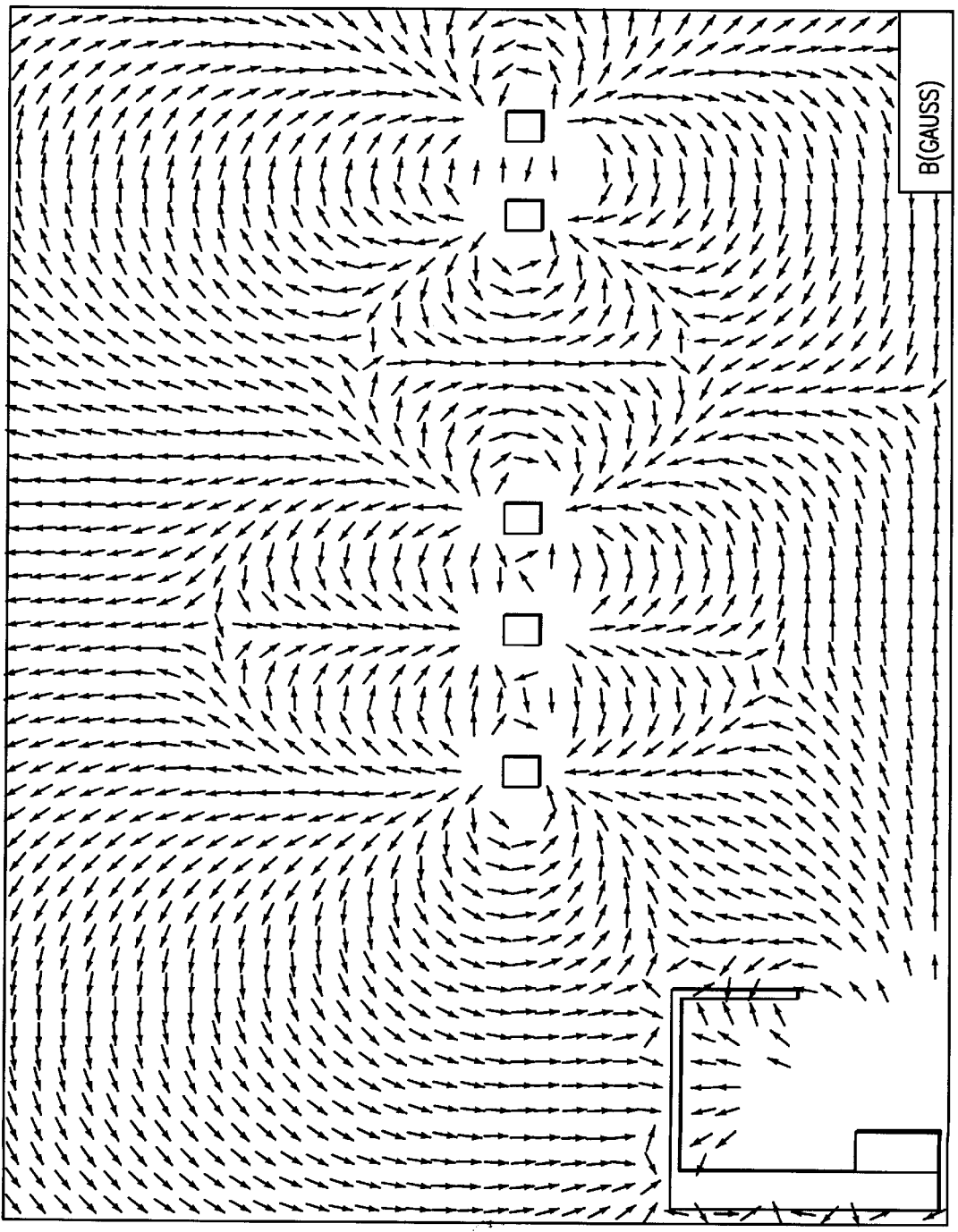
Figure 14:
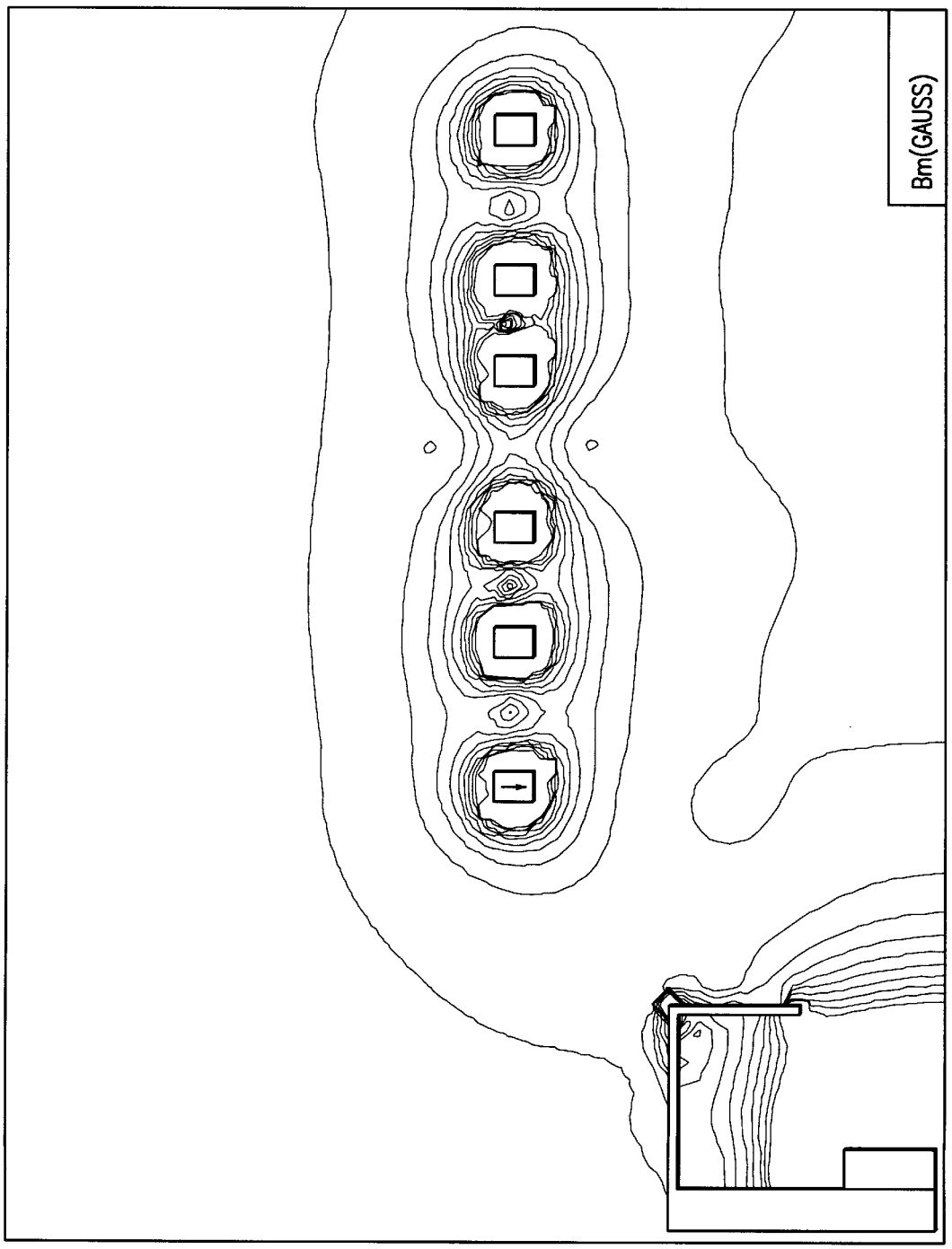
Figure 15:
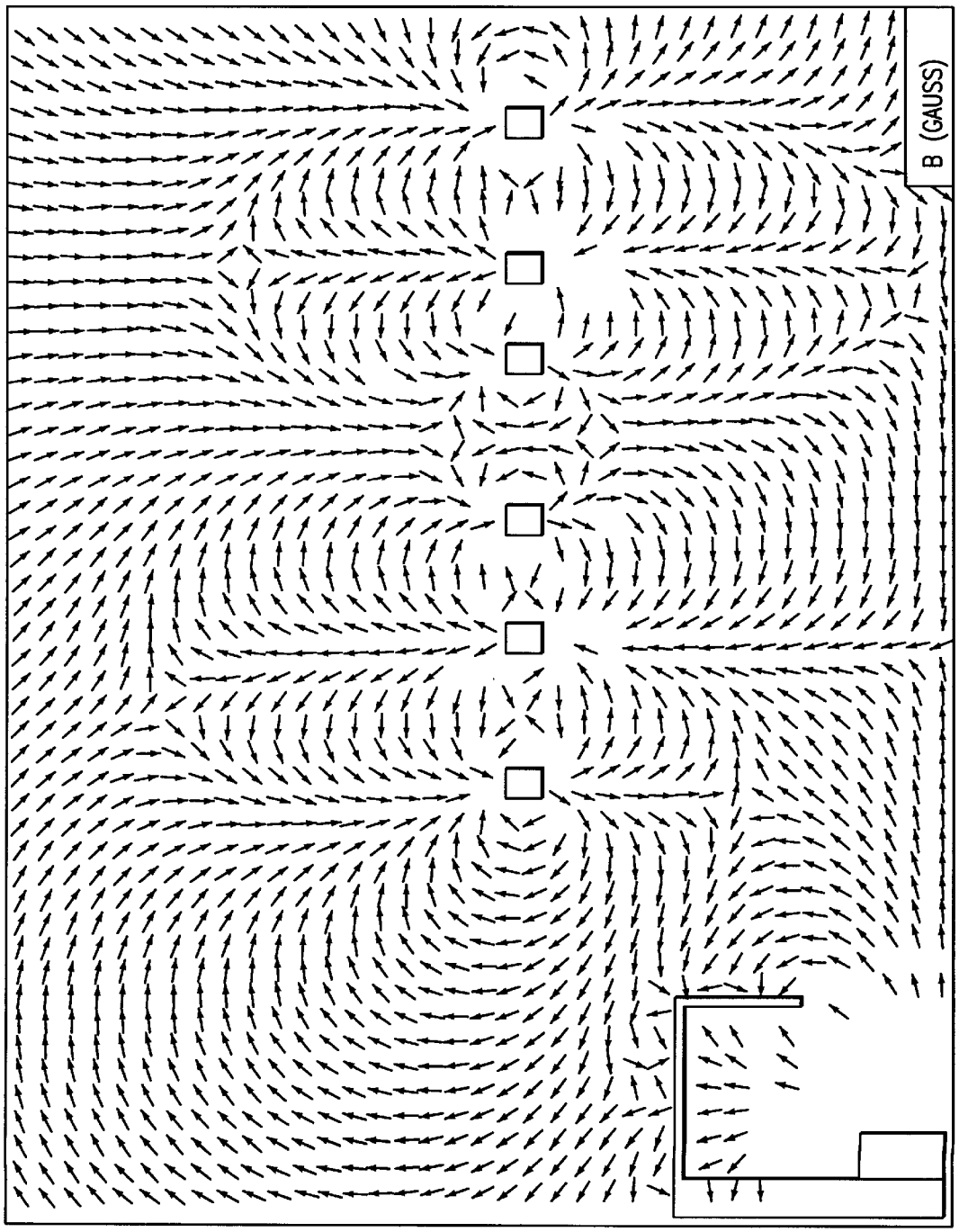
Figure 16:
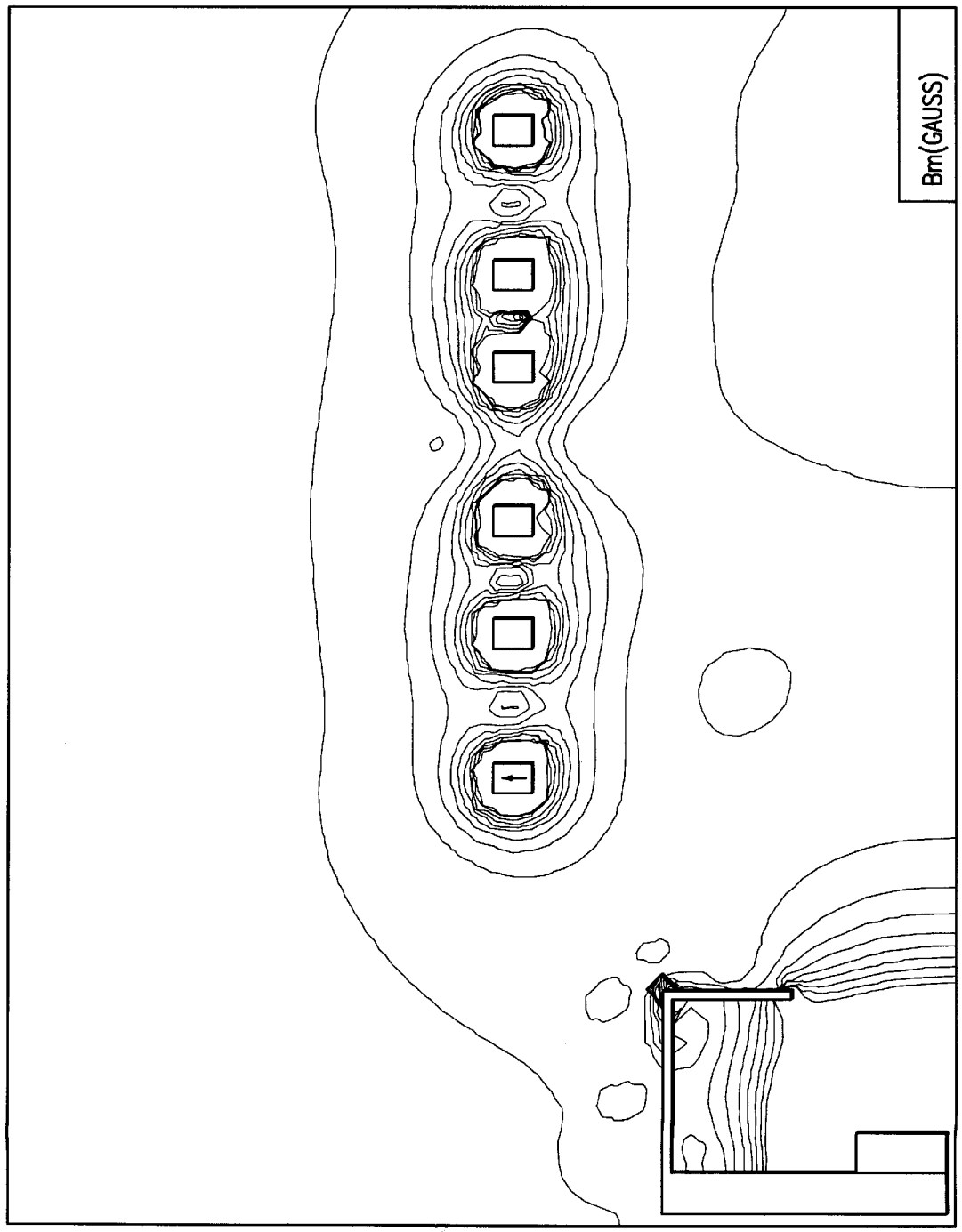
Figure 17:
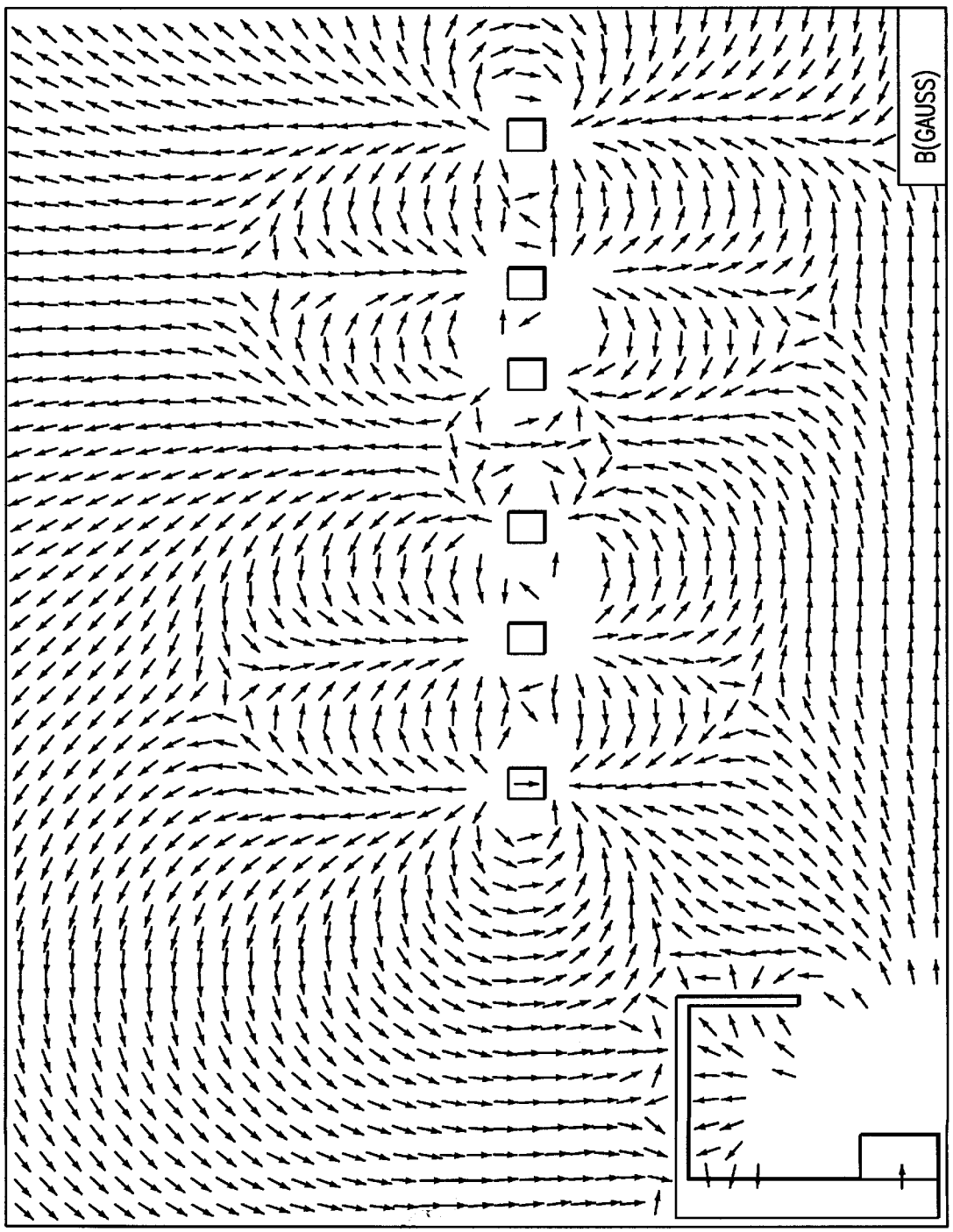
Figure 18:
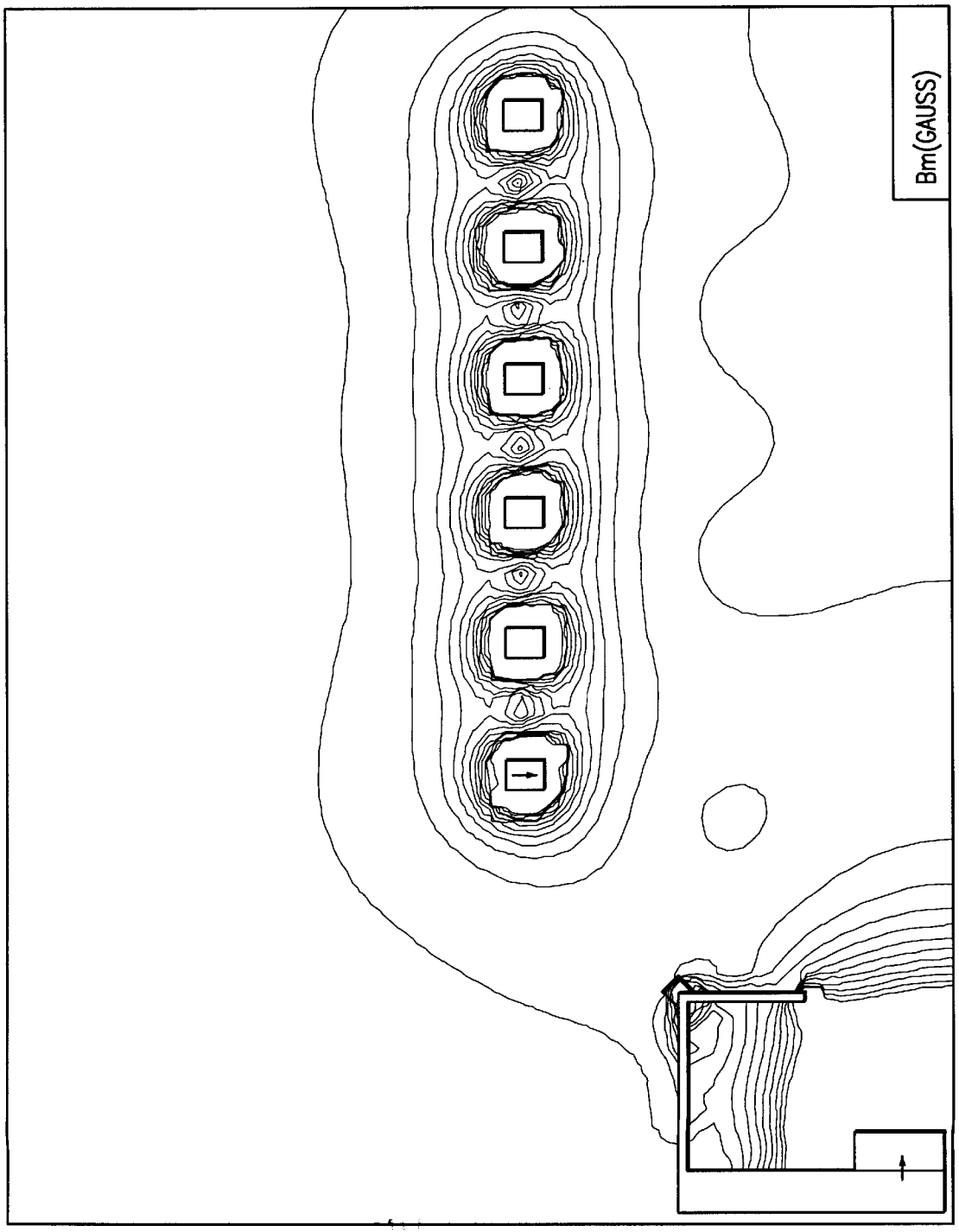
Figure 19:
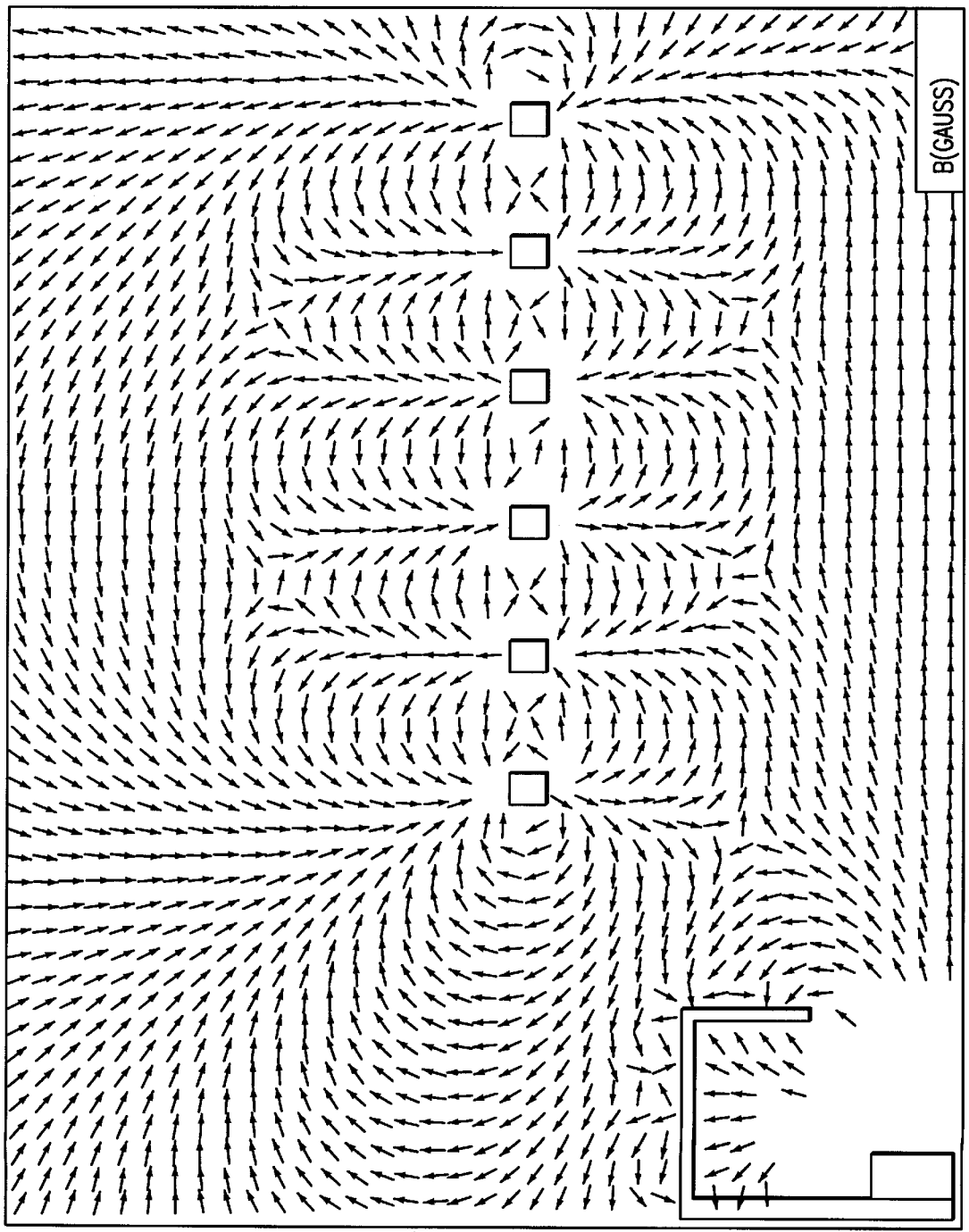
Figure 20:
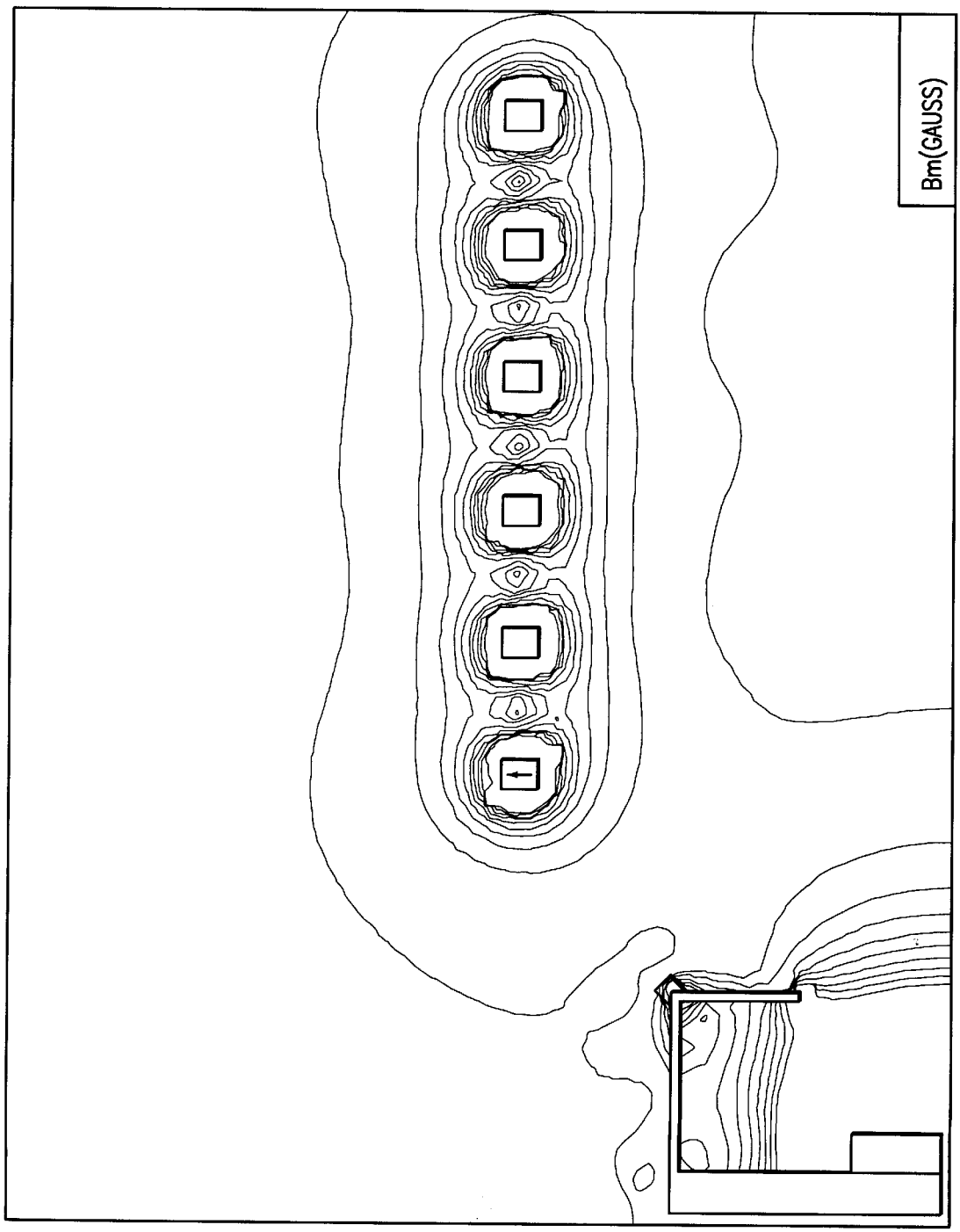
Figure 21:
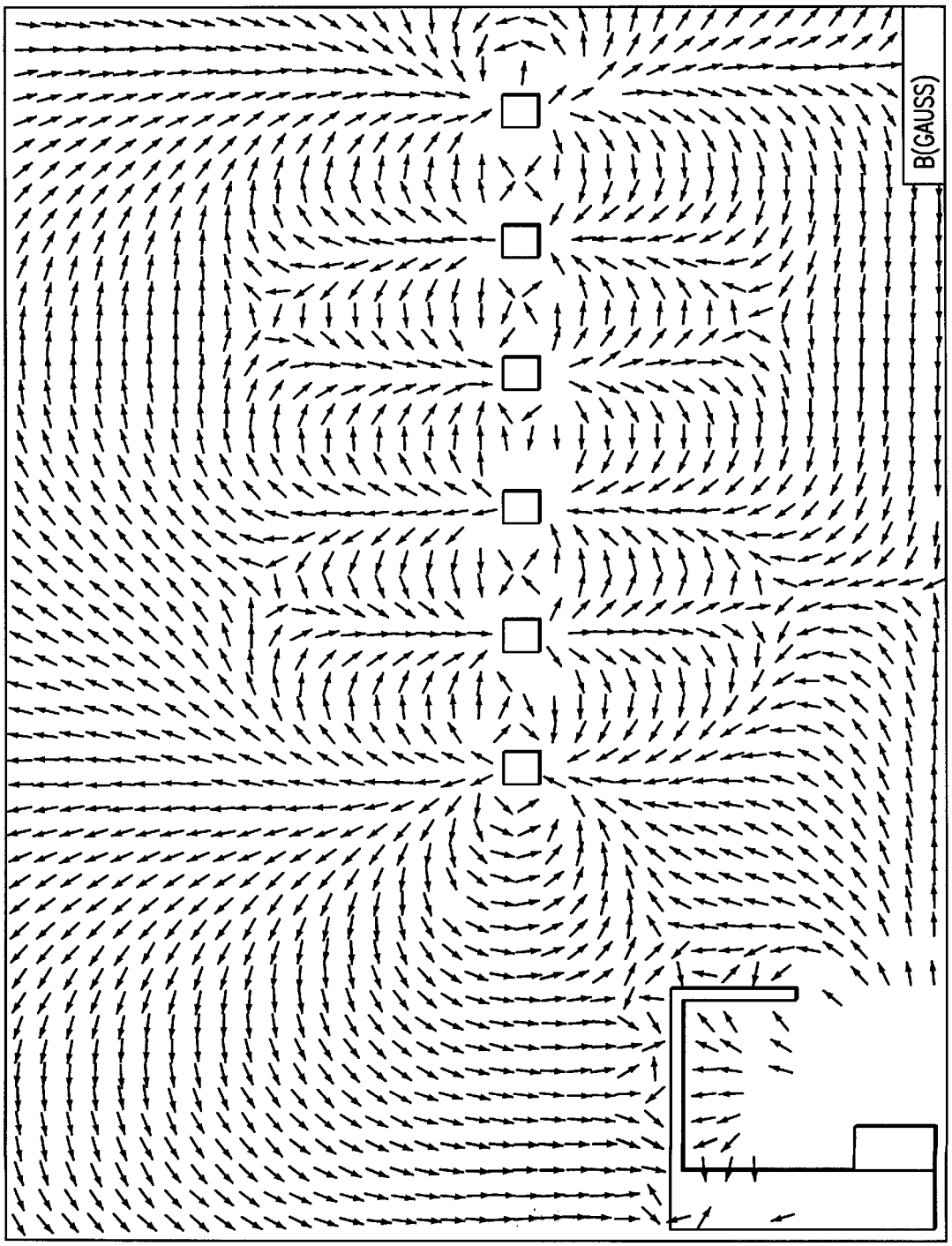
Figure 22:
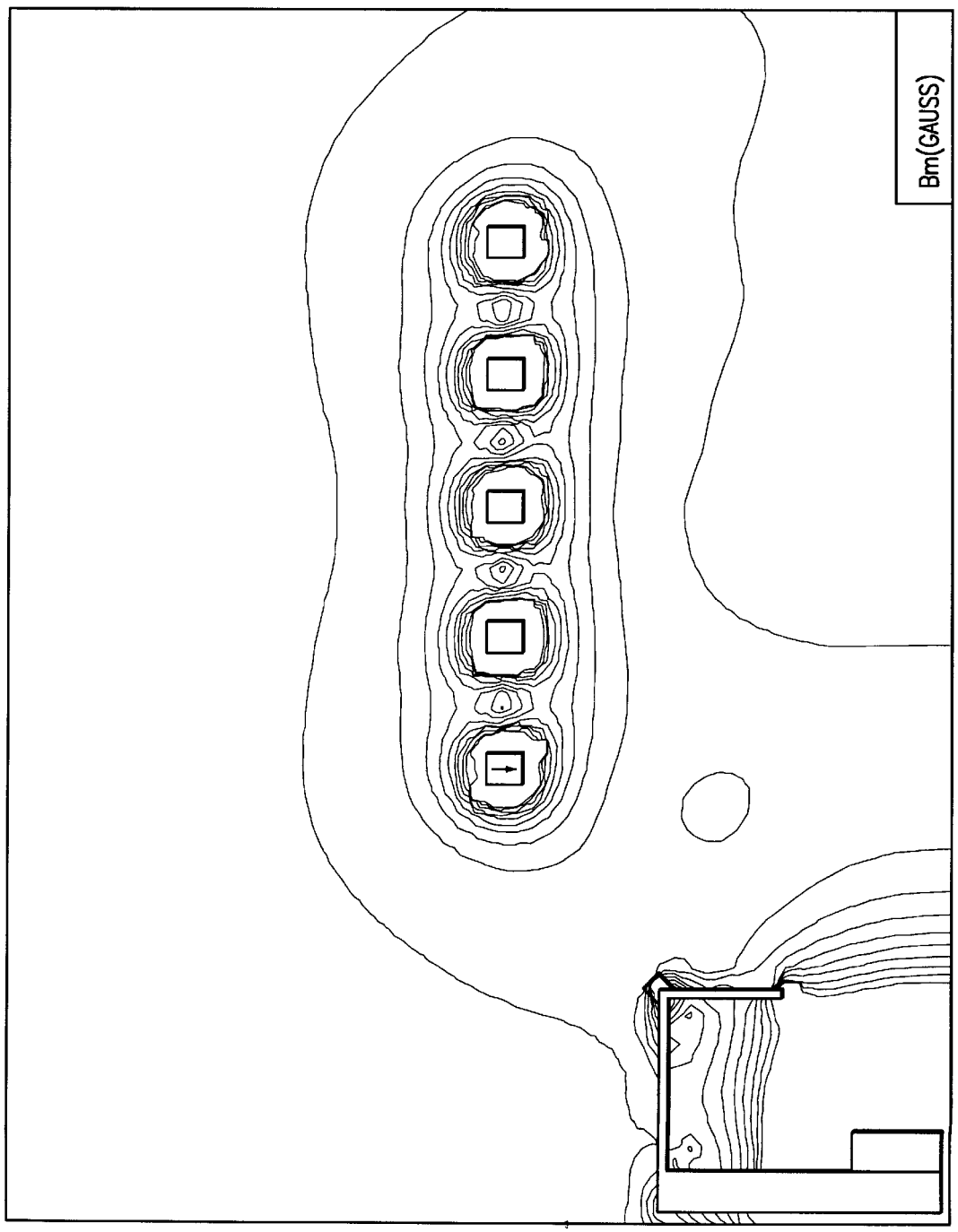
Figure 23:
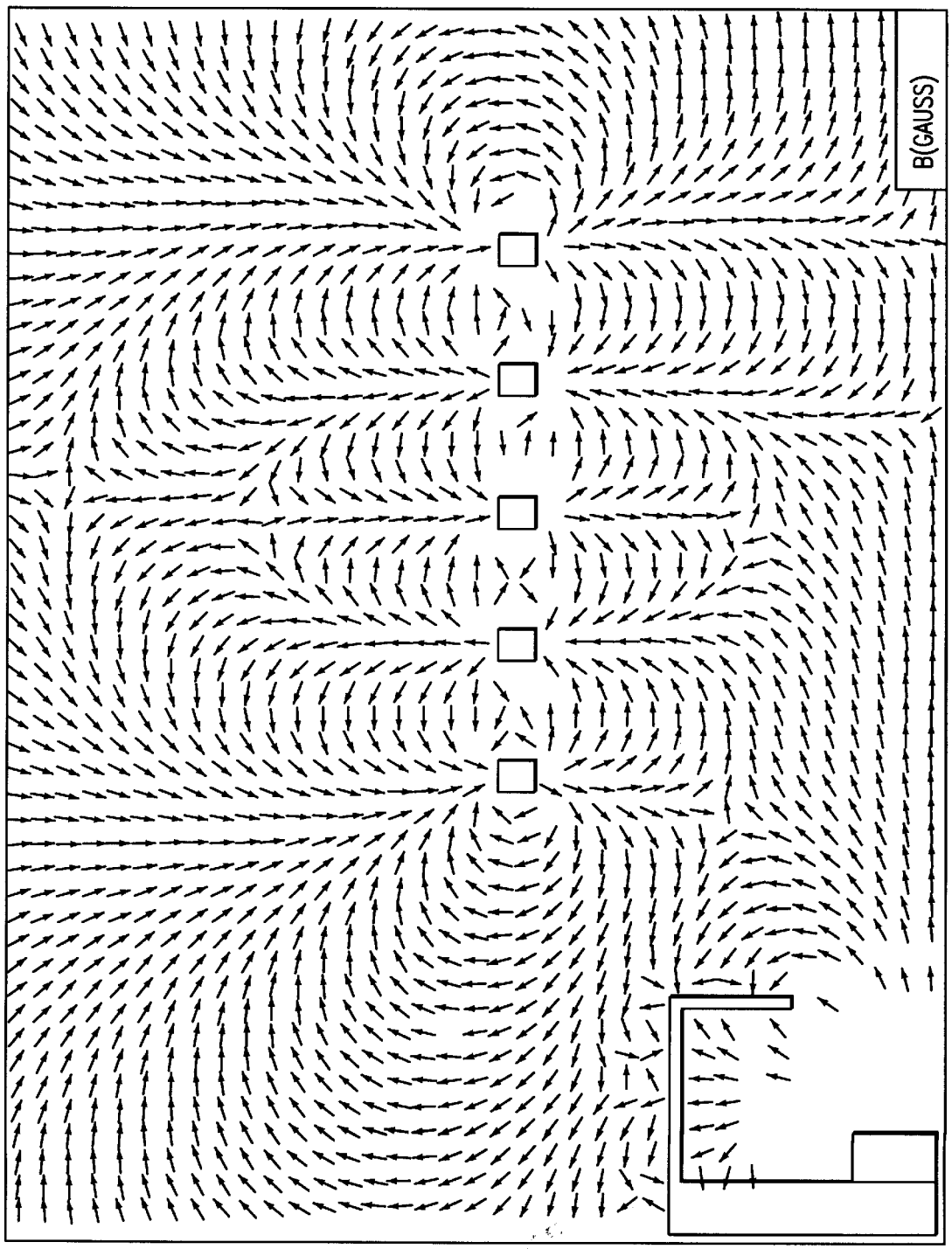
Figure 70:
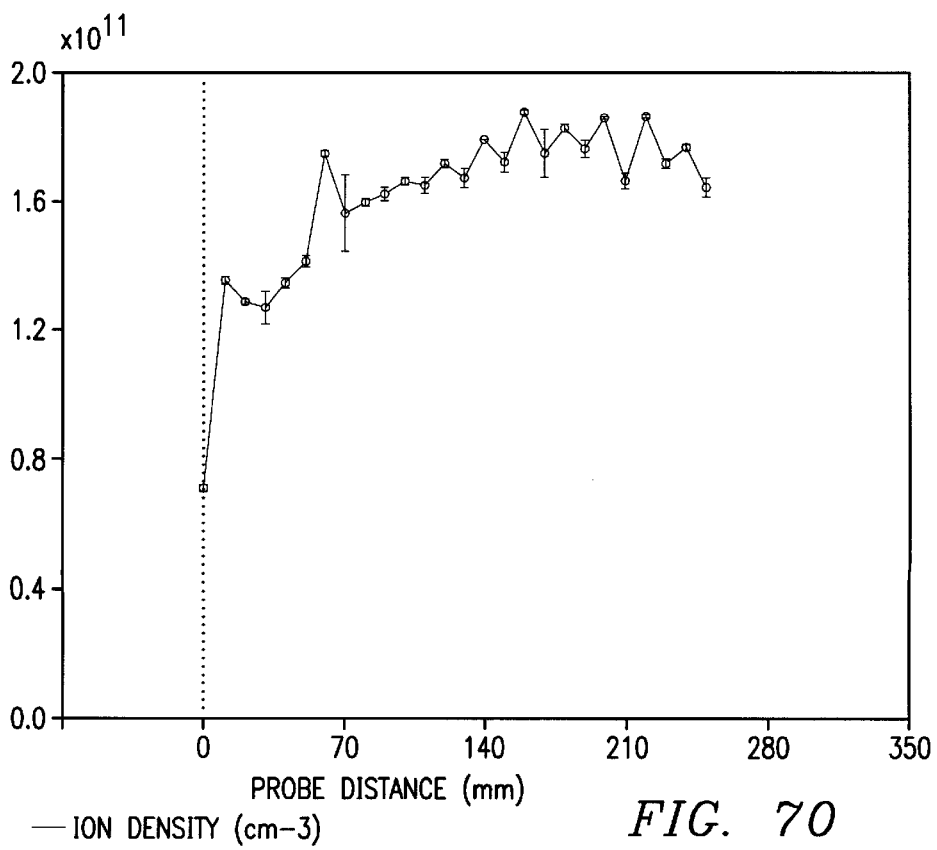

Nine confinement magnet configurations were evaluated. Probe measurements for each configuration were taken at 1, 3, 5, and 10 mTorr at 1000 W and 2000 W microwave power. It is important to note that the probe measurements are only valid to uniformity differences of approximately 2%–5%, and hence the complete optimization on this basis is not possible. Further, with plasmas of varying gas composition, the uniformity of process at the wafer may vary. Therefore, an optimization based on plasma extraction and uniformity manipulation for a particular plasma condition may be required. The results of these experiments are found in FIGS. 6–70. FIG. 5 depicts a table describing the results of various multiple magnet configurations that were modeled, with the plots of the modeled configuration depicted in FIGS. 6–29. FIG. 30 depicts a table of confinement magnet experiments along with ion density results with the plots of each experiment illustrated in FIGS. 31–70.

General questions about the optimum configuration included how many bands are required in array 250 and what is the best field alignment for top magnet band 252 as well as around slit valve 248. Field alignment of top magnet band 252 with respect to the ECR magnet course (the "sound magnet" in this embodiment) is thought to be important due to electron and consequently ion trajectories out of the plasma source along magnetic field lines. The idea is to use the top bank of magnets as an extraction ring by aligning this field with the field of the ECR magnet. This supposition is supported by the fact that an otherwise equivalent configuration gives ion densities 27% higher on average with field 260 of top band 252 aligned rather than anti-aligned with the ECR magnetic field. No change in uniformity was observed due to top band field alignment.

The required number of confinement bands in array 250 was questioned due to end effects observed in magnetic modeling. Modeling the 5 band configuration illustrated in FIG. 2 showed an end effect field contour to be present in chuck 212 region. The magnitude of this field was relatively low, less than 50 G; consequently, the importance of this end effect was uncertain. Adding a $6^{th}$ band at the bottom of the chamber moves this end effect down, out of chuck 212 region. The effect of 5 versus 6 bands was evaluated based on uniformity and ion density. Probe measurements did not show any significant difference between 5 and 6 bands with respect to these measured values.

Field alignment of the magnet pair consisting of the bands above 254 and below 256 the slit valve 248 (consequently above and below the plane of the chuck 212) is of interest because of the effect on magnetic field at the chuck 212. One configuration of interest aligns the magnetic field of these two bands 254 and 256. This causes a node in the magnetic field in the lane of the chuck 212. This could be desirable, as a magnetic field free region around the chuck 212 should increase ion diffusion. The drawback to this configuration is that it creates a high magnetic field intensity region (~300G) midway between the two magnets 254 and 256, physically located in the slit valve 248 throat. This field strength is undesirable for many data storage materials. The alternate configuration is to anti-align the fields of these two magnet bands 254 and 256. Probe measurements showed improved uniformity as well as higher ion density of the anti-aligned case.

Band spacing of 7.5 inches around slit valve 248 was evaluated only for one configuration; top band 252 anti-aligned with ECR magnet and magnets above 254 and below 256 slit valve 248 aligned. Uniformity was seen to be improved at the 7.5 inch spacing for this configuration, however, it was still worse than for other configurations. The ion density profile was also observed to go from hollow at 4-inch spacing to much less hollow or non-hollow at spacing equal 7.5 inches. This effect could be an important too for adjusting process uniformity in cases where other factors such as wall loss cause an inverse effect. The precision required and appropriate feedback mechanisms necessary to utilize this effect are difficult to establish, consequently this configuration is less than ideal.

A series of probe measurements was taken using $CF_4$, rather than Ar for top band 252 aligned, chuck bands 254 and 256 anti-aligned configuration. In general, ion density was found to be lower and uniformity worse. Uniformity observations, namely decrease towards the walls of the chamber, correlates with experimental results for $CF_4$.

Figure 71:
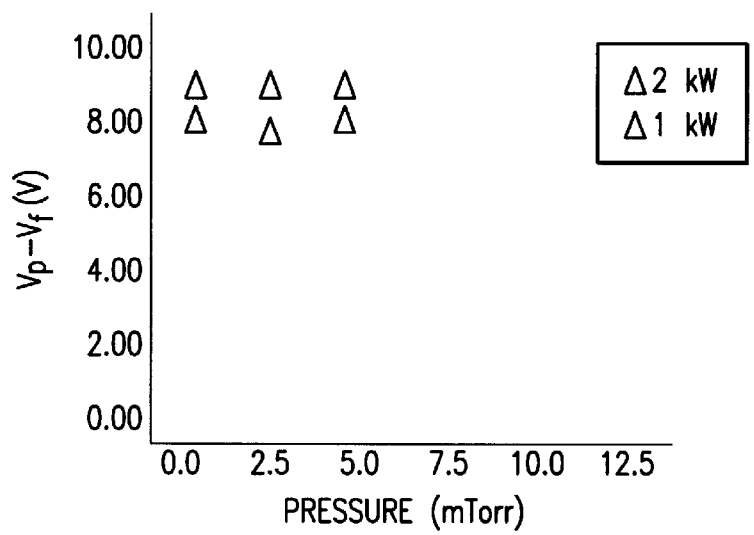
FIG. 71 depicts a graph of plasma potential as a function of pressure for 1000W and 2000W microwave power.
Figure 72:
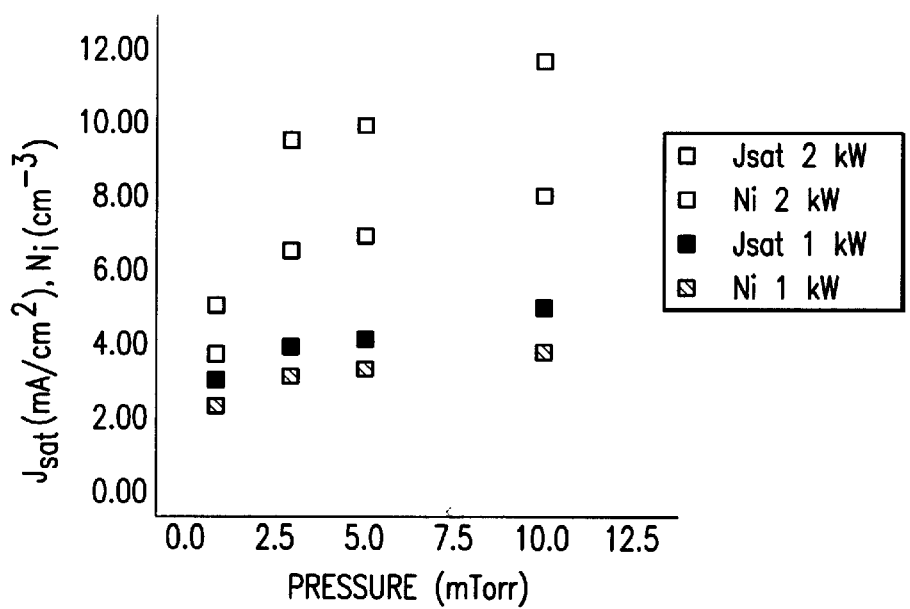
FIG. 72 depicts a graph showing saturation ion current as a function of pressure for both 1000W and 2000W microwave power.

Plasma parameters other than just ion density were extracted from the Langmuir probe results. The plasma potential as a function of pressure for 1000 W and 2000 W microwave power is depicted in FIG. 71. Plasma potential is an important parameter, as growth of desirable films of some materials such as $SiN_x$ requires that the plasma potential fall within a given range or below some maximum value. Saturation ion current as a function of pressure for both 1000 W and 2000 W microwave power is depicted in FIG. 72.

Figure 24:
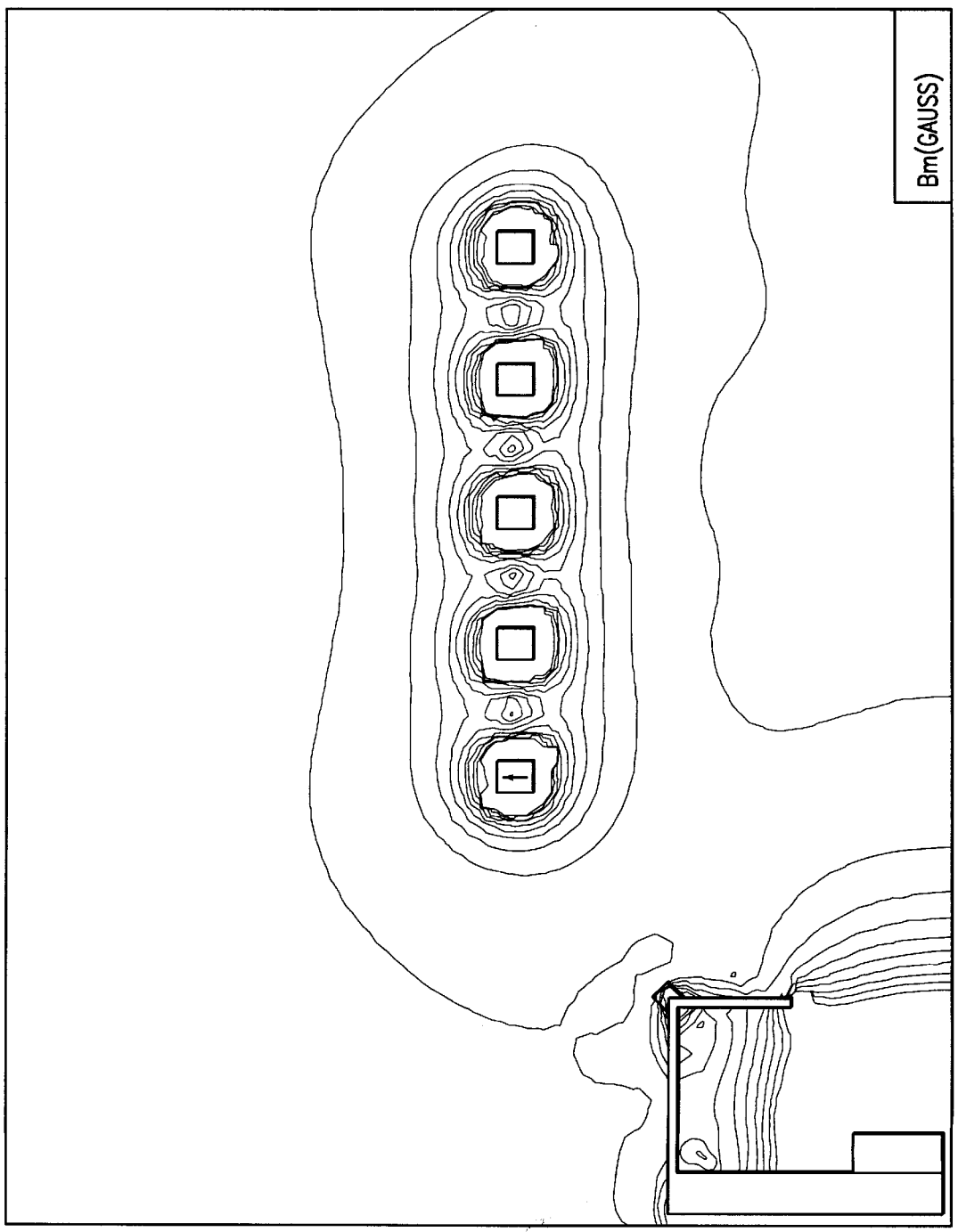
Figure 25:
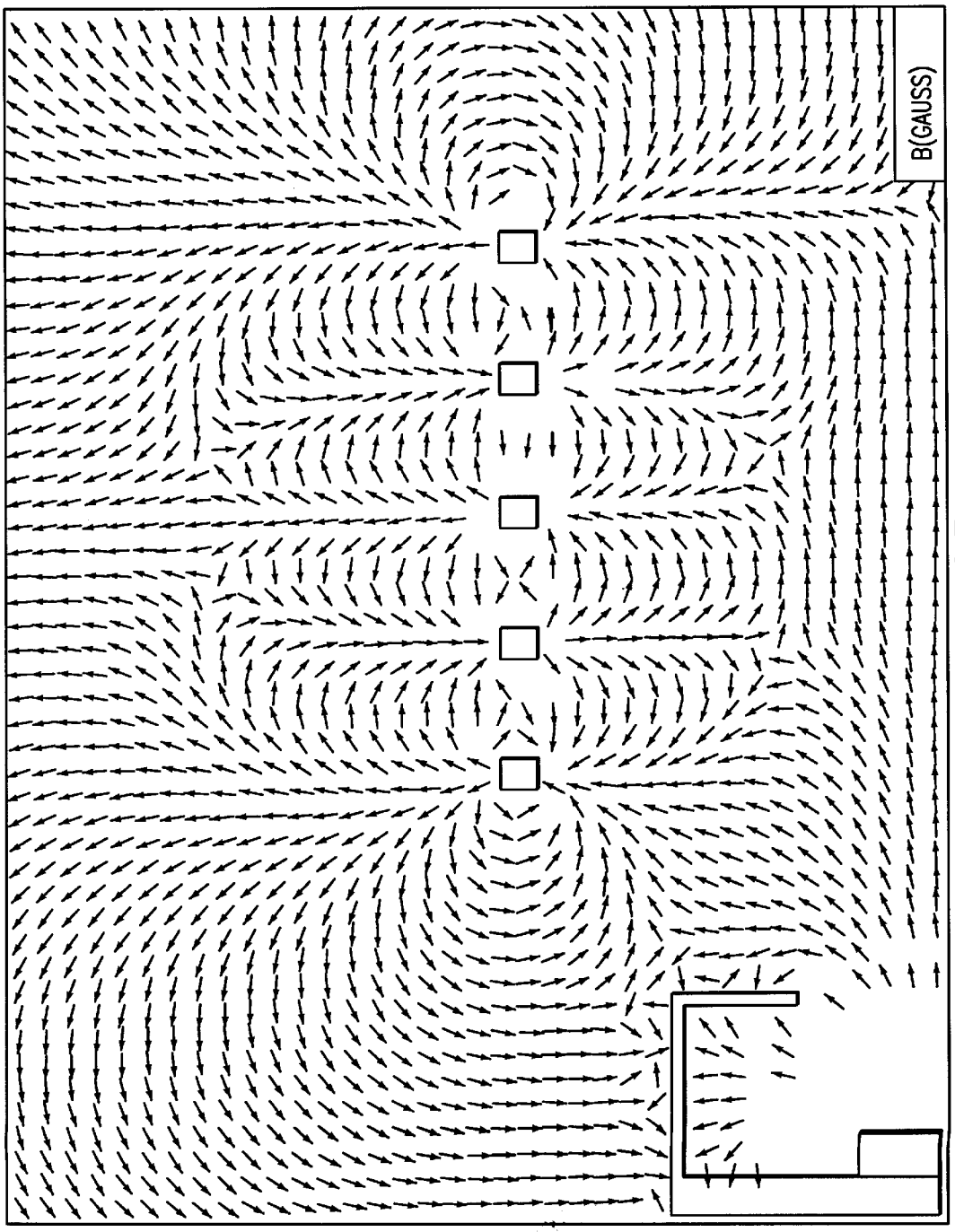
Figure 26:
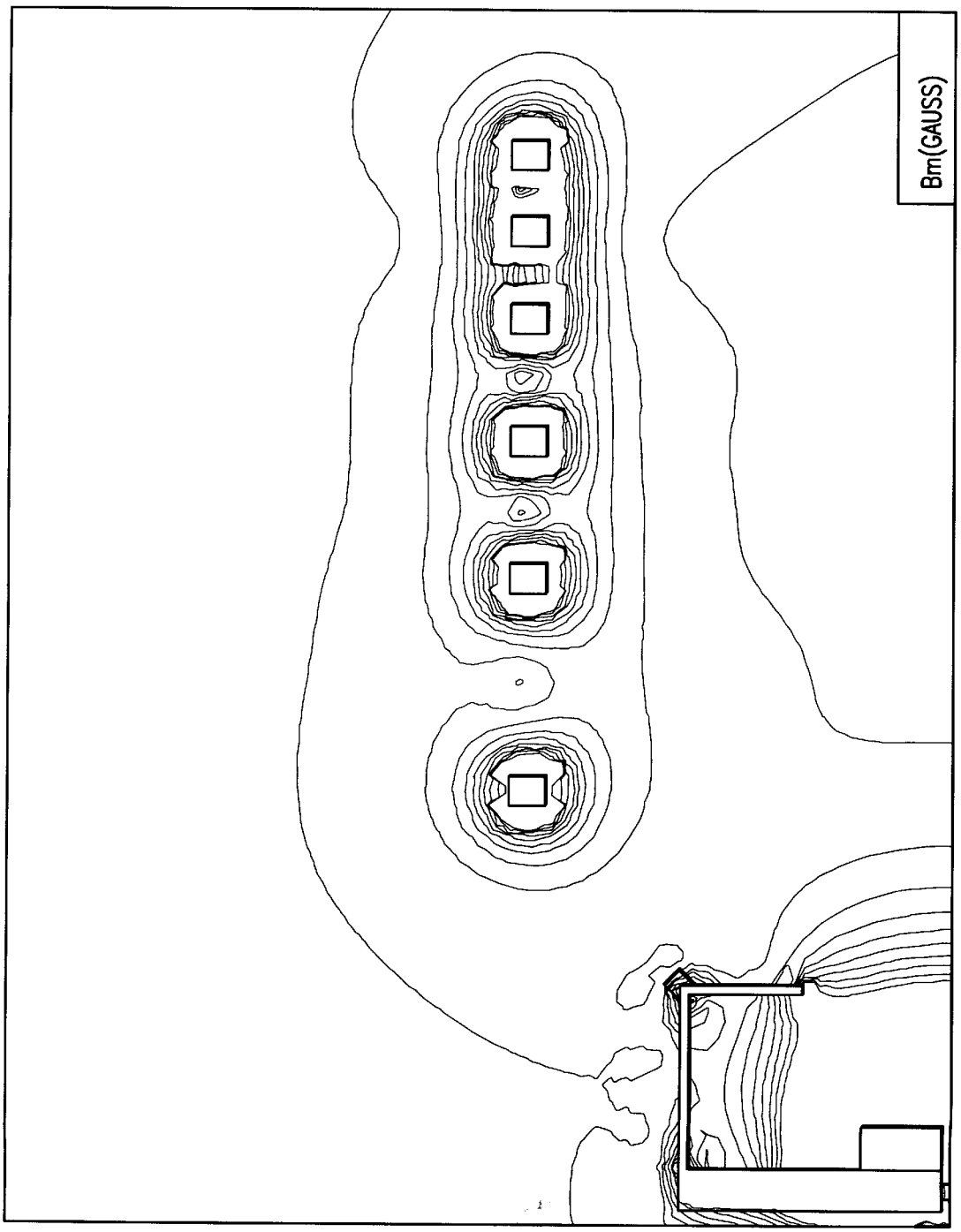
Figure 27:
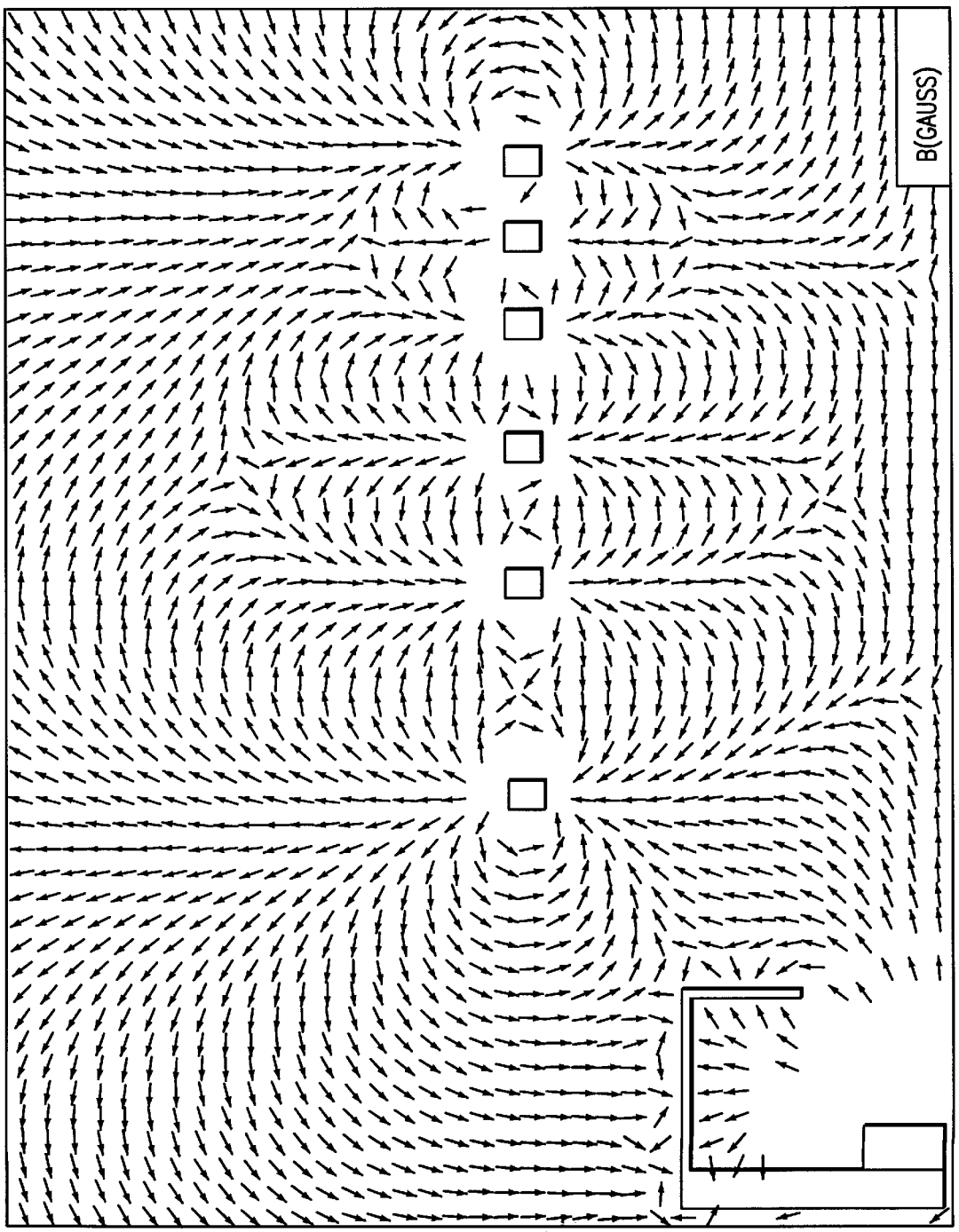
Figure 28:
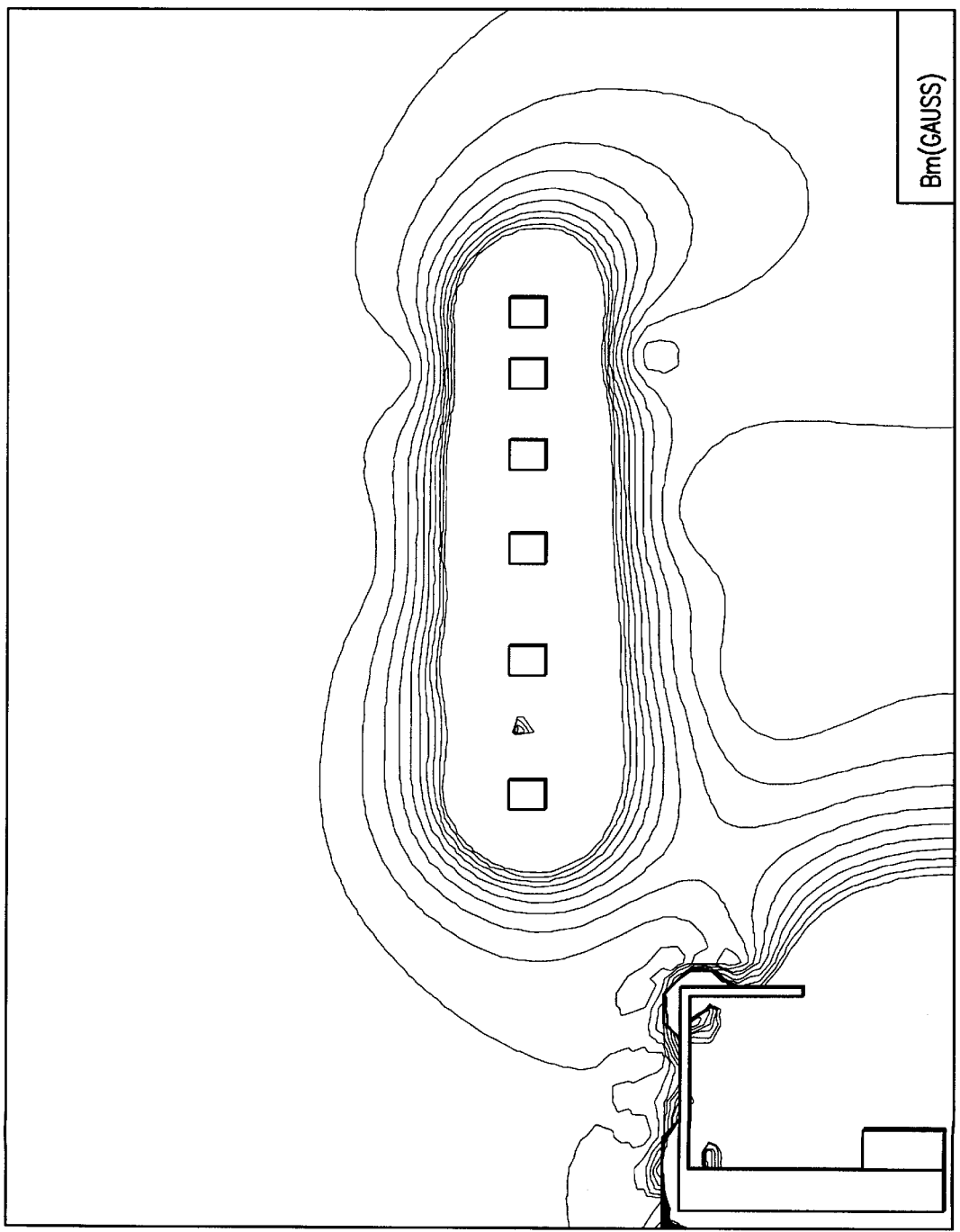
Figure 29:
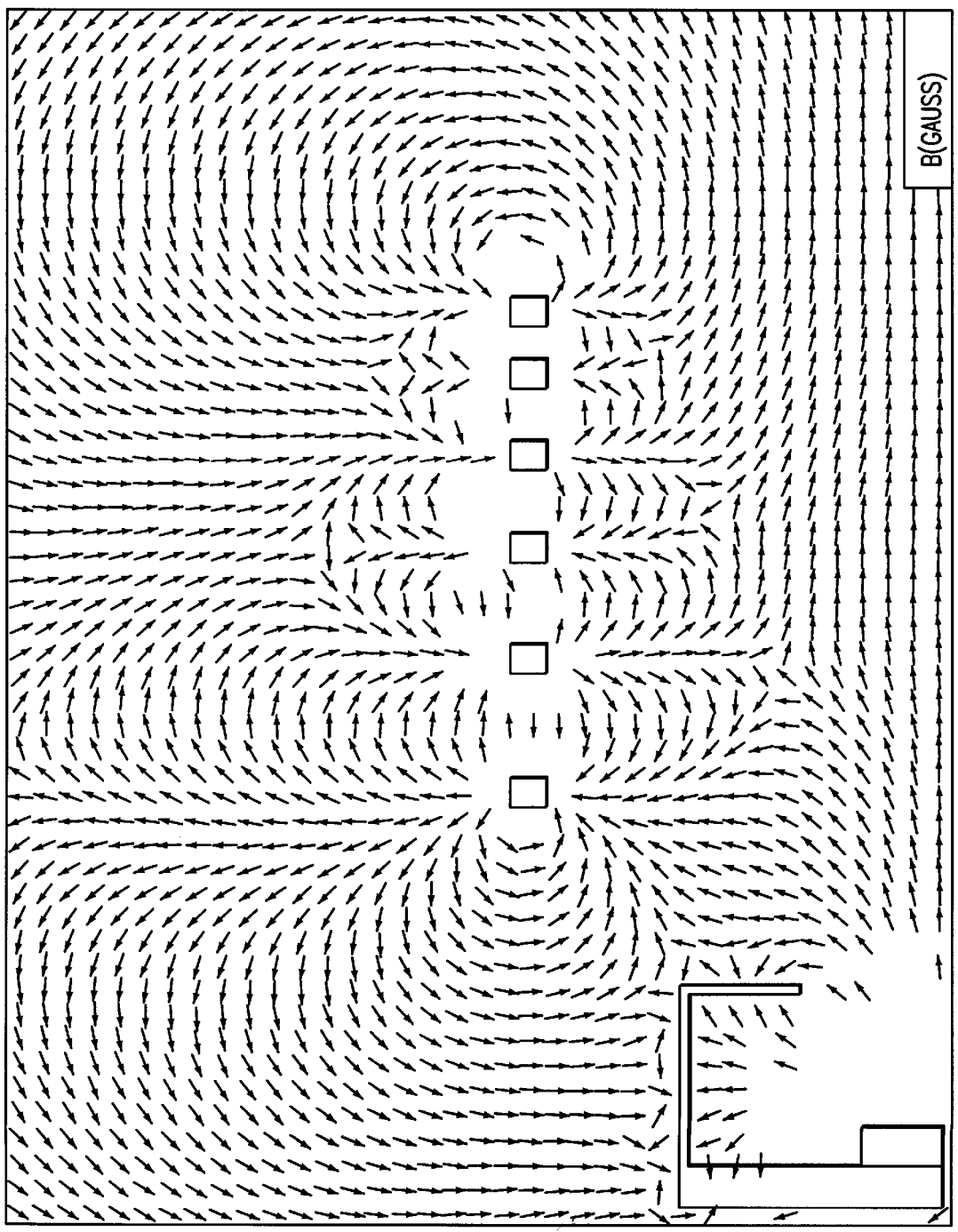
Figure 32:
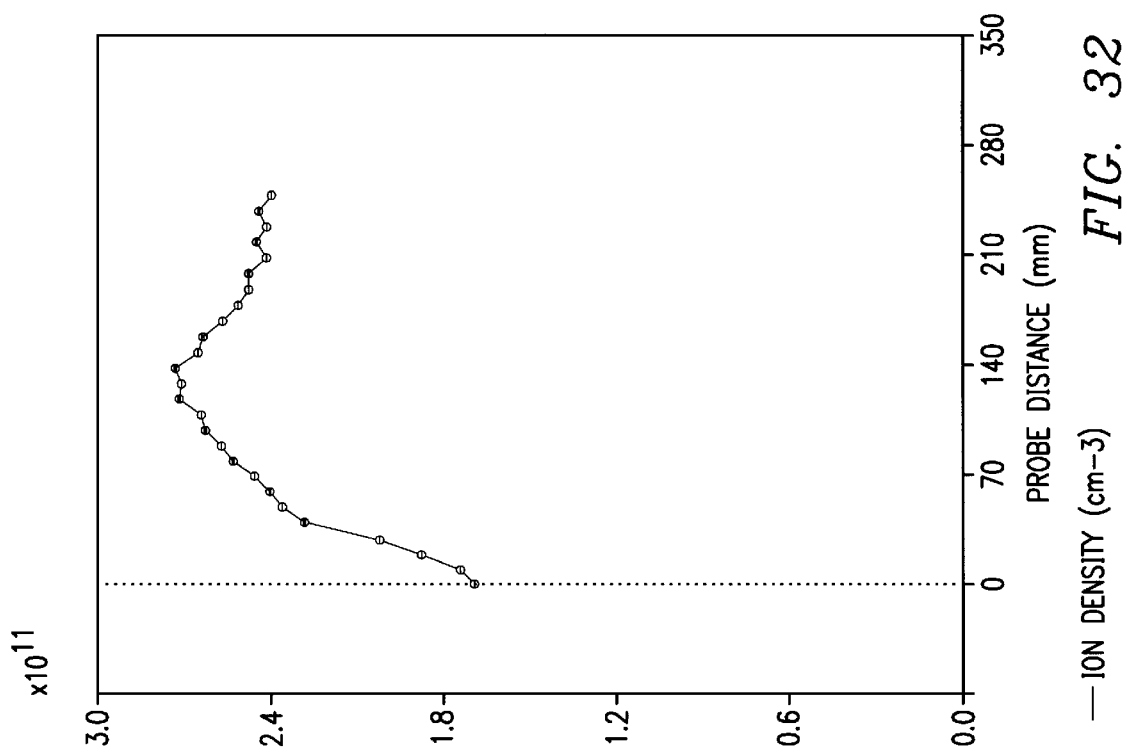
Figure 31:
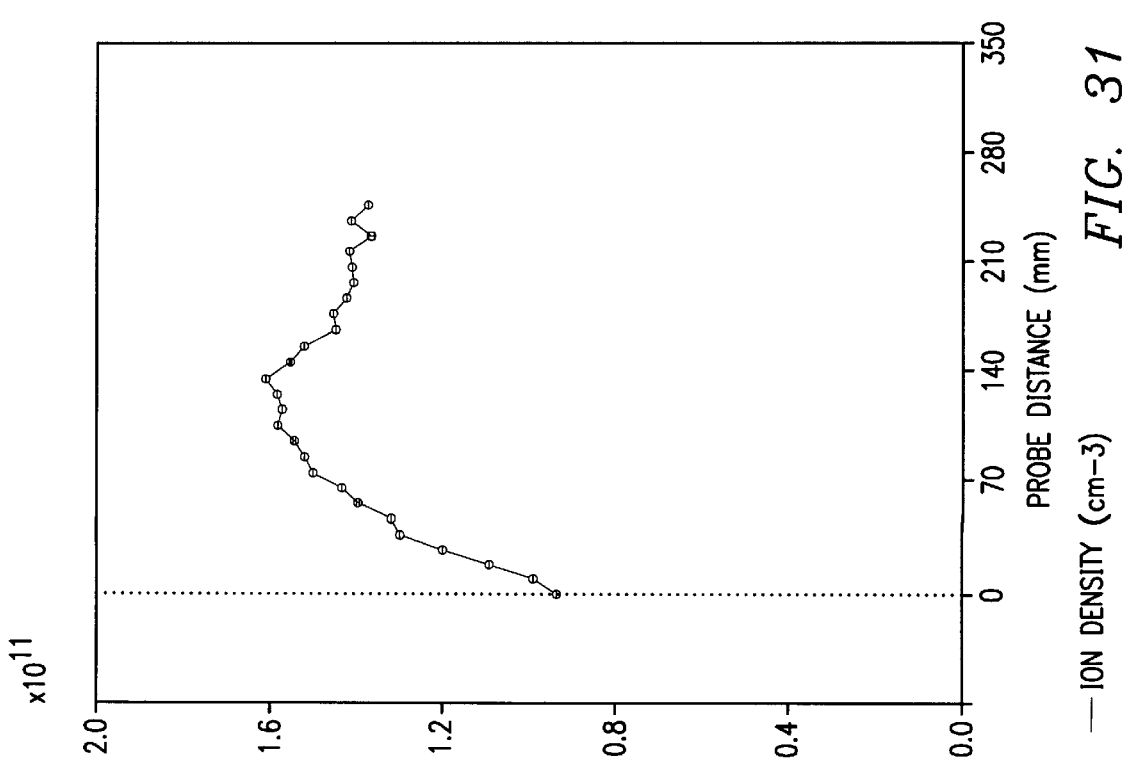
Figure 34:
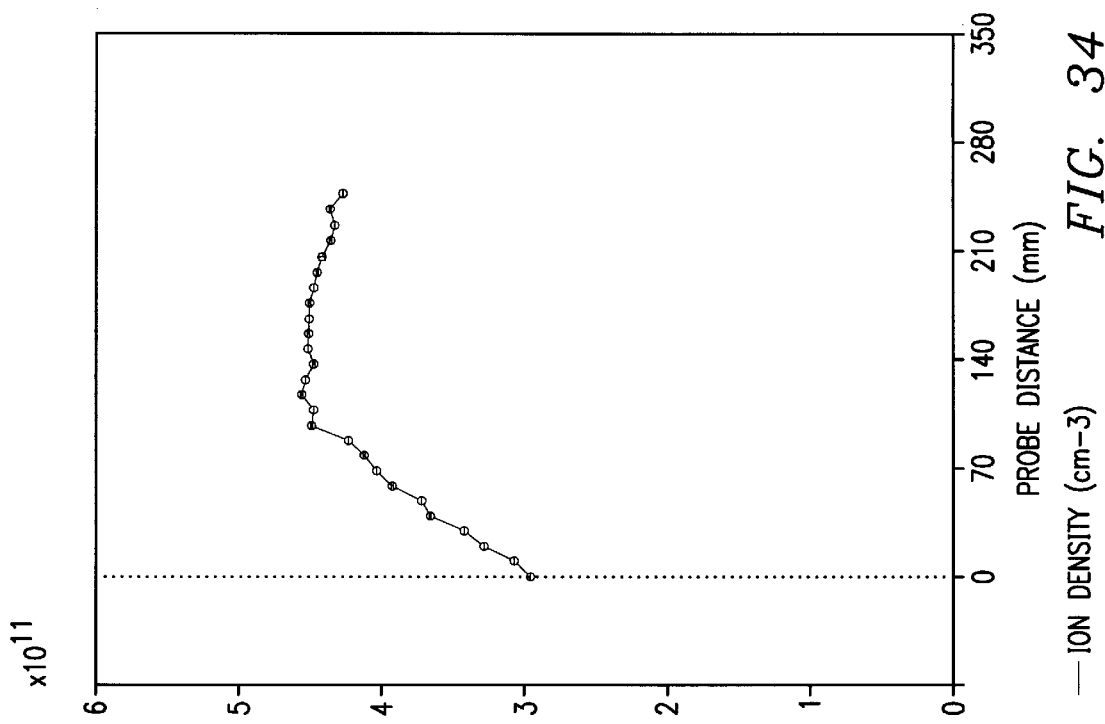
Figure 33:
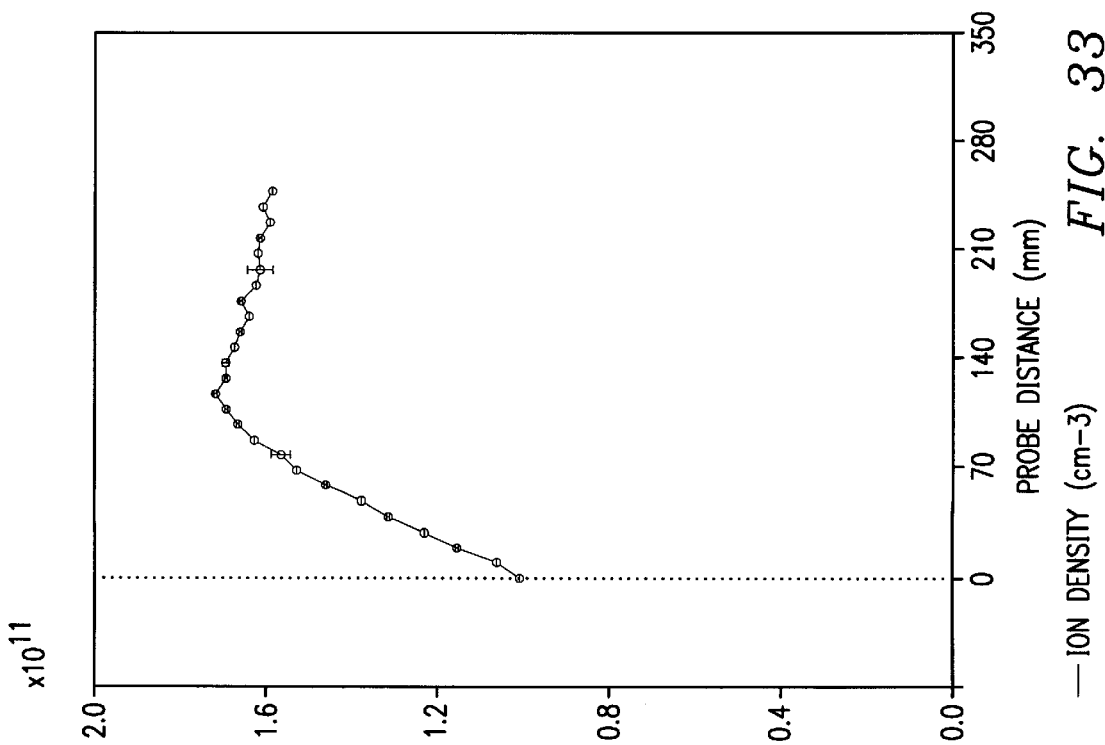
Figure 36:
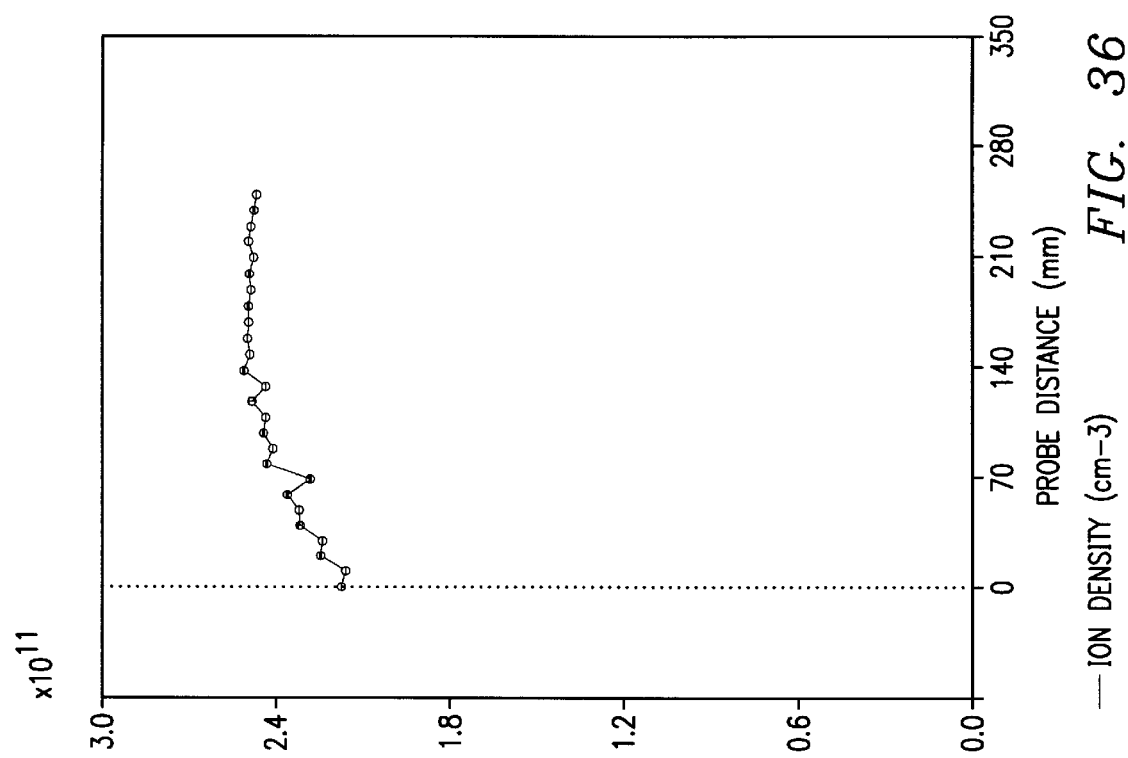
Figure 35:
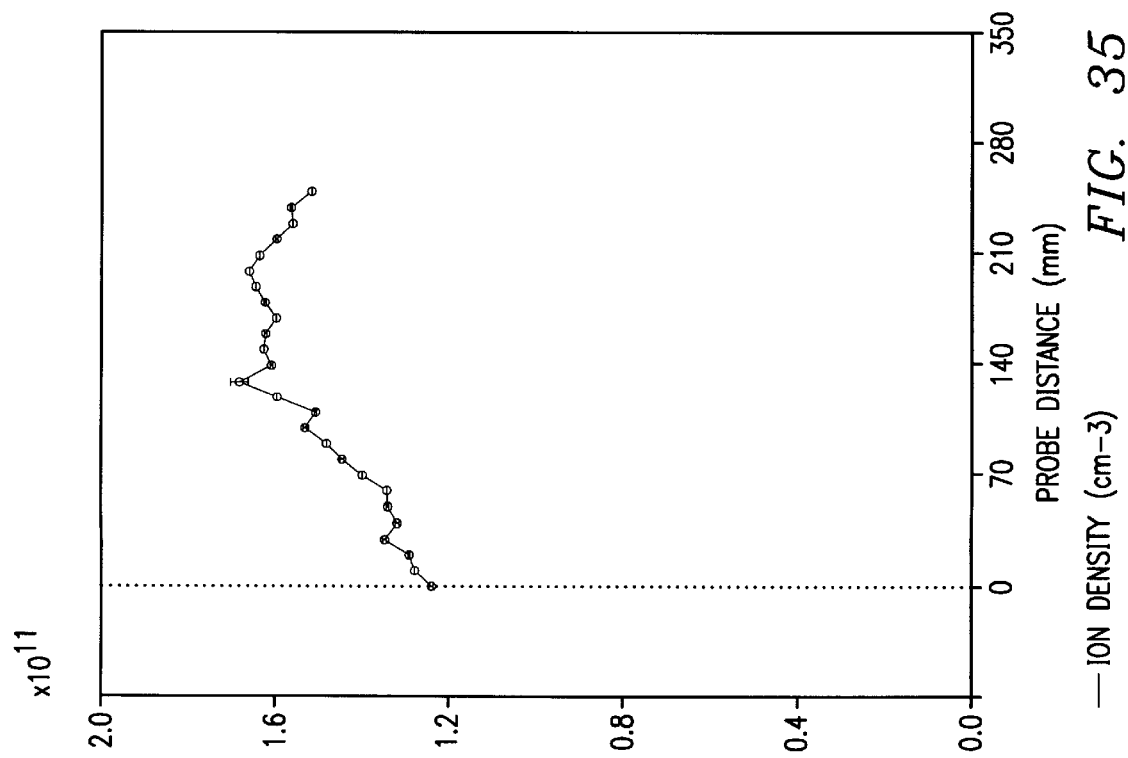
Figure 38:
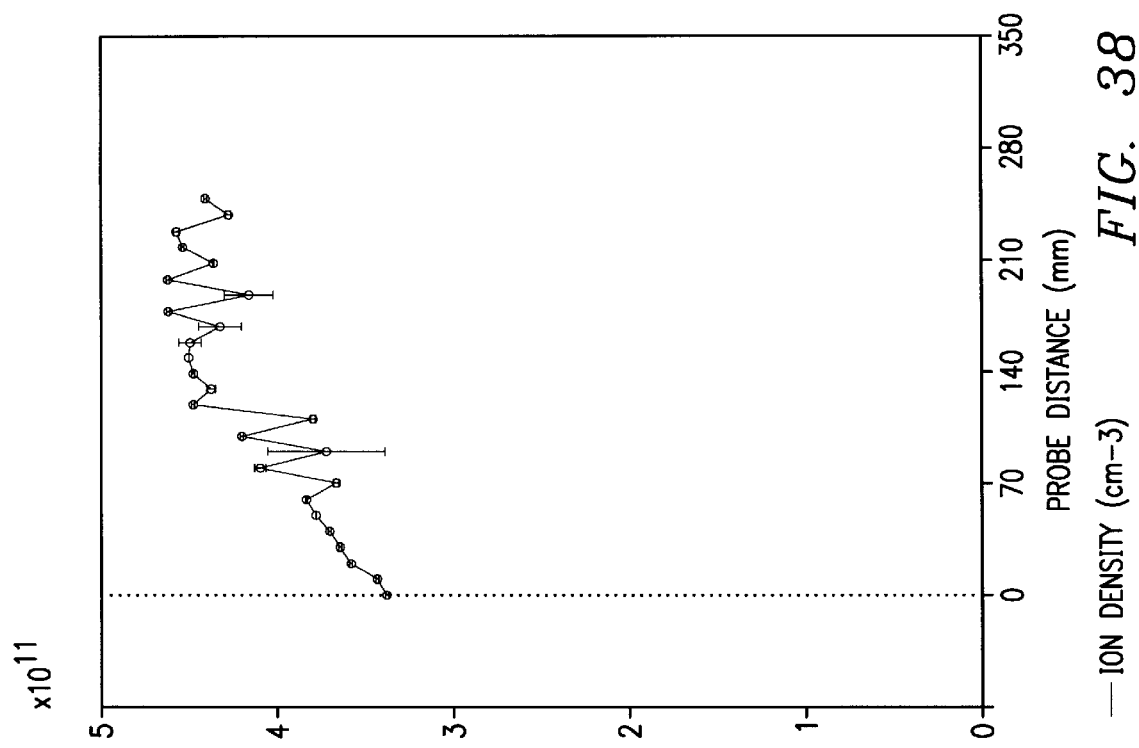
Figure 37:
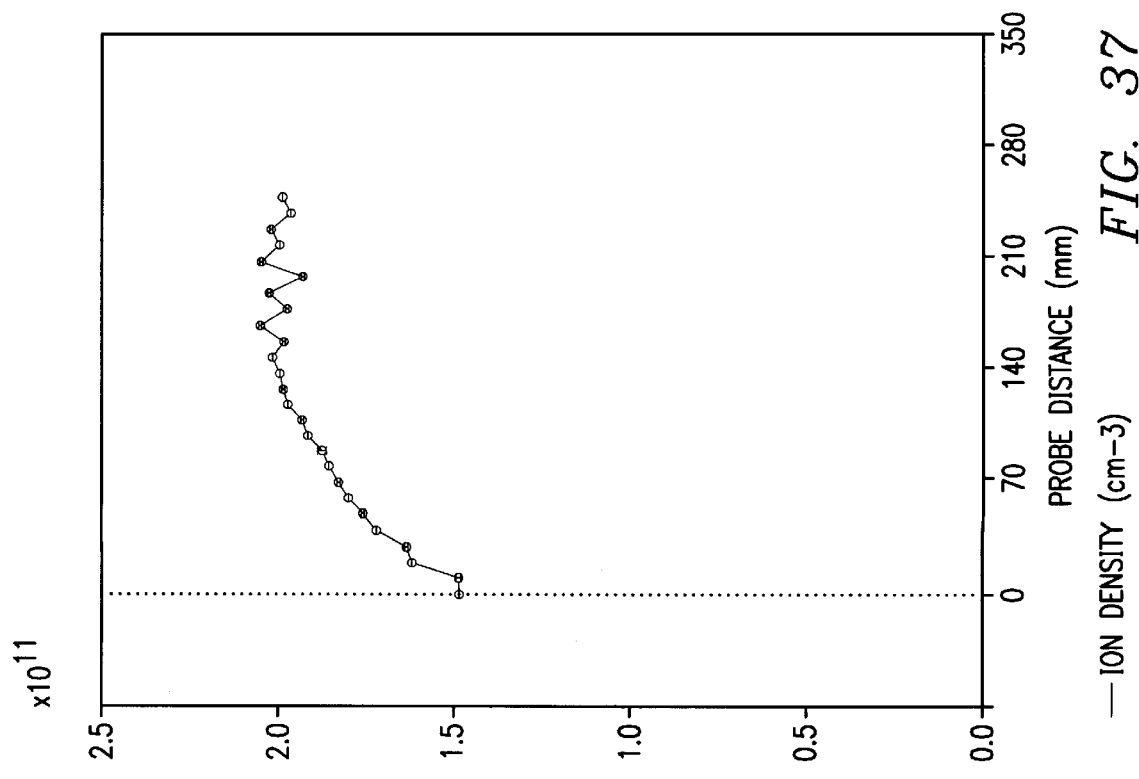
Figures 39, 40:
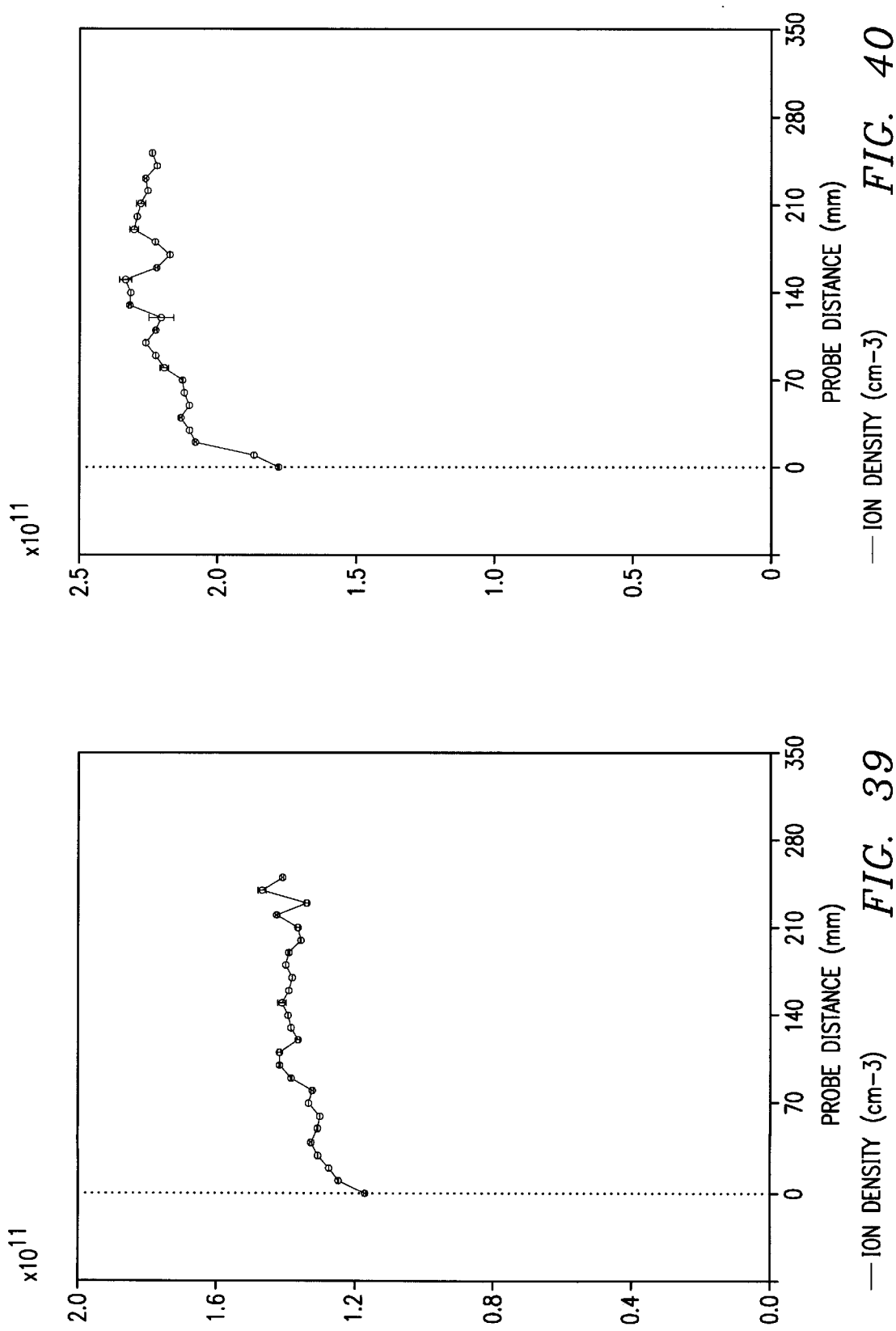
Figures 43, 44:
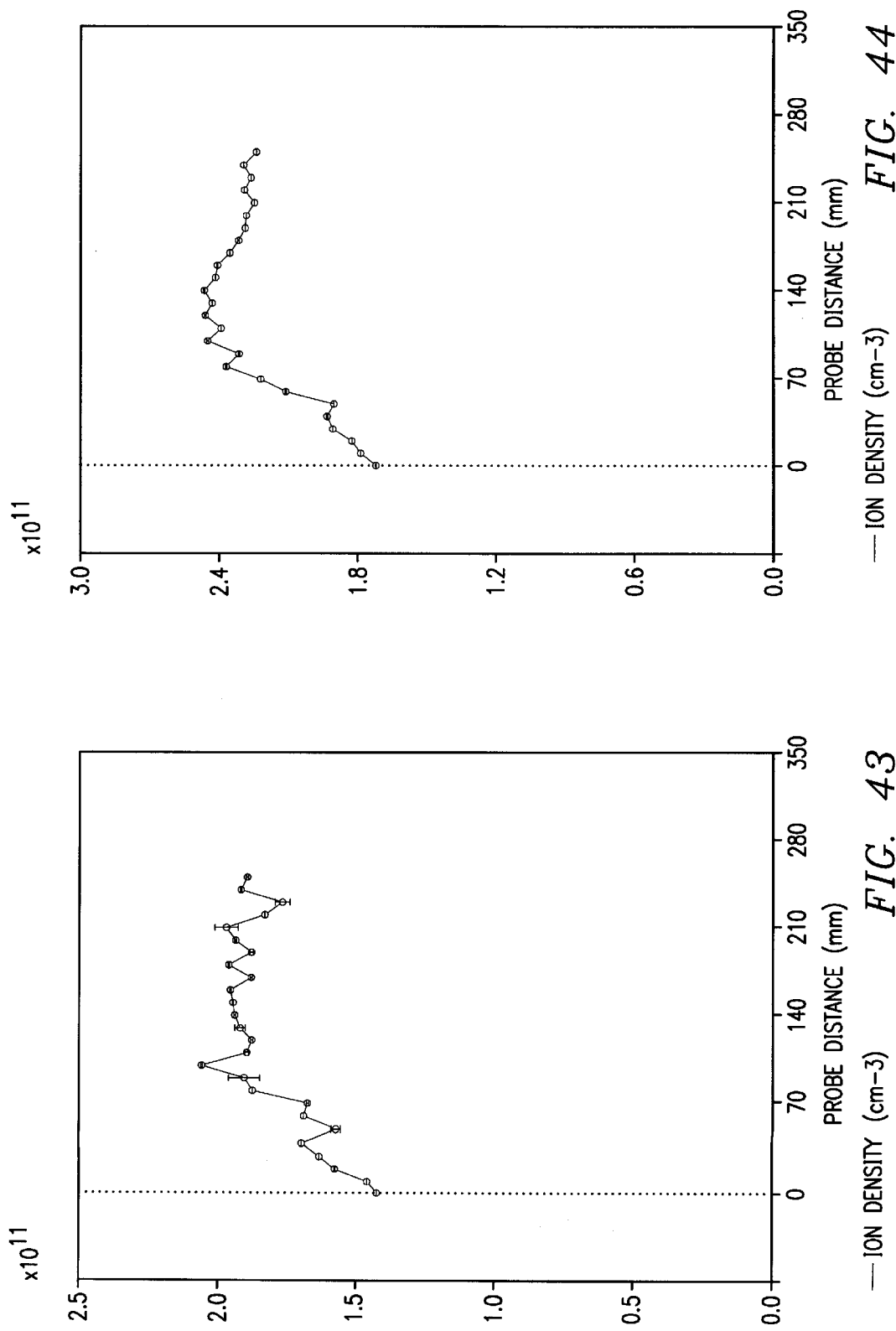
Figure 46:
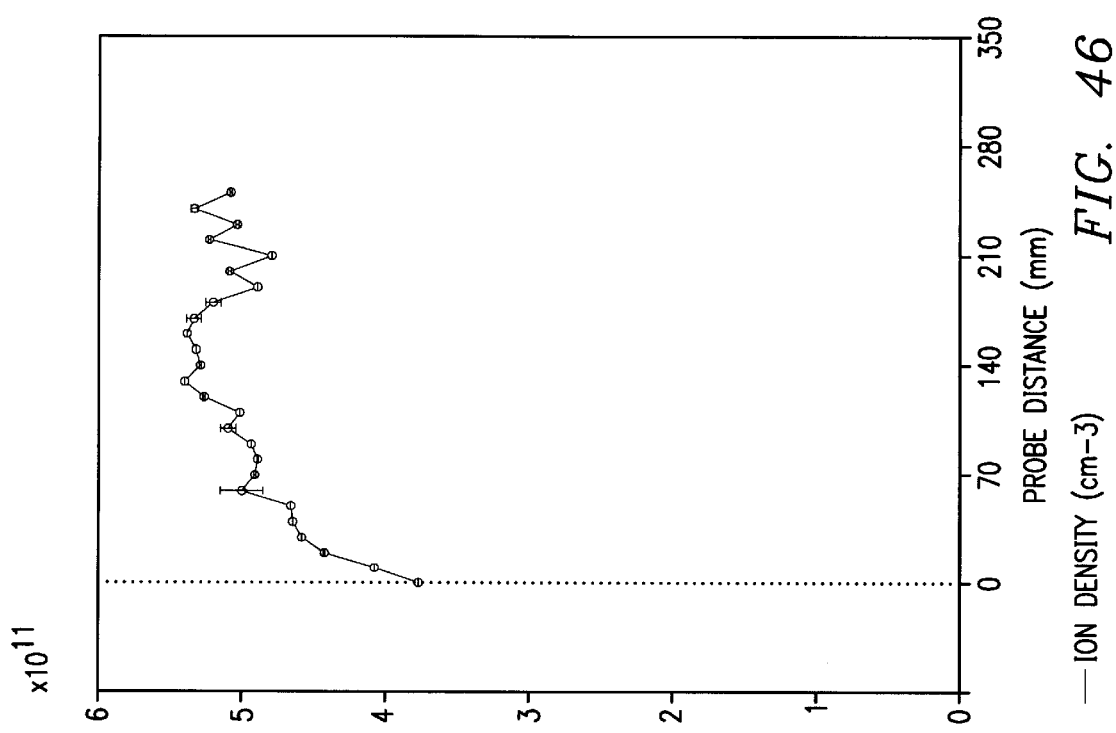
Figure 45:
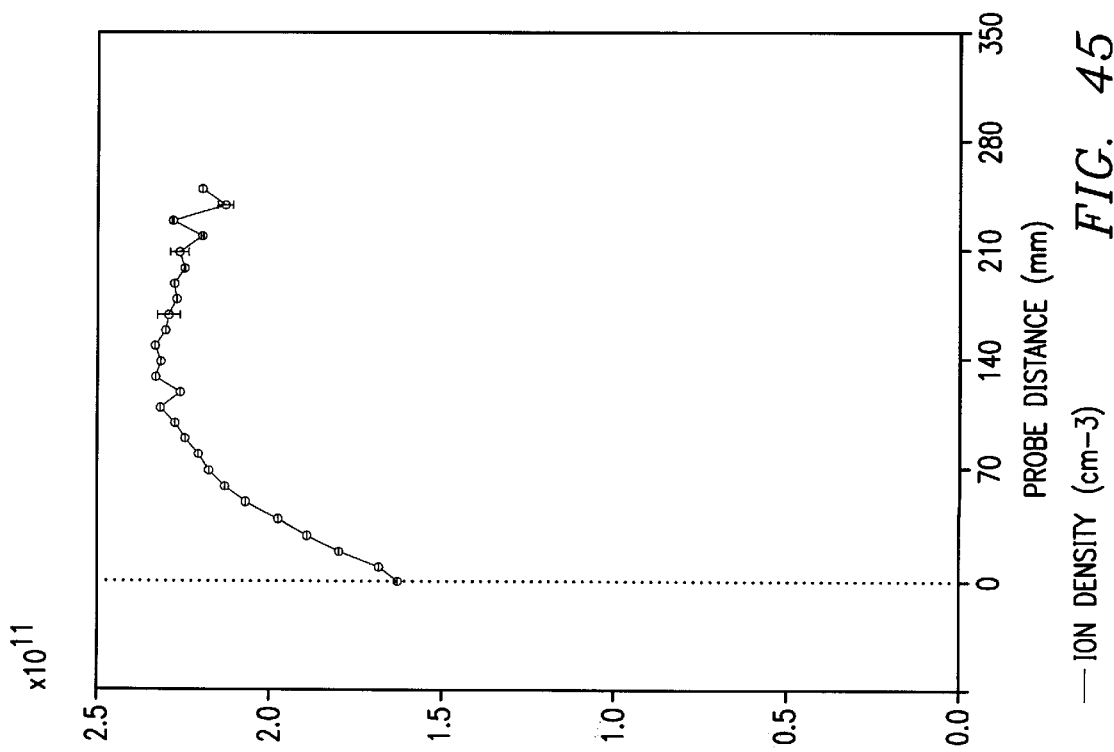
Figure 50:
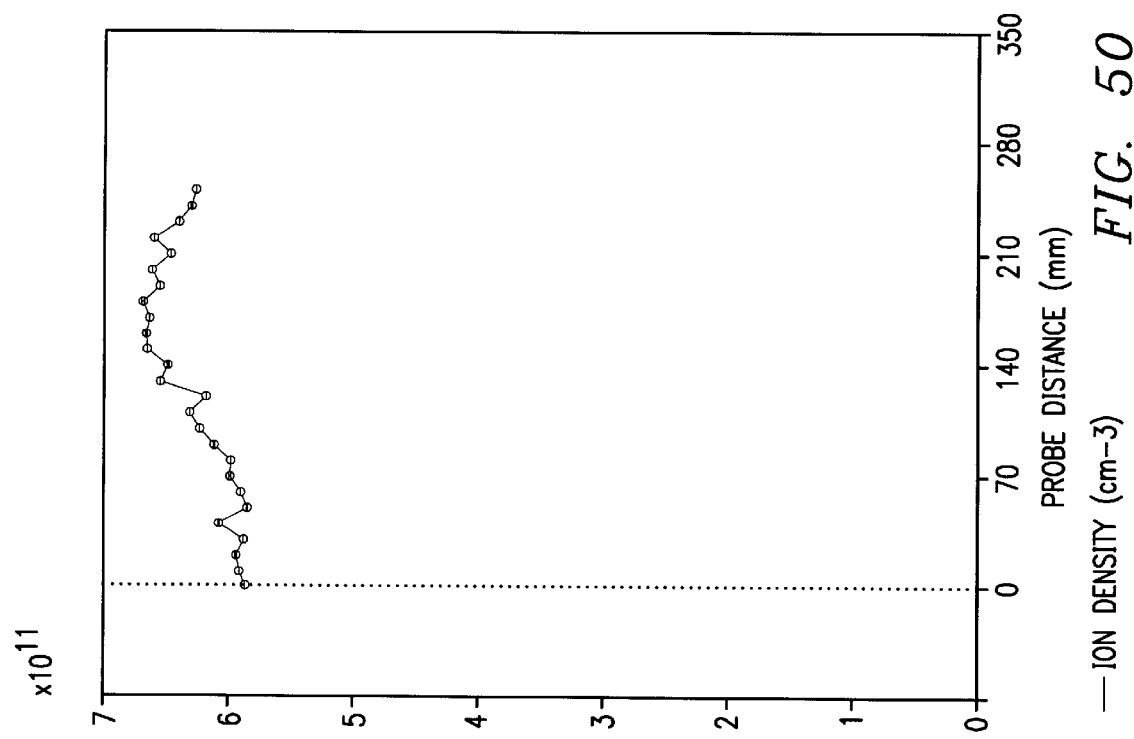
Figure 49:
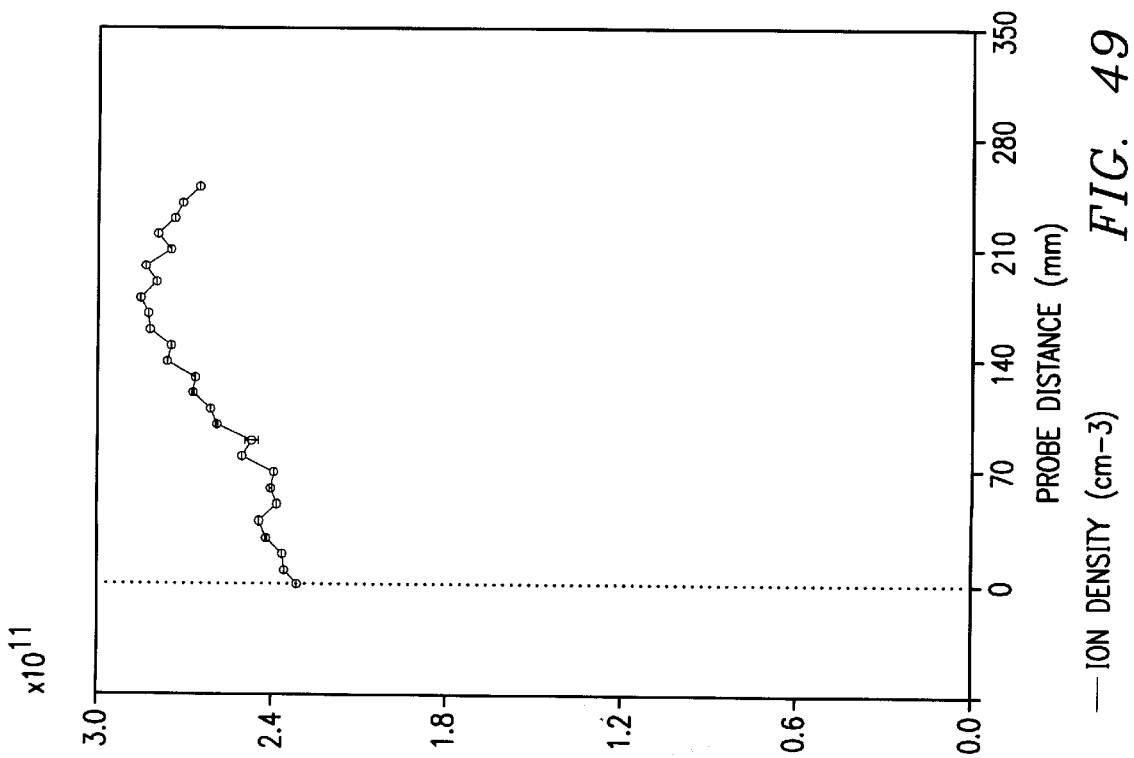
Figure 52:
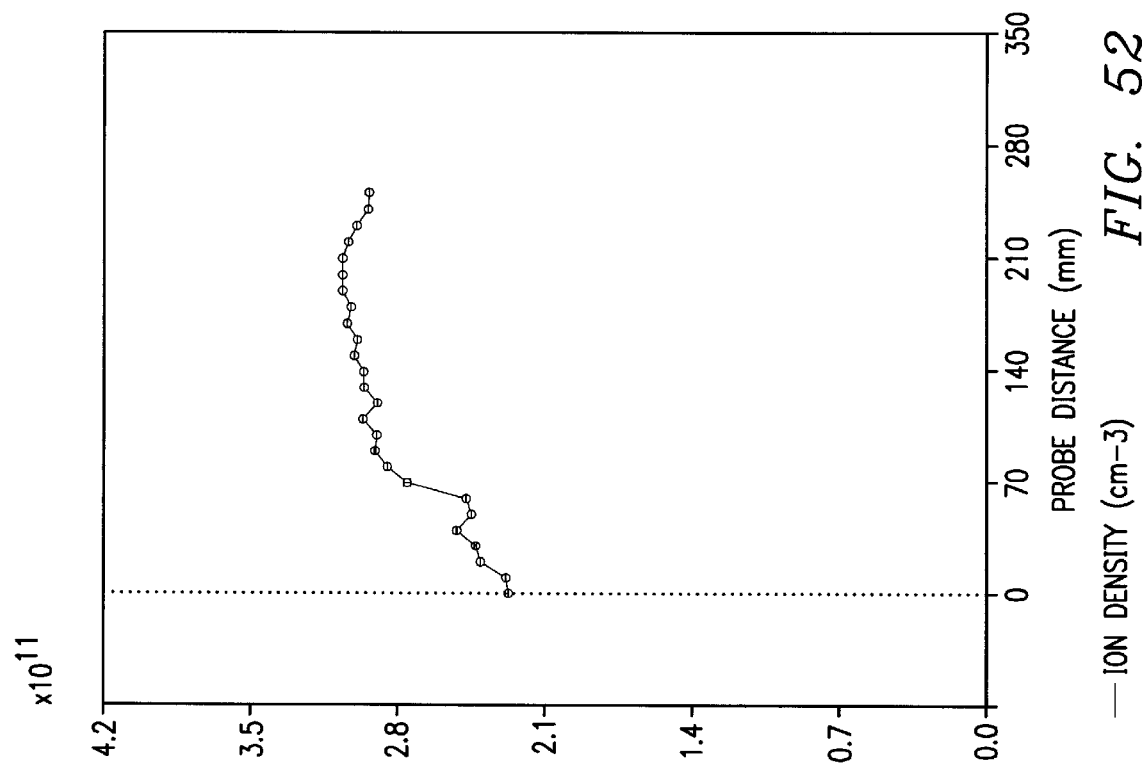
Figure 51:
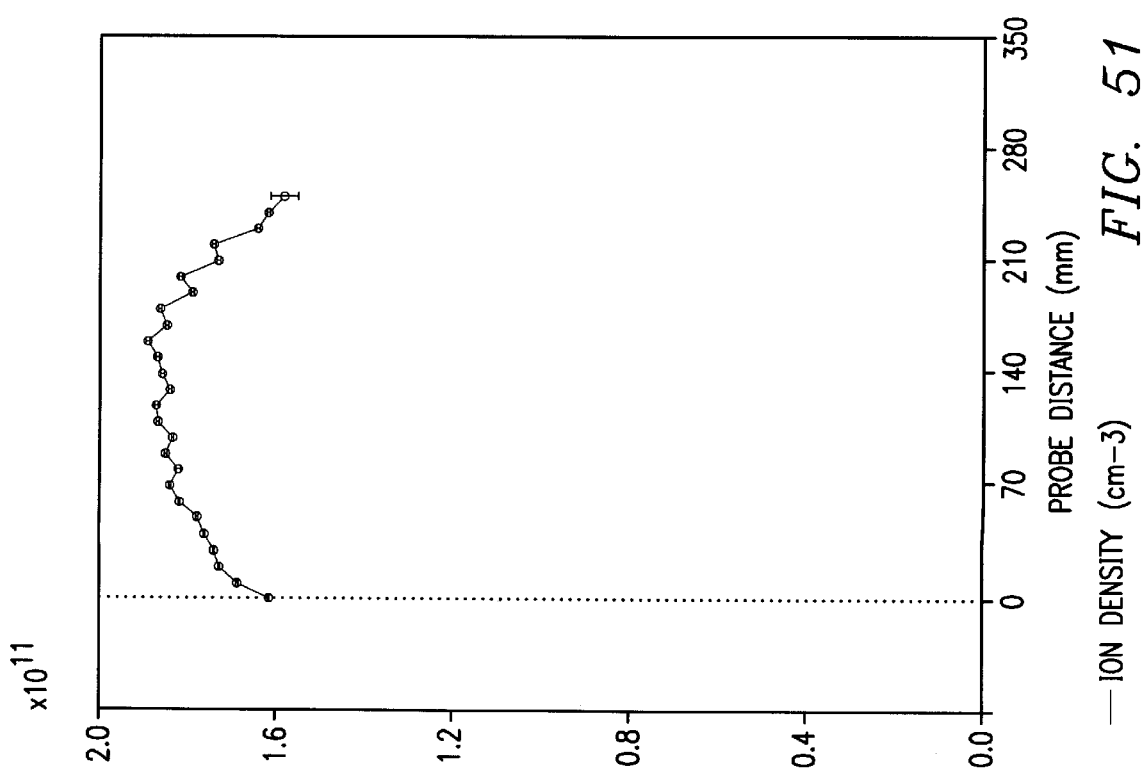
Figure 54:
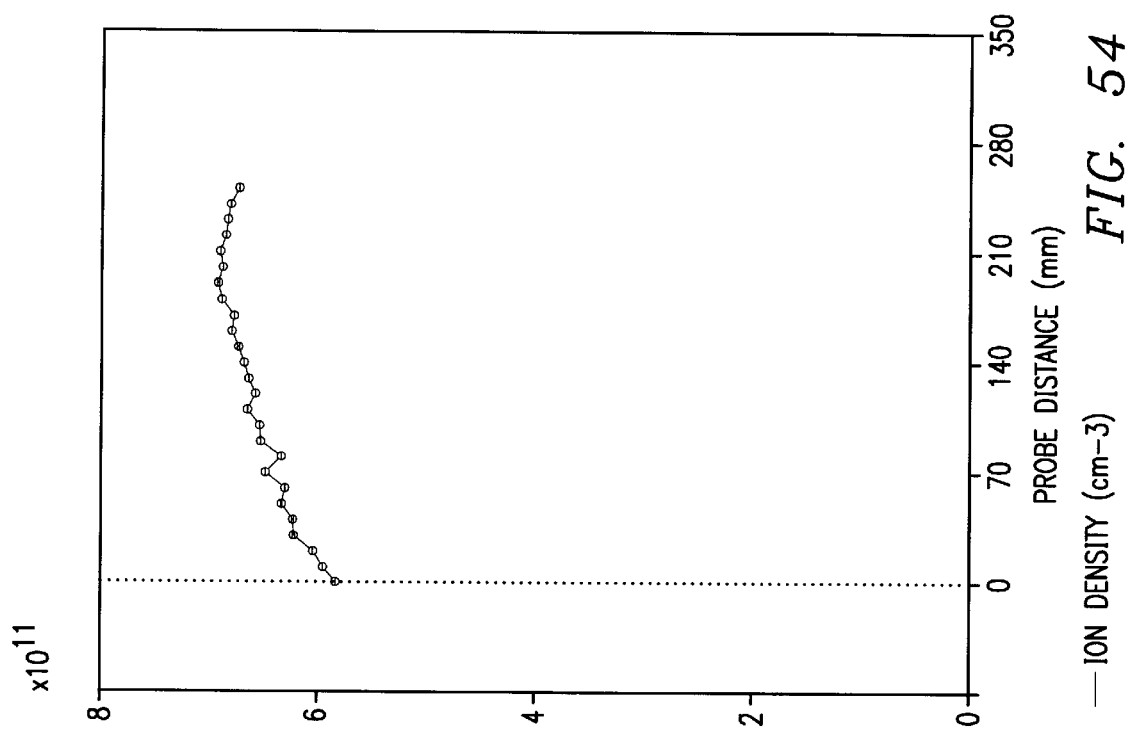
Figure 53:
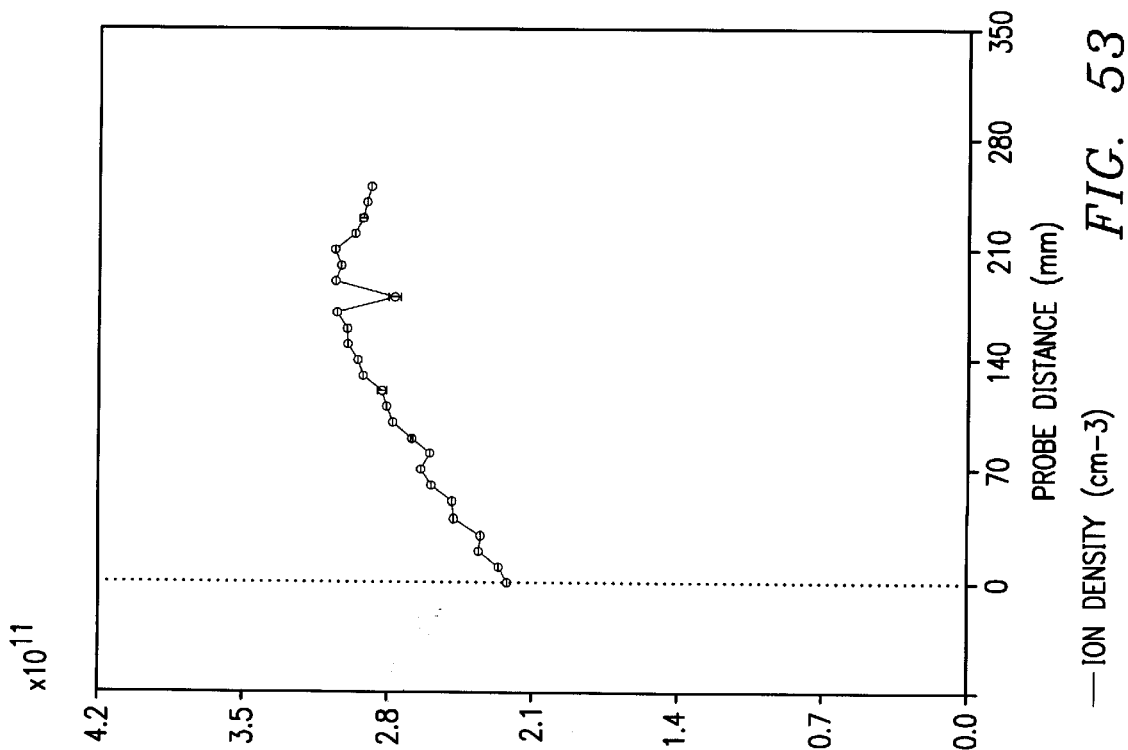
Figures 55, 56:
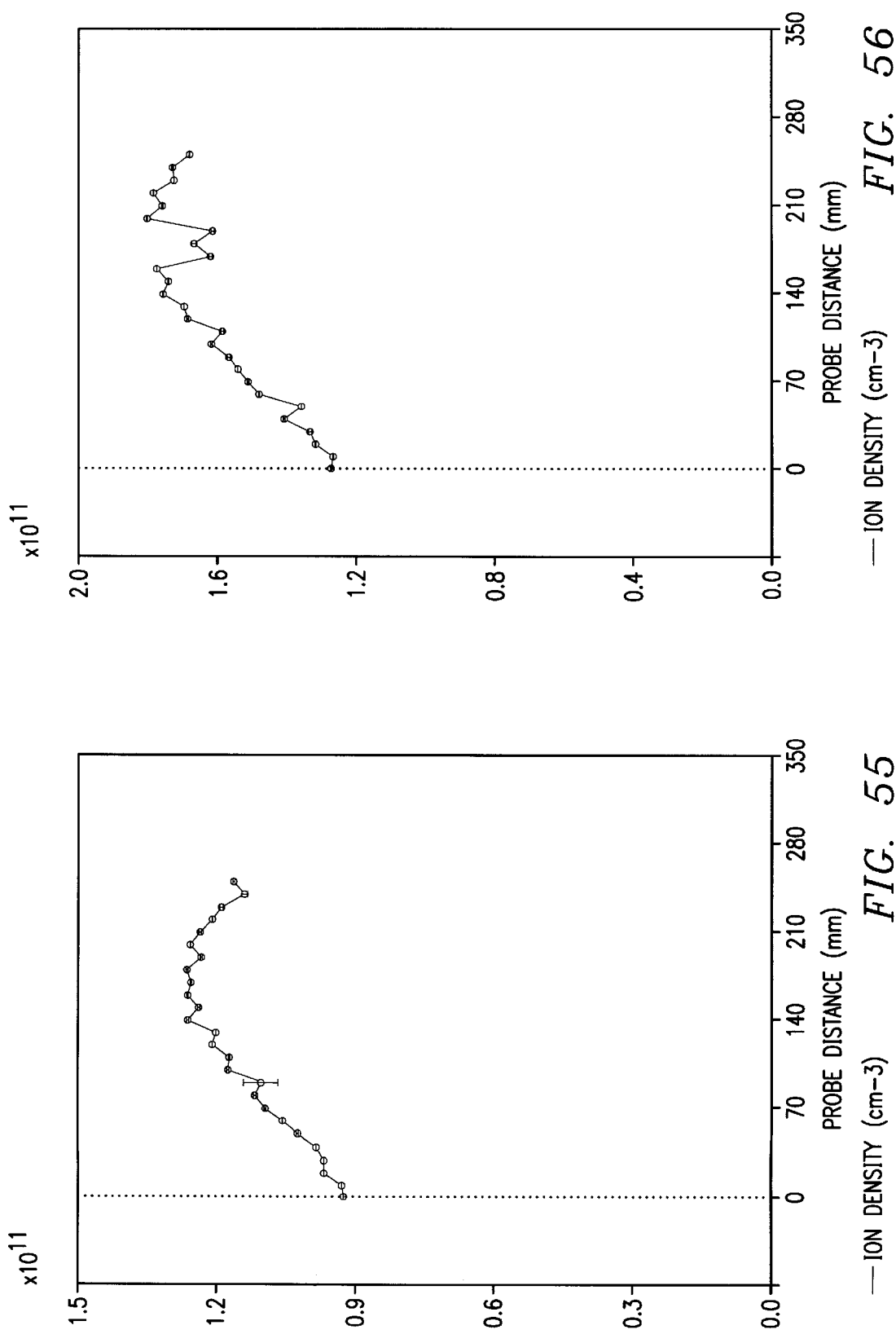
Figure 58:
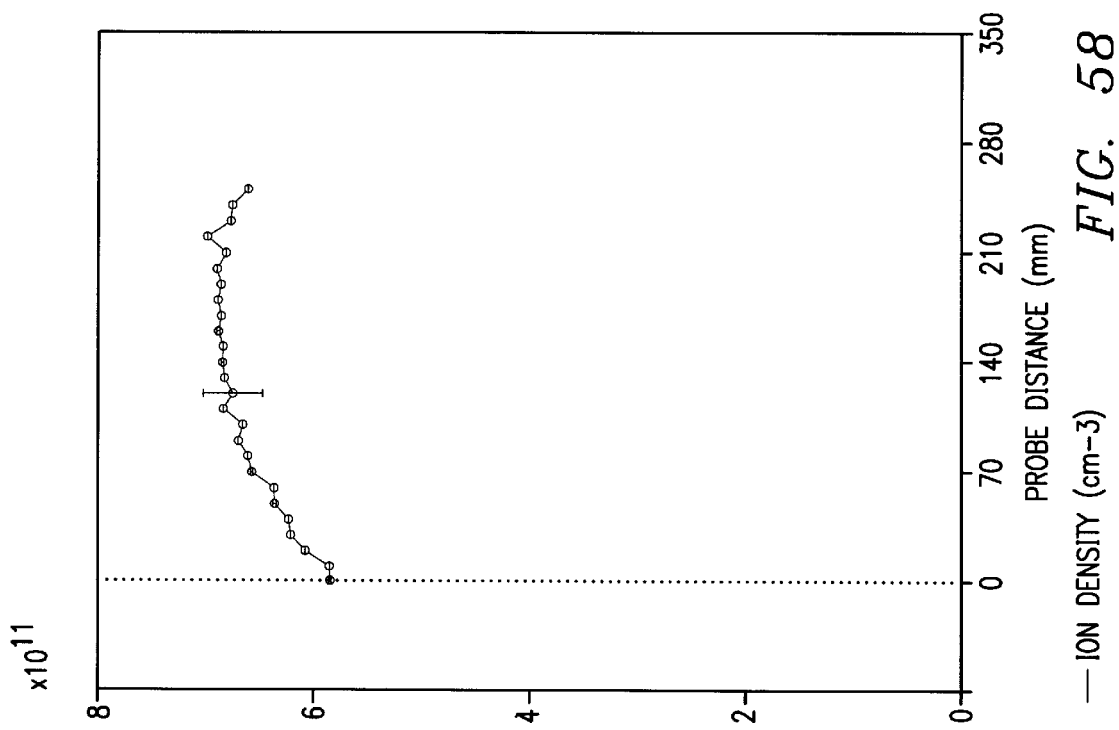
Figure 57:
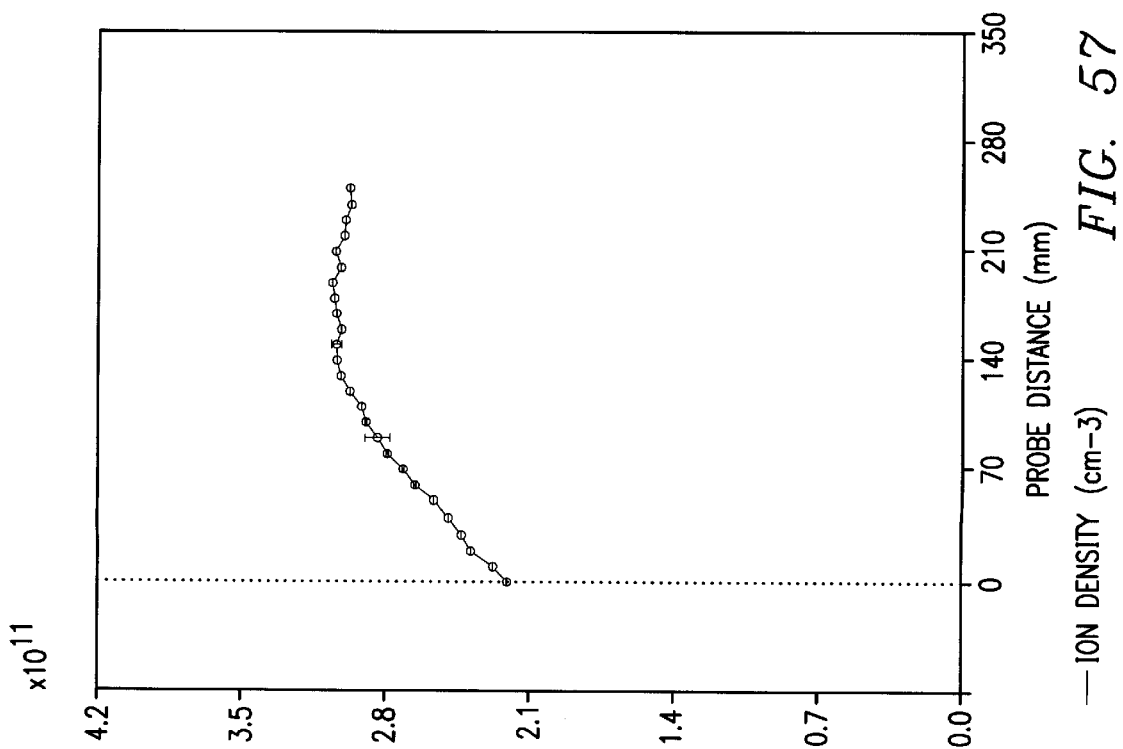
Figure 62:
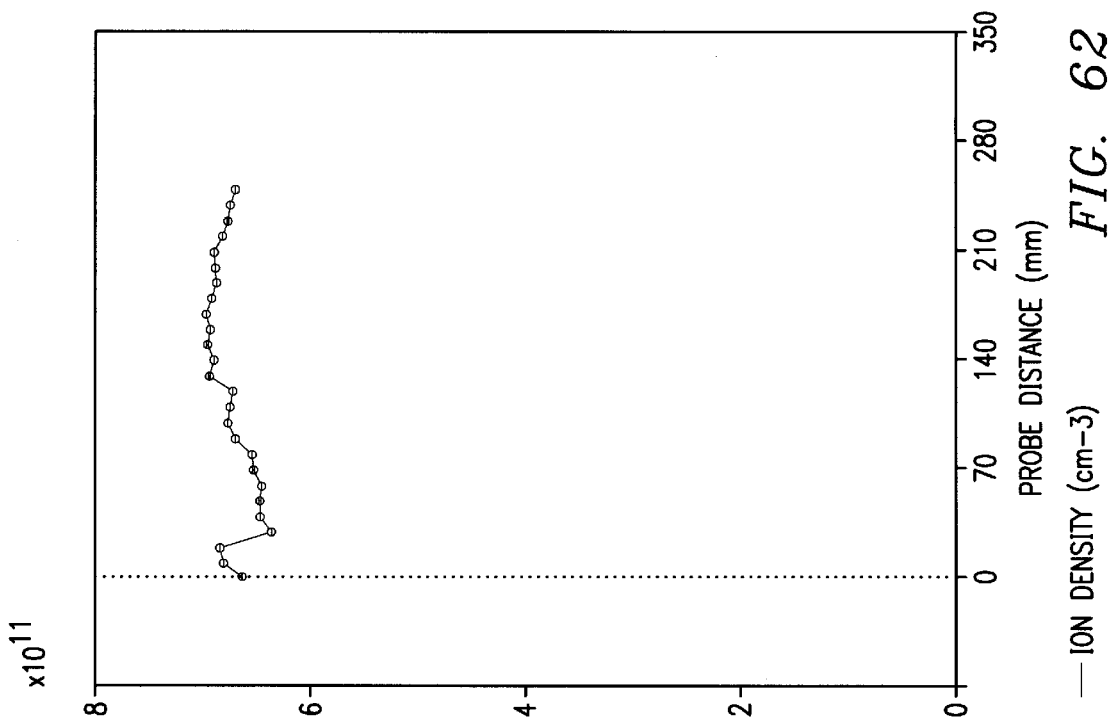
Figure 61:
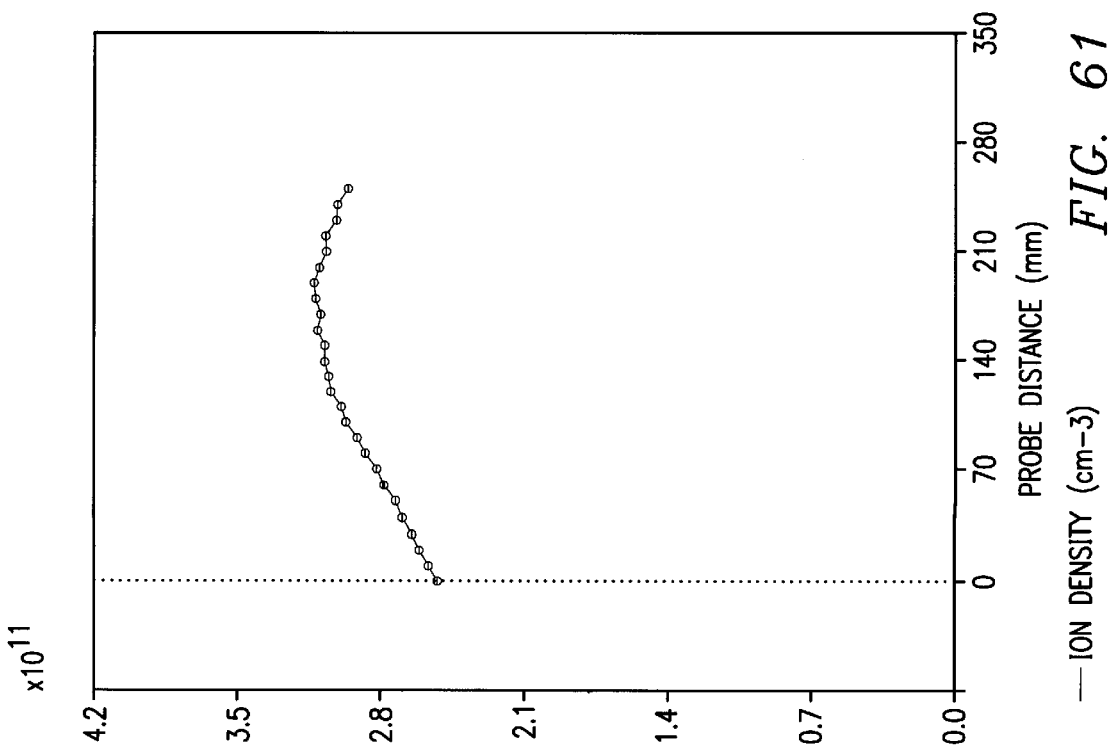
Figure 64:
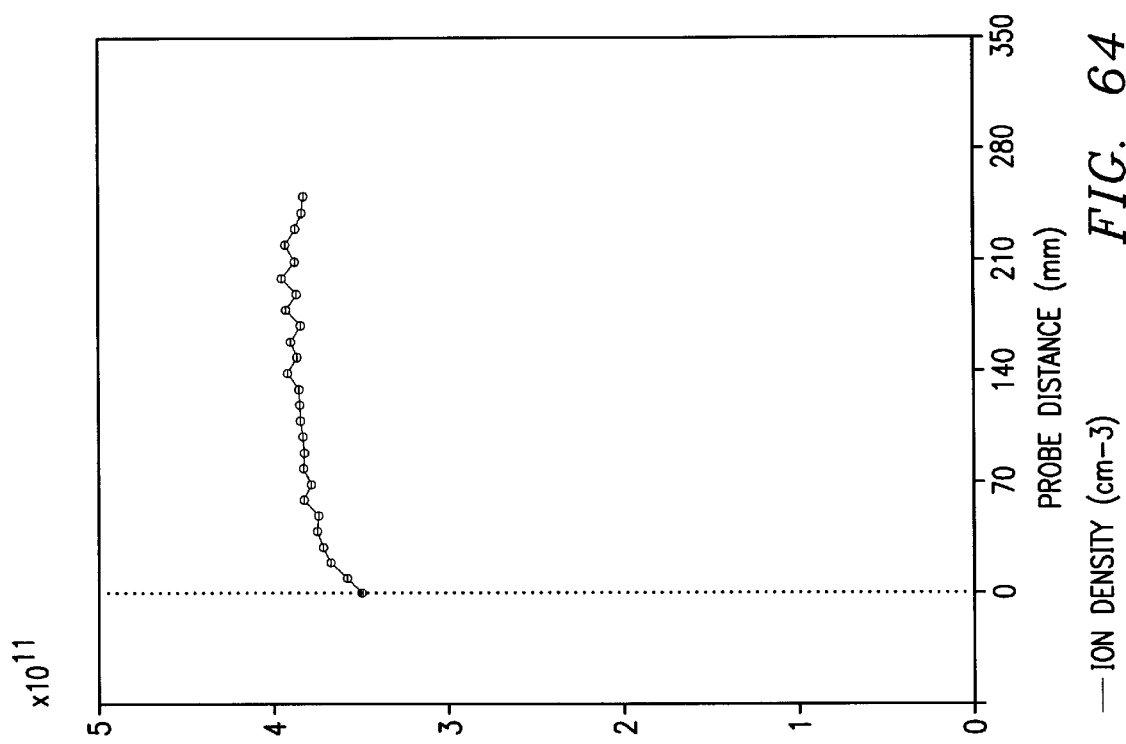
Figure 63:
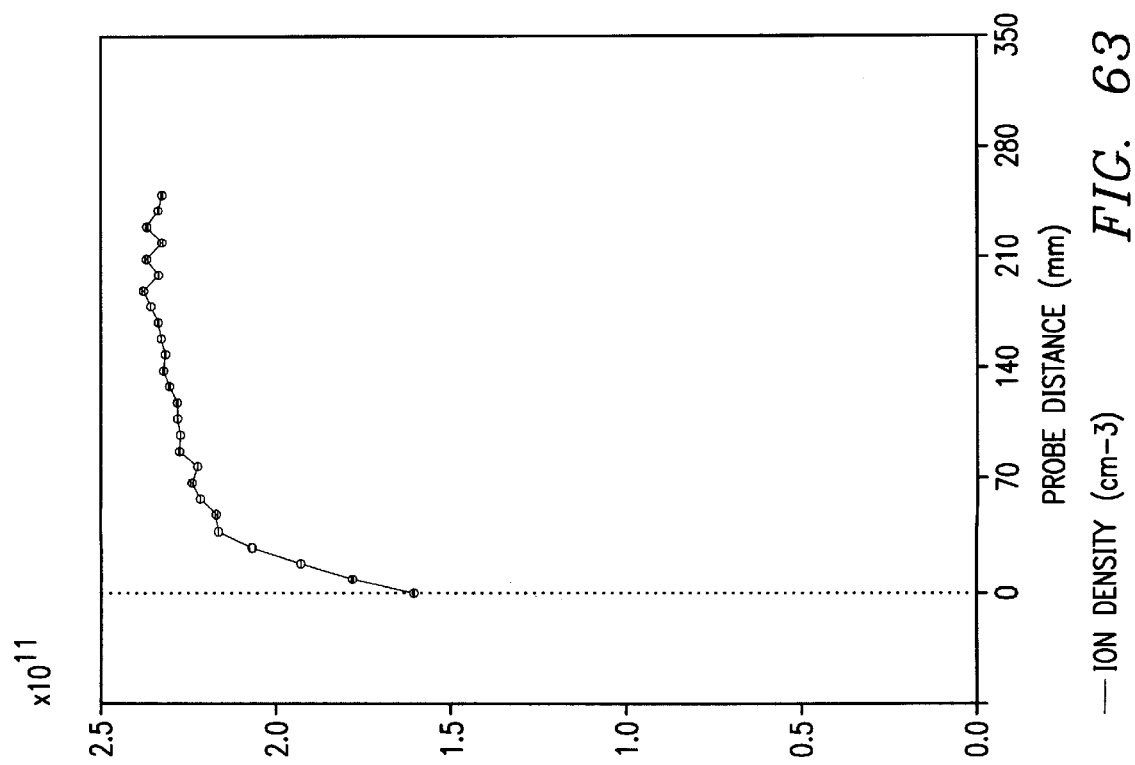
Figure 65:
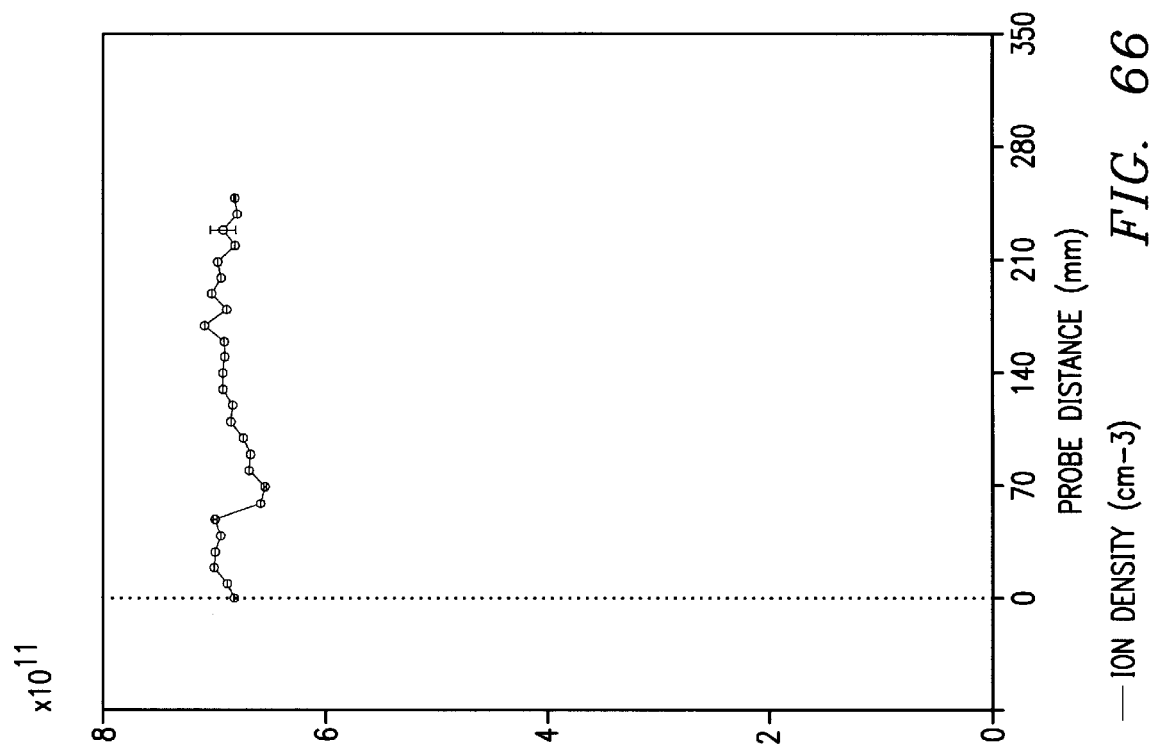
Figure 66:
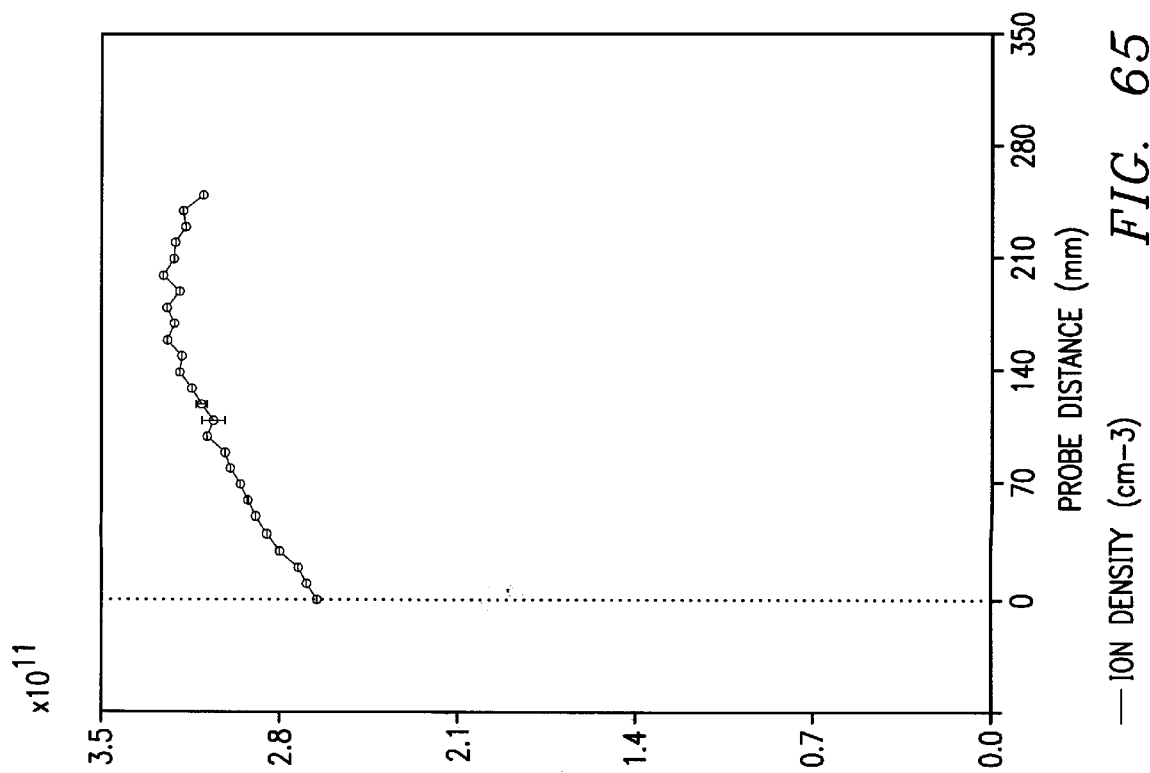
Figure 67:
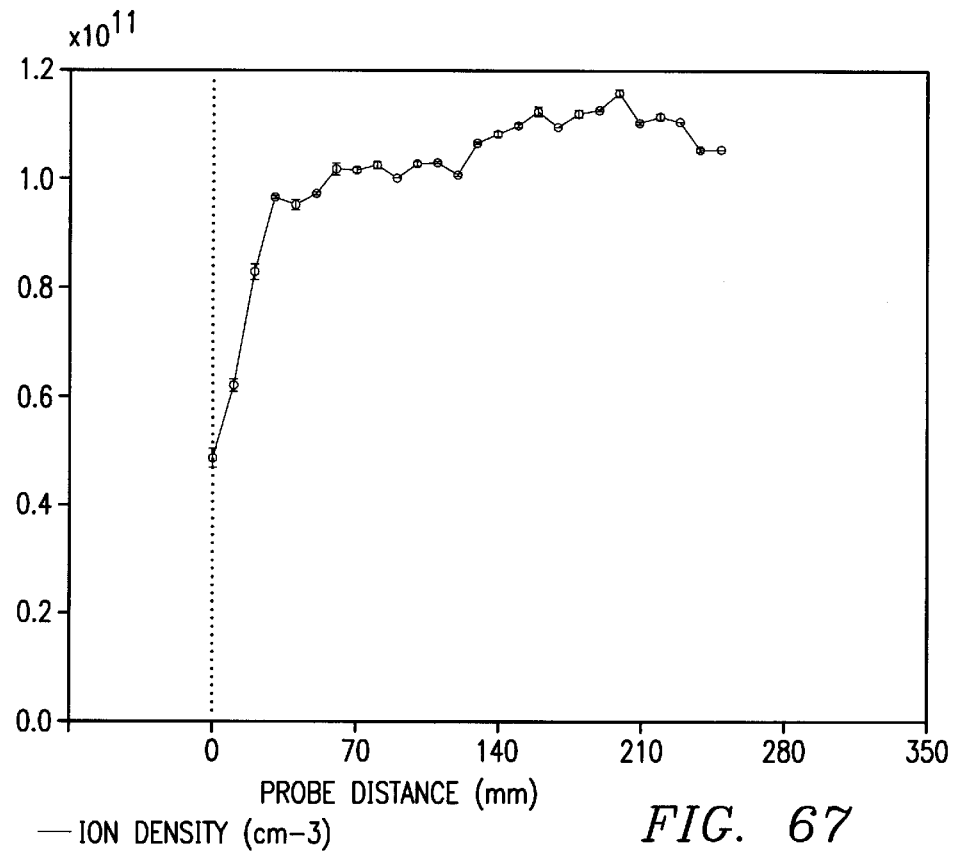
Figure 68:
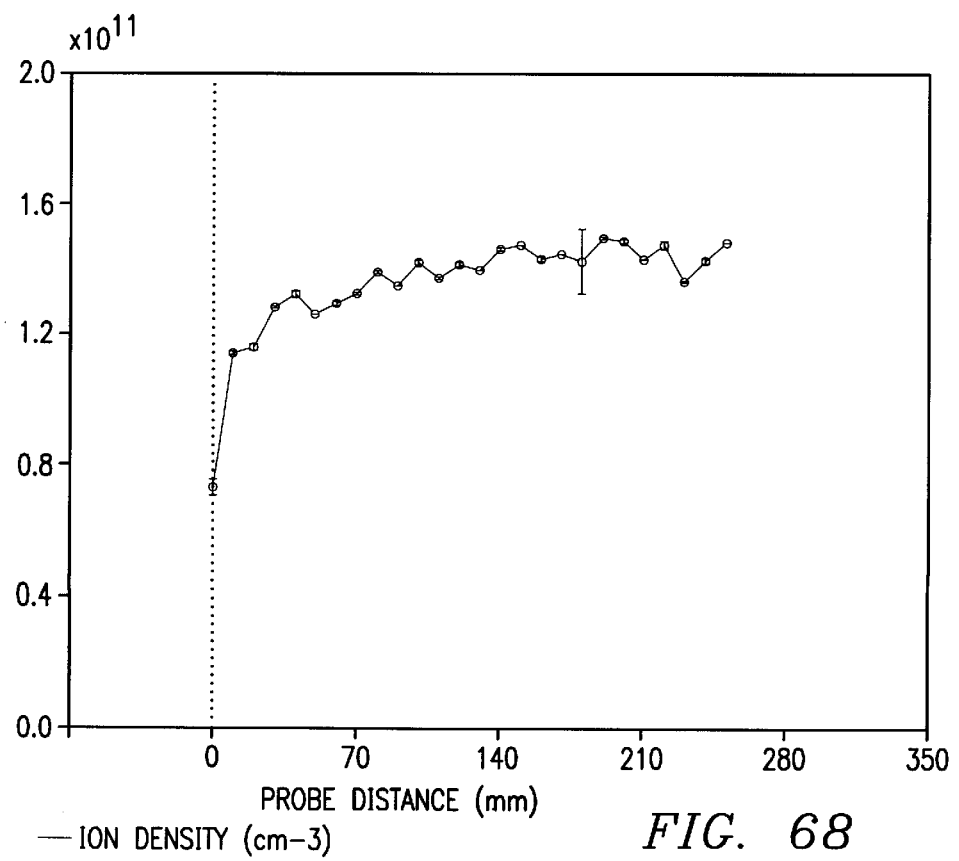
Figure 69:
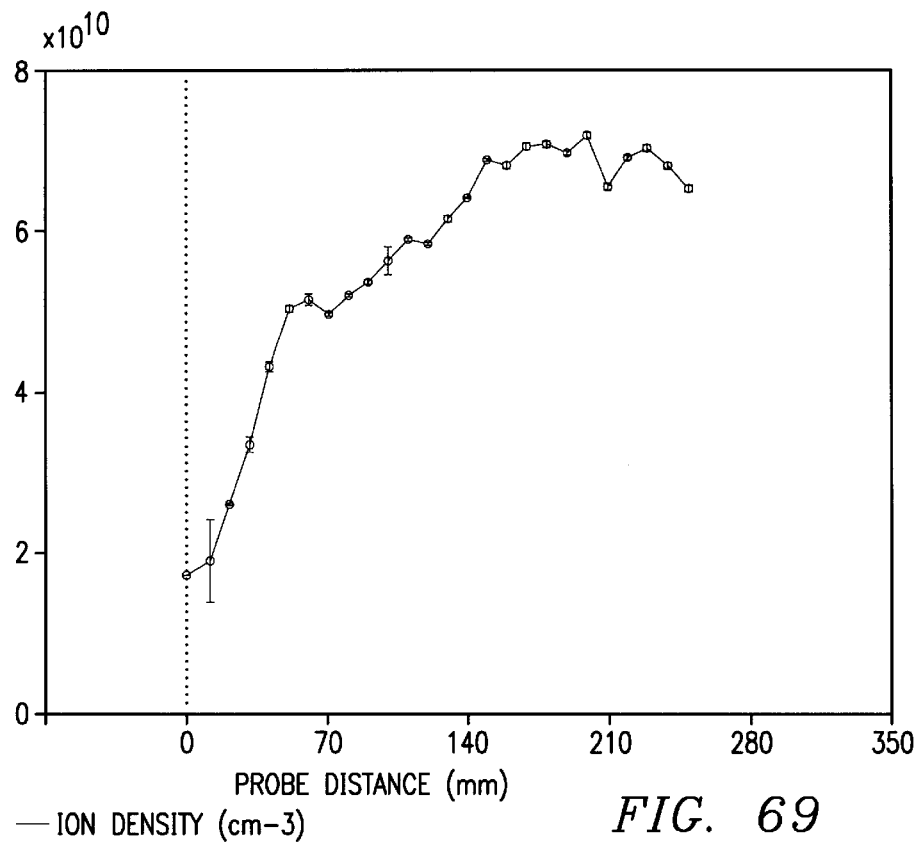

The modeling results (illustrated in FIGS. 6–29) supported by subsequent Langmuir probe measurements show that the configuration illustrated in FIG. 2, corresponding to the conf_w_main4modeled configuration in FIGS. 24 and 25, is one preferred embodiment. This embodiment is comprised of a top band 252 magnetic field which is aligned with the ECR magnetic field, a band spacing around the chuck 212 of 4 inches, anti-aligned band magnetic fields above 254 and below 256 slit valve 248, and a five-band array 250 on the chamber.

Additional modeling using variable or graduated magnetic spacing was done to establish field contour trends with respect to variable magnet spacing. This approach can be used to generate a field profile which exhibits a triangular cross-section rather than the more square cross-section generated by uniformly spaced magnets. Models demonstrating this variable magnet spacing are described further in FIGS. 6–29 with a table of summarized results for these models depicted in FIG. 5.

One of the broad principals disclosed by this invention which allows the optimization of confinement using the Plasma Quest ECR Method is the use of an extraction ring oriented so that field lines connect the "source magnet" on top ring 252. Ring 252 acts to quickly diverge the magnetic field from the resonance zone and to spread the confined ECR resonance zone plasma to a larger diameter. This extraction ring is the first 252 or second 258 ring from the top of FIG. 2. When it is the top ring 252, it is oriented "aligned" to the existing dipole-like field pattern of the "source magnet." For certain designs it may be preferable to position an additional band near the top of the vacuum chamber 202 so as to provide additional confinement above the plane of the extraction magnet.

Figure 3:
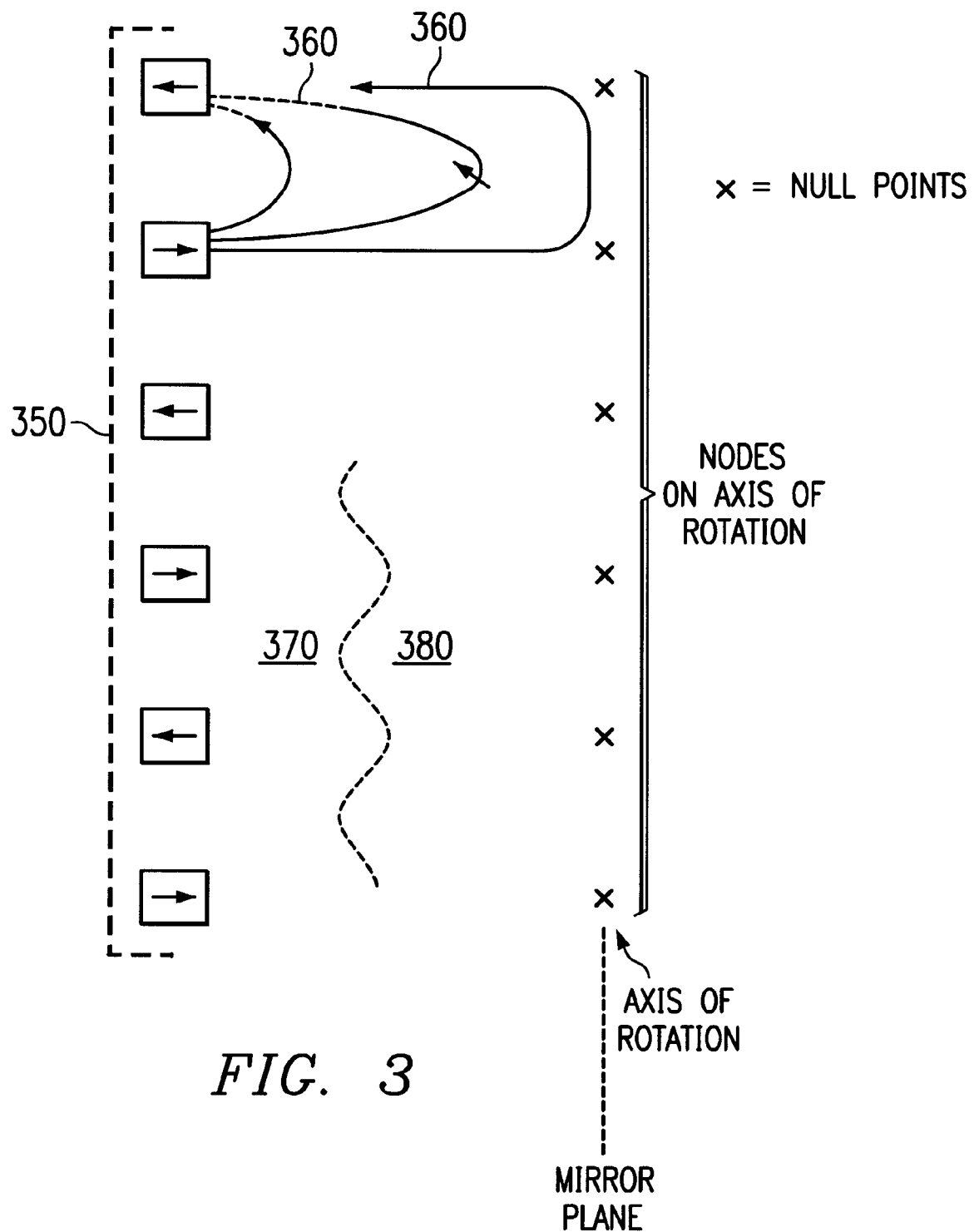
FIG. 3 and FIG. 4 are diagrams illustrating null points in resulting field regions for various magnetic band array polarity arrangements of the present invention.
Figure 4:
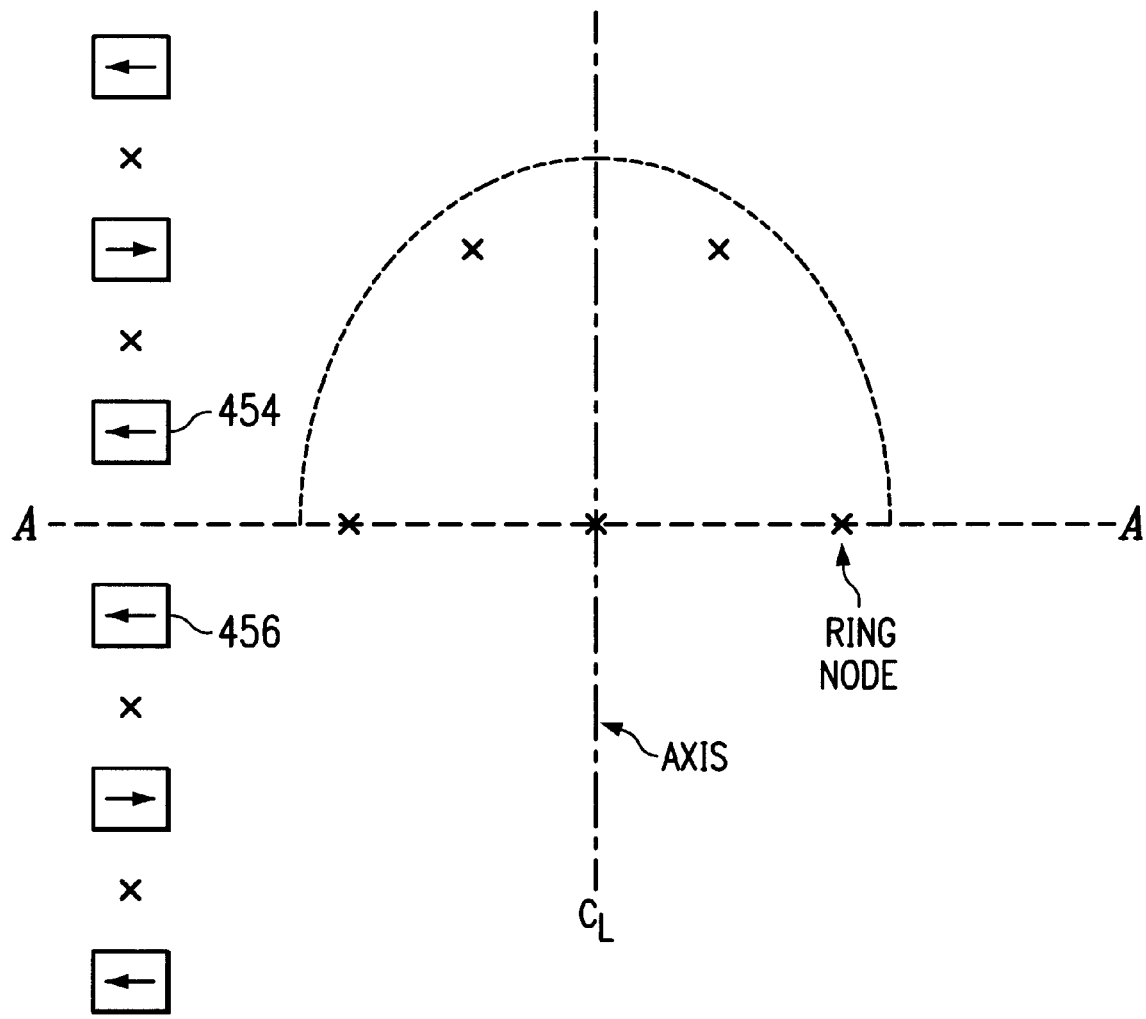

Another broad principal disclosed by this invention is the design of the remainder of the magnet structure to provide a large low field region in the vicinity of chuck 212, while maintaining a high field gradient at the chamber wall. The region of low field can be understood from the structure of nulls (zero) produced by the array 250 of magnetic bands 252–256. FIG. 3 shows the nulls (x "points") and resulting "high field" 370 and "low field" 380 regions for an array of alternating polarity rings 350. Field lines 360 are indicated at the top of the figure. FIG. 4 shows the null points for an array which is symmetric relative to the dashed horizontal line A—A.

The alignment of the rings above 454 and below 456 this plane led from symmetry arguments to a node on the axis, as well as a ring node in this plane. The combination of these two null structures leads to a larger low field region. FIG. 3 illustrates a magnetic field above and below the slit valve in an anti-aligned configuration, while FIG. 4 illustrates an aligned configuration.

It should be particularly noted that the position and alignment of the extraction ring (for example, top band 252) is crucial. Higher ion current is produced by an extraction ring with magnetization aligned to the source magnetic field.

It is also important to note that the alignment of the bands above 254 and 256 the point of chuck 212, as well as their spacing can be used to manipulate the filed and plasma uniformity. In certain cases a transition between a centrally hollow and a centrally peaked plasma profile corresponds to the transition between aligned and anti-aligned configurations of the field at chuck 212. This transition between the centrally hollow and the centrally peaked plasma profile also depends on the spacing of the band.

While the invention has been particularly shown and described with reference to preferred embodiments, it will be understood by those skilled in the art that various changes in form and detail may be made therein without departing from the spirit and scope of the invention.

What is claimed is:

1. A plasma processing apparatus, comprising:
   a vacuum chamber having a longitudinal axis;
   a workpiece stage within said chamber;
   a permanent magnet electron cyclotron resonance plasma source directed at said chamber comprising:
      a source magnet having a pole aligned along said longitudinal axis; and
      a pole piece comprising sidewalls extending around said source magnet; and
   a system of permanent magnets for plasma confinement positioned around said longitudinal axis of said chamber.

2. The apparatus of claim 1, wherein the permanent magnets for plasma confinement are arranged in a multiplicity of rings with the plane of the rings perpendicular to the direction of propagation of the microwave into the vacuum chamber.

3. The apparatus of claim 2, wherein the number and position of the rings is chosen with respect to the vacuum chamber and ECR source and position permanent magnet to produce a low magnetic field region in the portion of the vacuum chamber adjacent to the workpiece.

4. The apparatus of claim 2, wherein consecutive ones of said multiplicity of ring magnets have opposite polarity such that magnetic multipoles are formed in a vicinity of the chamber walls.

5. The apparatus of claim 3, wherein a top ring is arranged with a magnetization aligned with a radial component of the field produced electron cyclotron resonance source magnet at that point.

6. The apparatus of claim 2, wherein the magnetic rings immediately adjacent to the plane of the workpiece stage are arranged with opposing magnitudes of radial magnetization, so as to produce a region of low field in the center of the vacuum chamber.

7. The apparatus of claim 2, wherein the permanent magnet rings immediately adjacent to the plane of the workpiece stage are arranged with similar magnitudes of radial magnetization, both so as to produce an annular region of low field in conjunction with a region of low field on the vacuum chamber axis.

8. The apparatus of claim 2, wherein the vacuum chamber has a square or polygonal crosssection as opposed to a circular cross-section.

9. The apparatus of claim 2, wherein the top ring is arranged with the magnetization opposite that of the radial component of the field produced electron cyclotron resonance source magnet at that point.

10. The apparatus of claim 2, wherein the magnetization and positions of the rings may be adjusted to modify the plasma extraction and uniformity.

11. A plasma processing apparatus, comprising:

a vacuum chamber having a longitudinal axis;

a workpiece stage within the chamber;

a permanent magnet electron cyclotron resonance plasma source directed at the workpiece, the plasma source comprising:

a source magnet having a pole aligned along the longitudinal axis; and a pole piece comprising sidewalls extending around the source magnet; and at least one extraction ring permanent magnet positioned around the circumference of the vacuum chamber;

wherein at least a first one of the at least one extraction ring magnet acts to diverge the magnetic field from a resonance zone and spread the plasma to a larger diameter than that of the resonance zone.

12. The plasma processing apparatus of claim 11, wherein the at least one extraction ring magnet provides a large low field region in the vicinity of the workpiece while maintaining a high field gradient at the vacuum chamber wall.

13. The plasma processing apparatus of claim 11, wherein the at least one extraction ring magnet is an array of magnets.

14. The plasma processing apparatus of claim 11, wherein a second one of the at least one extraction ring magnet is oriented such that the magnetic field of the second one of the at least one extraction ring magnet is aligned with an existing dipole-like field pattern generated by the permanent magnet electron cyclotron resonance plasma source and the first ring is anti-parallel.

15. The plasma processing apparatus of claim 11, wherein a second one of the at least one extraction ring magnet is oriented such that the magnetic field of the second one of the at least one extraction ring magnet is anti-aligned with an existing dipole-like field pattern generated by the permanent magnet electron cyclotron resonance plasma source and the first ring is parallel.

* * * * *

UNITED STATES PATENT AND TRADEMARK OFFICE
CERTIFICATE OF CORRECTION

PATENT NO. : 6,396,024 B1
DATED : May 28, 2002
INVENTOR(S) : Doughty et al.

It is certified that error appears in the above-identified patent and that said Letters Patent is hereby corrected as shown below:

<u>Column 1,</u>
Line 18, before "BACKGROUND OF THE INVENTION" please insert the heading -- GOVERNMENT SUPPORT. -- After "GOVERNMENT SUPPORT", please insert the following paragraph -- This invention was made with Government support under Contract DE-FG03-97ER82459 awarded by the Department of Energy. The Government has certain rights in this invention. --

Signed and Sealed this

Twenty-sixth Day of October, 2004

JON W. DUDAS
*Director of the United States Patent and Trademark Office*